(12) United States Patent
Naviasky et al.

(10) Patent No.: US 9,148,130 B1
(45) Date of Patent: Sep. 29, 2015

(54) SYSTEM AND METHOD FOR BOOSTING A SELECTIVE PORTION OF A DRIVE SIGNAL FOR CHIP-TO-CHIP TRANSMISSION

(75) Inventors: Eric Naviasky, Ellicott City, MD (US); Ali Ulas Ilhan, Elkridge, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 787 days.

(21) Appl. No.: 13/468,415

(22) Filed: May 10, 2012

(51) Int. Cl.
*H03K 3/00* (2006.01)
*H03K 3/015* (2006.01)
(52) U.S. Cl.
CPC .................... *H03K 3/015* (2013.01)
(58) Field of Classification Search
CPC .......... H03K 3/00; H03K 3/01; H03K 3/015; H03K 3/36
USPC ................ 327/108, 109; 326/82, 83, 86, 87
See application file for complete search history.

(56) References Cited

U.S. PATENT DOCUMENTS

| 6,940,302 B1* | 9/2005 | Shumarayev et al. | 326/26 |
| 8,115,520 B2* | 2/2012 | Matsumoto et al. | 327/108 |
| 2009/0033365 A1* | 2/2009 | Miura | 326/82 |
| 2010/0109788 A1* | 5/2010 | Matsumoto et al. | 332/144 |
| 2013/0033290 A1* | 2/2013 | King | 327/108 |

* cited by examiner

*Primary Examiner* — William Hernandez
(74) *Attorney, Agent, or Firm* — Rosenberg, Klein & Lee

(57) ABSTRACT

A system and method are provided for boosting a selective portion of a drive signal for chip-to-chip transmission across an interconnection interface. The system includes a driver unit generating a drive signal responsive to an input data signal. The drive signal is provided on to at least one output node for transmission through the device interconnection interface, and defines a peak amplitude during a drive period. A boosting unit is coupled to the driver unit for selectively boosting a portion of the drive signal. The boosting unit actuates responsive to the input data signal to selectively apply a boost signal in self-timed manner to the drive signal, so as to thereby augment the drive signal in amplitude over a selected portion of the drive period thereof. In this manner, the boosting unit maintains the peak amplitude of the drive signal at or above a predetermined level throughout the drive period.

29 Claims, 53 Drawing Sheets

Cont on FIG.8B

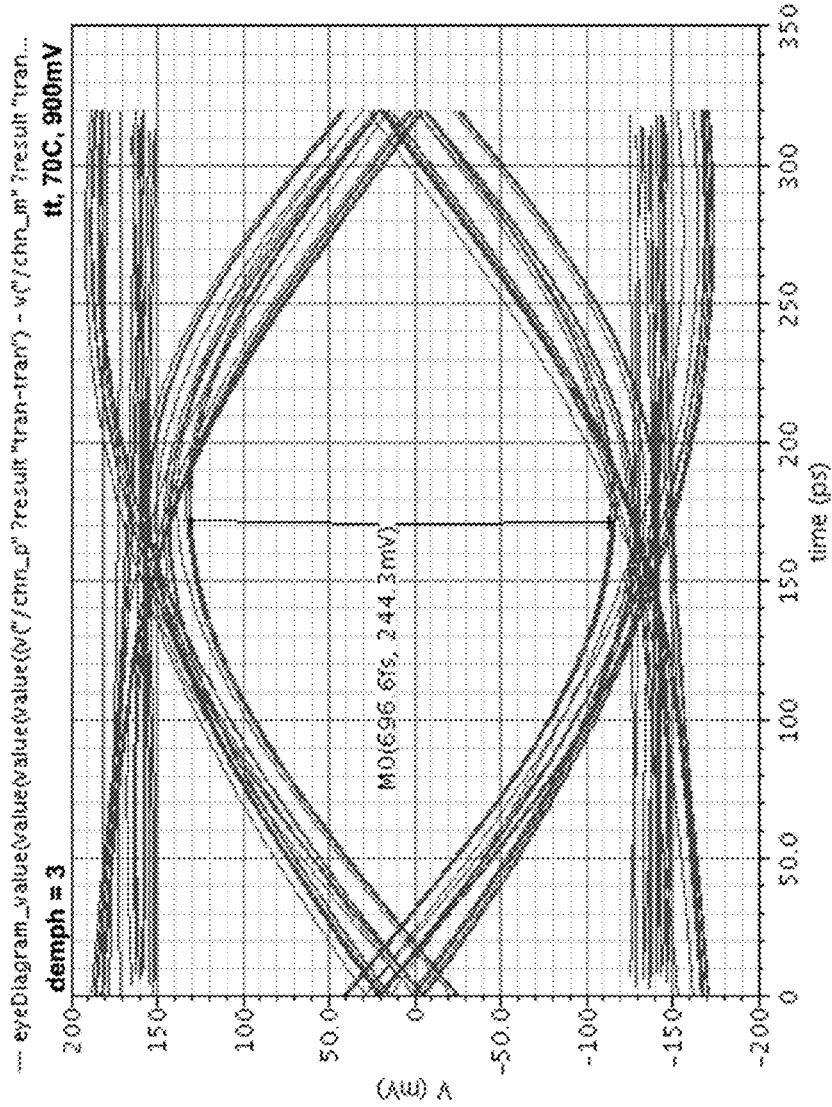

tt, 70C, 900mV

| res | depph=2 | | | depph=3 | | |
|---|---|---|---|---|---|---|
| | b01 | b10 | b11 | b01 | b10 | b11 |
| 0Ω | 296.7mV | 338mV | 350.3mV | 284.3mV | 295.9mV | 303.9mV |
| 50Ω | 281.1mV | 324.8mV | 341mV | 282.5mV | 291.1mV | 301.5mV |
| 100Ω | 271.8mV | 304.6mV | 332.5mV | 275.3mV | 287.9mV | 300.4mV |
| 150Ω | 265.3mV | 291.9mV | 321.4mV | 271mV | 284.6mV | 293.9mV |
| 200Ω | 259.9mV | 282.8mV | 305.3mV | 266.2mV | 280.7mV | 293.7mV |

FIG. 23

SYSTEM AND METHOD FOR BOOSTING A SELECTIVE PORTION OF A DRIVE SIGNAL FOR CHIP-TO-CHIP TRANSMISSION

BACKGROUND OF THE INVENTION

The subject system and method are generally directed to enhancing a data signal that is generated within an integrated circuit chip for chip-to-chip transmission between source and destination (or driver and receiver) circuits without incurring excessive loss or degradation. More specifically, the subject system and method are directed to boosting a selective portion of a drive signal accordingly generated at a driver for the data signal, so that it may be transmitted through various intervening structures/media and on to the receiver with its integrity substantially preserved.

With ongoing advances in integrated circuit (IC) fabrication technology, and the ongoing development of high speed computer, network, and other telecommunication systems, electronic designs operating at higher frequencies are becoming more prevalent. Collective/effective data rates on the order of 10 gigabits (Gbits), for instance, are not uncommon. In these types of applications, the attenuation due to physical interconnections, impedance mismatches, skin effect, and the like at the chip, package, board, connector, cable, and/or test channel/backplane levels are not negligible. At high operational frequencies, an interconnection for example may be greater in its physical length than a transmitted signal's effective electrical length. Also, there tends to be heightened sensitivity to transients and other factors which might otherwise be negligible.

For reliable transmission of a drive signal generated on chip at one side of an interconnection interface to a receiver chip at the other side of the interconnection interface, the drive signal must have ample margin to withstand the various intervening sources of attenuation. Complicating the matter is the fact that certain spectral components of a signal may encounter greater attenuation than other spectral components. In certain applications, for example, higher frequency components of a drive signal may be attenuated more than the lower frequency components.

Of course, one might simply raise the supply voltage for a given application to high enough level to try and ensure sufficient peak voltage margin in the drive signal. This is the very approach oft taken in the art, but the resultant increase in current consumption and power is a prohibitive factor in many applications. Unduly heightened supply voltages tend to also strain other requirements, particularly as applications increasingly employ shorter channel length technologies.

Simply raising the supply voltages also fails to adequately address problems such as inter symbol interference (ISI), a type of data dependent jitter (noise) caused by unequal attenuation effects on different frequency contents of data. Ideally, signal integrity would be preserved at the far end of a given transmission. ISI during transmission distorts that far end signal, largely nullifying what near end benefits might result from this approach of simply raising supply voltage levels.

Other approaches generally known in the art for preserving drive signal integrity include emphasis, whereby equalization-type techniques are applied to improve the overall signal to interference ratio of the drive signal. For example, de-emphasis measures are employed to decrease the magnitudes of certain lower frequencies toward that end; however, this residual attenuation of lower frequency constituents limits the usefulness of this approach for reliably preserving the eye opening of a drive signal.

There is therefore a need for a system or method whereby a drive signal may be suitably presented at near and far ends of transmission across an interconnection interface without loss of integrity, while overcoming these and other drawbacks. There is a need for such system or method which maintains the eye opening of a drive signal sufficiently at both the near and far ends of an attachment unit interface.

SUMMARY OF THE INVENTION

It is an object of the present invention to provide a system and method for boosting a selective portion of a drive signal for reliable transmission across an interconnection interface.

It is another object of the present invention to provide a system and method for selectively controlling a boost profile of a drive signal for reliable transmission across an interconnection interface.

These and other objects are attained in a system and method for boosting a selective portion of a drive signal for chip-to-chip transmission across an interconnection interface. The system comprises a driver unit generating a drive signal responsive to an input data signal. The drive signal is provided on to at least one output node for transmission through the device interconnection interface, and defines a peak amplitude during a drive period. The system further comprises a boosting unit coupled to the driver unit for selectively boosting a portion of the drive signal. The boosting unit actuates responsive to the input data signal to selectively apply a boost signal in self-timed manner to the drive signal, so as to thereby augment the drive signal in amplitude over a selected portion of the drive period thereof. In this manner, the boosting unit maintains the peak amplitude of the drive signal at or above a predetermined level throughout the drive period.

A method realized in accordance with the present invention comprises generating a drive signal responsive to an input data signal, where the drive signal defines a peak amplitude during a drive period. The drive signal is applied to at least one output node for transmission through a device interconnection interface. The method further comprises establishing a boosting unit coupled to the output node, and generating a boost signal responsive to the input data signal to selectively boost a portion of the drive signal. The boost signal is applied in self-timed manner to the drive signal, so as to thereby augment the drive signal in amplitude over a selected portion of the drive period thereof. The boosting unit is actuated to maintain the peak amplitude of the drive signal at or above a predetermined level throughout the drive period.

BRIEF DESCRIPTION OF THE DRAWINGS

FIG. 18B is the schematic diagram illustrating an eye diagram obtained by simulation of the simulation test bench implementation of FIG. 17, for the drive signal transmitted without boost and with virtually no boosting unit ESD protection resistance across an interconnection interface, taken at a far end measurement point subject to a second predetermined level of de-emphasis;

FIG. 23 is an illustrative diagram showing a table of parametric values obtained from the simulation runs including those represented in FIGS. 18A-22C using the simulation test bench implementation of FIG. 17, for selective optimization of boost drive system settings;

DESCRIPTION OF THE PREFERRED EMBODIMENTS

Figure 1:
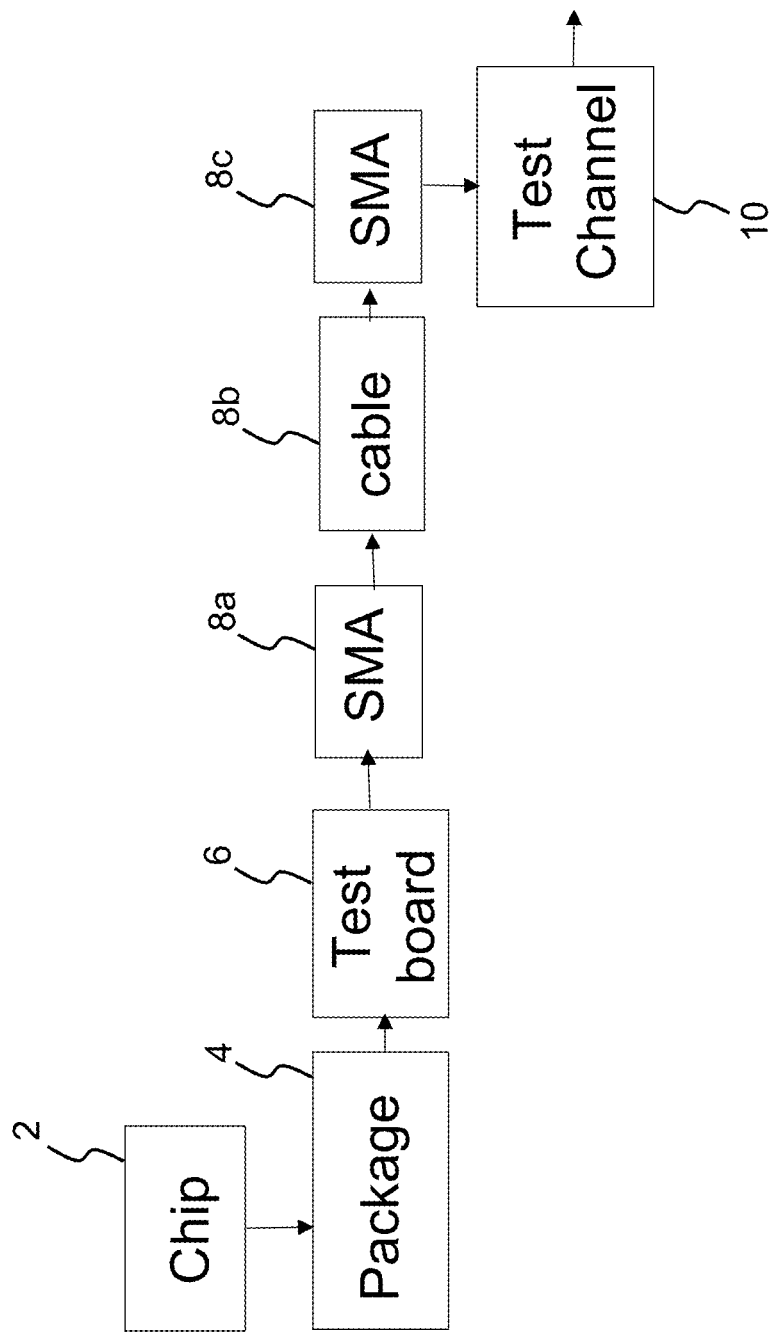
FIG. 1 is a schematic diagram illustrating discrete physical structures interposed in the path of a drive signal transmitted from a driver chip to a receiver across an interconnection interface.

During transmission between driver and receiver circuits across a given interconnection interface, drive signals are typically affected in timing and integrity by such factors as intrinsic propagation delay, insertion loss, skin effect, reflection, crosstalk, and the like. A notable effect observed in high speed applications is the excessive attenuation of high frequency signal components when a drive signal generated by a driver implemented on a source chip in one equipment unit is transmitted through interconnection media to a receiver implemented on a destination chip in another equipment unit. This is partially illustrated in FIG. 1, where a drive signal is transmitted from a chip 2, through the chip's package 4, out of a host circuit board 6, then through interconnection cabling 8a-8c, and on through a test channel or backplane 10, before it is passed further to the source chip (not shown). In the illustrated example, a cable 8b of RF coaxial type is employed, and its interconnections to the given equipment units are made through suitable SMA (SubMicron version A) driver side and receiver side connectors 8a and 8c.

As the drive signal propagates through the various intervening structures/media constituting this interconnection interface between driver and receiver chips, it encounters impedance mismatch reflections and other effects which serve to reduce the amplitude of its higher frequency content. This is evident in the so-called eye diagrams illustratively shown in FIGS. 2A, 2B for certain operating conditions for the test setup of FIG. 1. Each eye diagram is formed by a repetitively sampled set of captured timing curves for the drive signal at a certain point in the test set up. In this example, the drive signal is of differential signal type, and the 'eye opening' is defined by the voltage separation between the signal's complementary signal components.

Figure 2A:
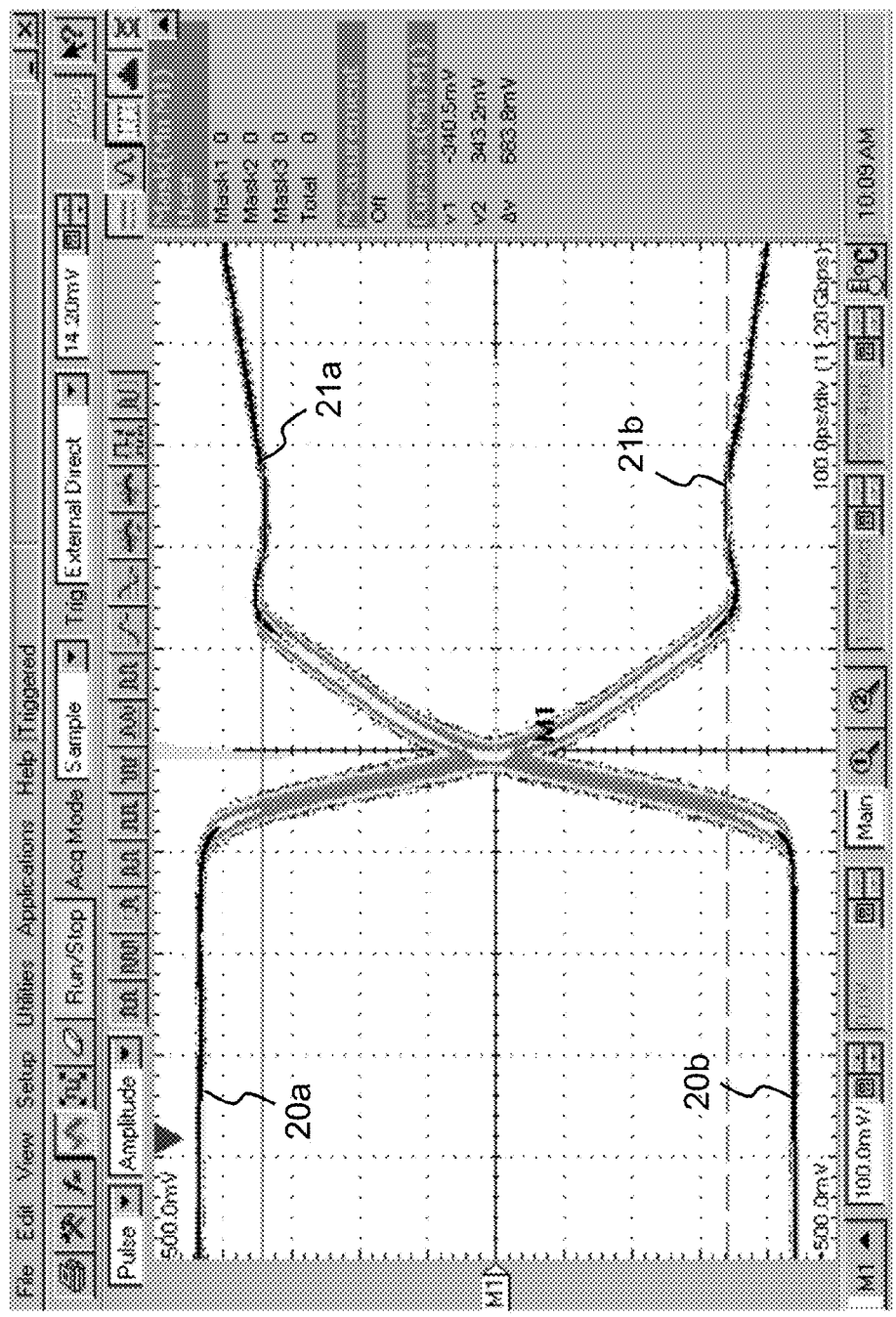
FIG. 2A is an illustrative representation of a graphic display generated for reference purposes, showing by example an eye diagram obtained by oscilloscope measurement of an unboosted drive signal transmitted across an interconnection interface, taken at a near end measurement point.
Figure 2B:
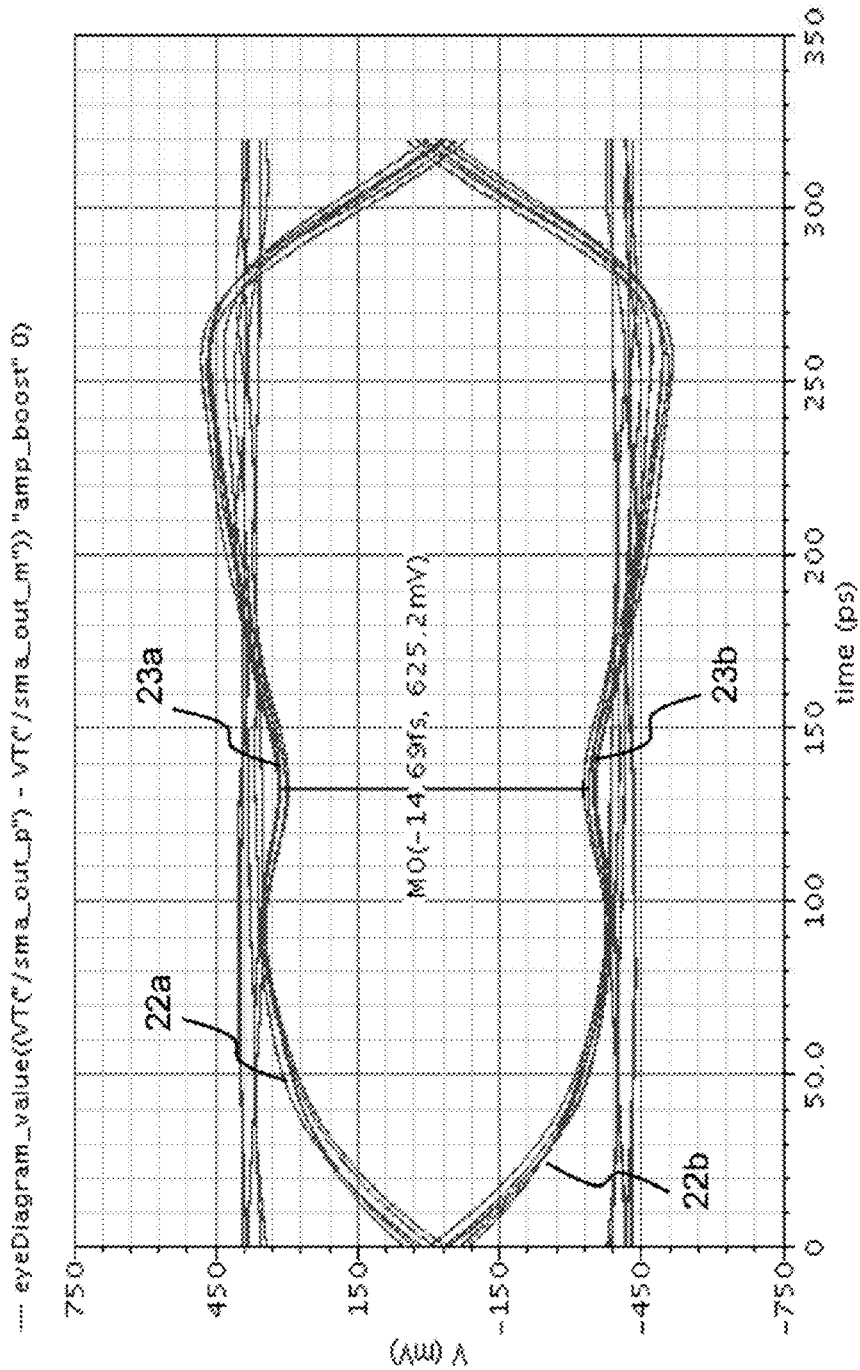
FIG. 2B is the schematic diagram illustrating an eye diagram obtained by simulation for an unboosted drive signal transmitted across an interconnection interface, taken at a near end measurement point.

FIG. 2A illustrates an eye diagram of actual test measurements captured by oscilloscope at a near end measuring point MP1 indicated in FIG. 1. FIG. 2B illustrates an eye diagram of timing sweeps captured by simulation at that same effective measuring point MP1. As shown, the 'eye' closes somewhat, as the positive and negative signal components 20a, 20b and 22a, 22b in both cases dip in amplitude upon transitioning to an active state. The peak-to-peak voltage defined between the reduced amplitude regions 21a, 21b and 23a, 23b are shown in each case to dip below that of the other surrounding regions of the signal components. In the case of FIG. 2A, the peak-to-peak voltage between the regions 21a, 21b is measured to be as low as 683.8 mV, well below the approximate 800 mV approached and exceeded by the surrounding regions during the period when the drive signal is active. Likewise, the peak-to-peak voltage between the regions 23a, 23b in the case of FIG. 2B is simulated to be as low as 625.2 mV, well below the approximate 800 mV or more at the surrounding regions of the drive signal during the period that it is active.

Figures 1, 6A:
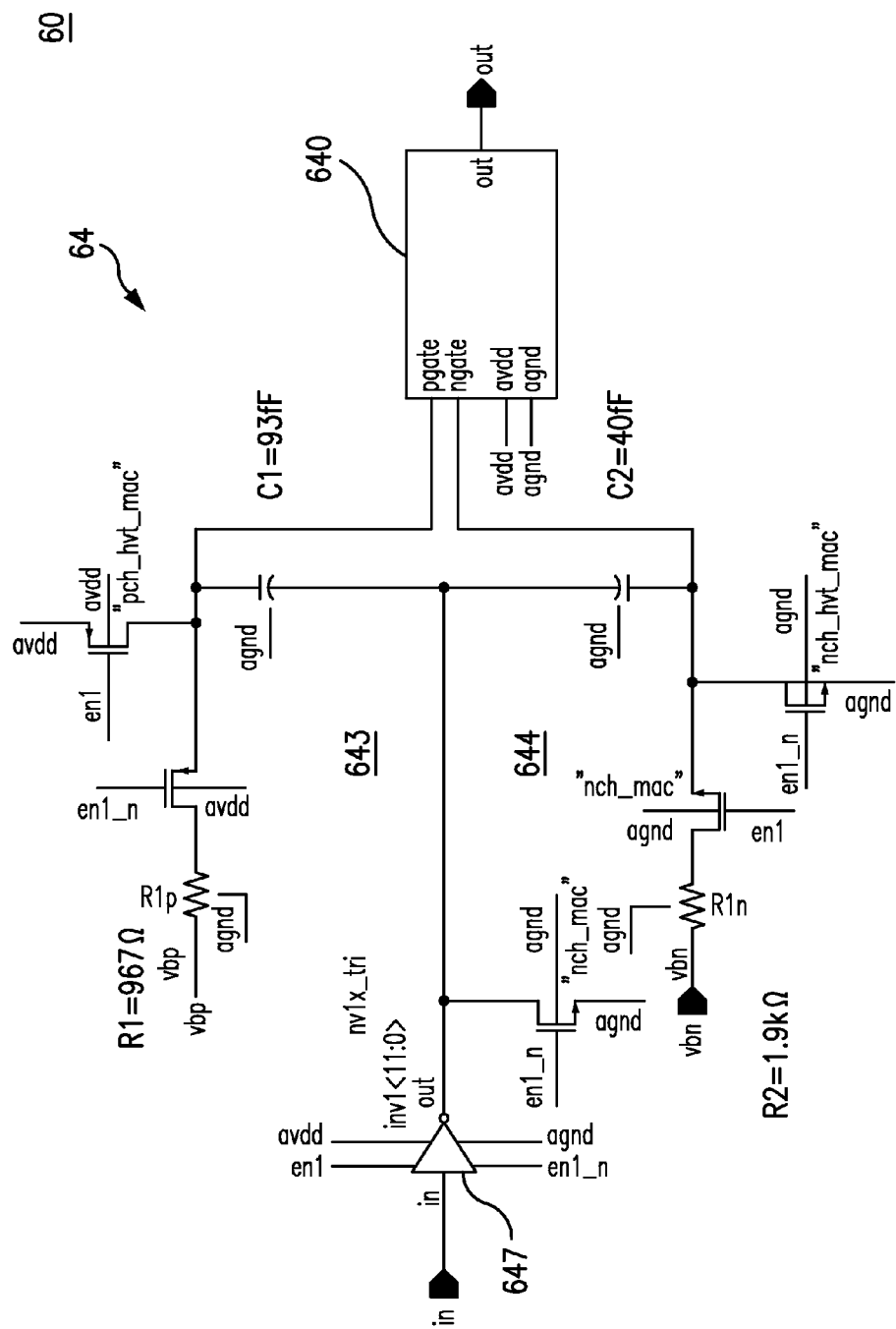
FIG. 6A, collectively represented by views 6A-1, 6A-2, 6A-3, is a schematic diagram showing an exemplary implementation of certain portions of the embodiment shown in FIG. 3.
Figures 2, 6A:
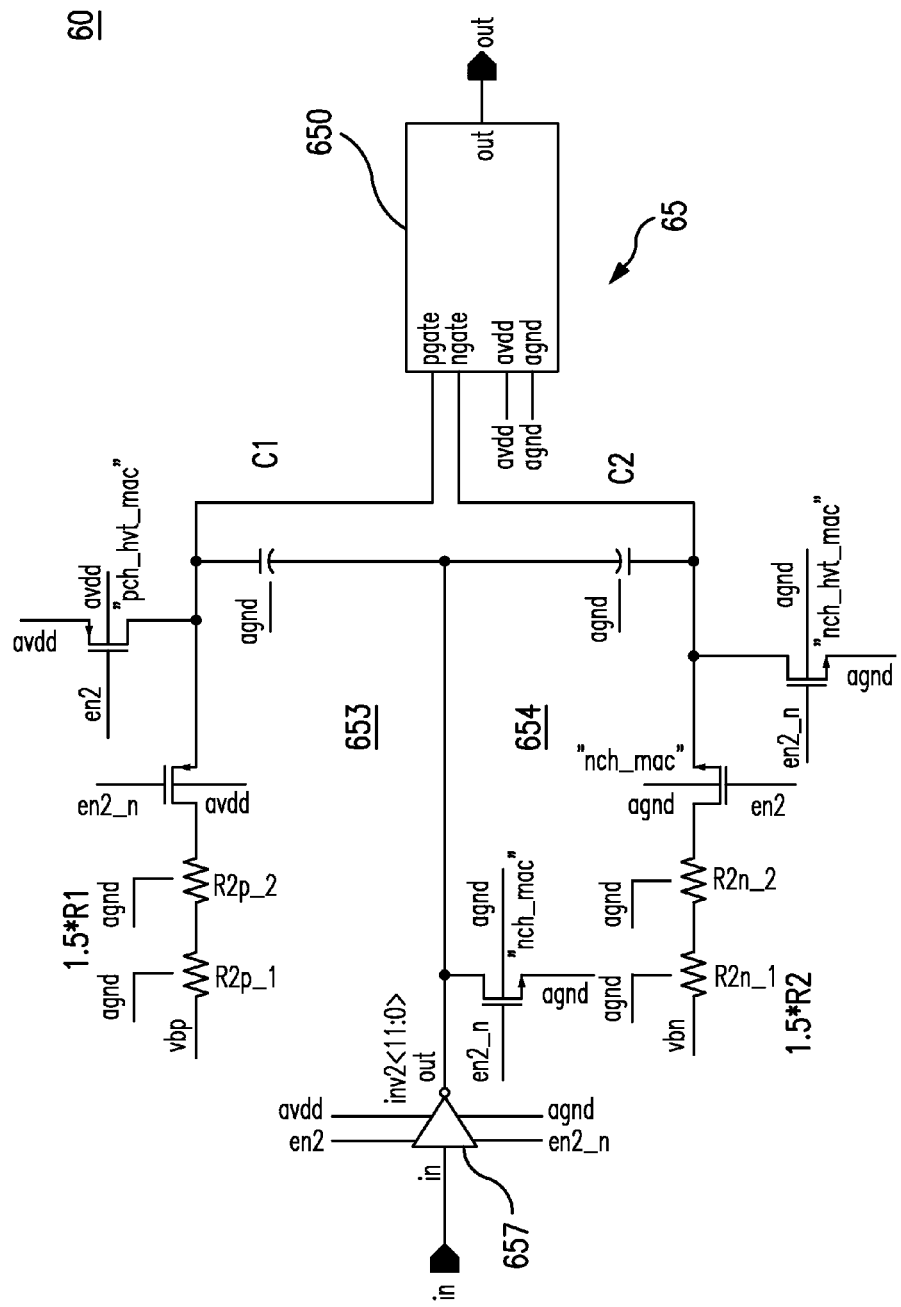
Figures 3, 6A:
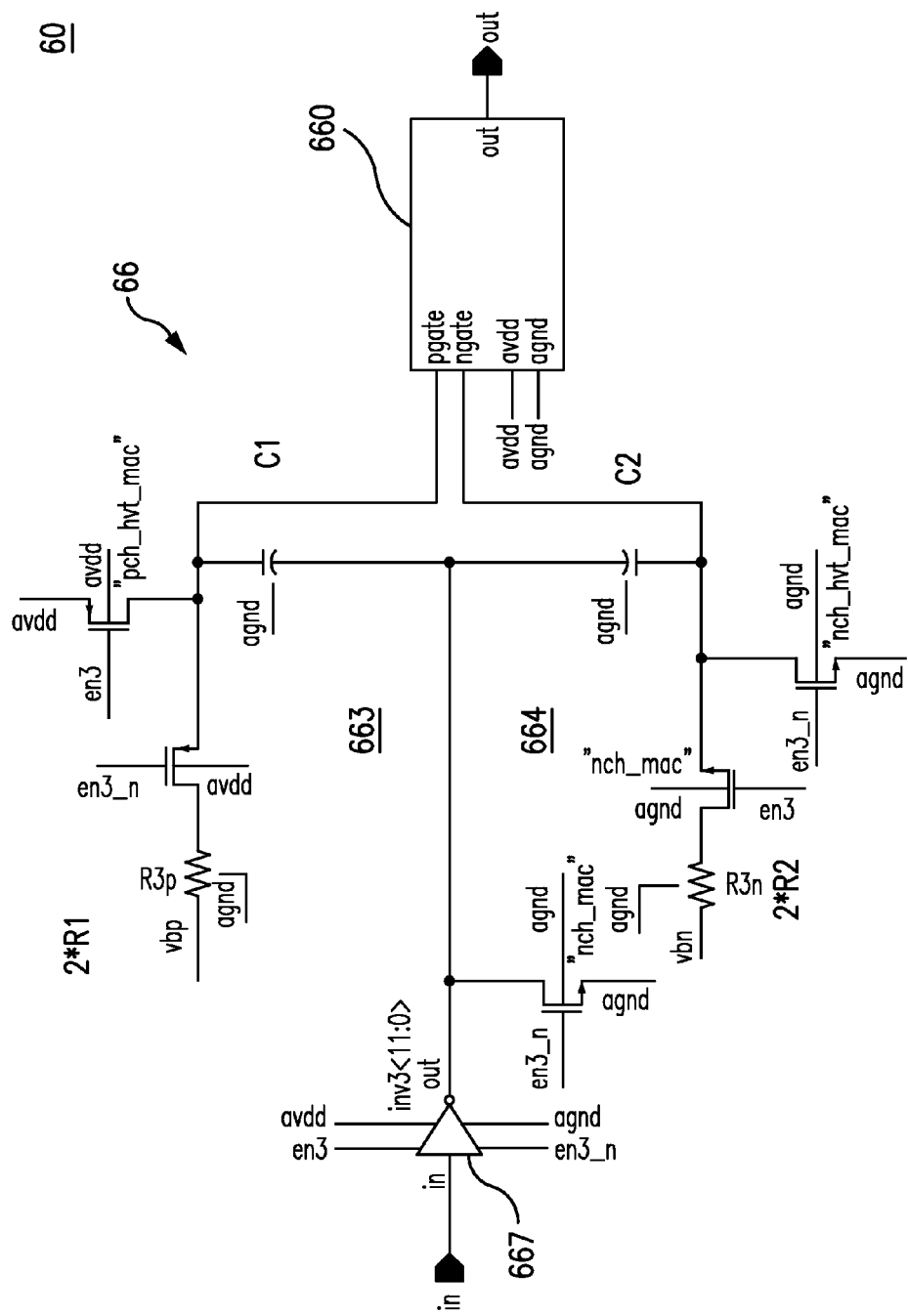

This is problematic for high speed serial link applications, particularly in applications collectively/effectively operating on the order of 10 Gbits or higher, where to ensure a suitable degree of interoperability between equipment units, widely accepted industry standards must be met. One such interoperability standard governing these applications is the 10 Gbit Attachment Unit Interface (XAUI) standard. This standard requires among other things that certain minimum peak voltage levels be maintained at certain measurement points in a test setup like the one illustrated in the given example (FIGS. 1-2). For example, at a near end, such as at measurement point MP1 indicated in FIG. 1, the XAUI standard requires a peak-to-peak voltage (eye opening) of 800 mV to be maintained for the duration of a drive signal's active state, or for the duration of its drive period. The eye diagrams of FIGS. 2A, 2B demonstrate a failure to satisfy this standard, since the dip in amplitude between regions 21a, 21b and 23a, 23b clearly fall below 800 mV.

The XAUI standard does provide a separate far end peak amplitude (eye opening) requirement which in certain applications may be satisfied in lieu of this near end peak amplitude requirement. In the illustrative set up of FIG. 1, for instance, maintaining at measurement point MP2 a peak-to-peak voltage amplitude of at least 200 mV for the differential drive signal of the given example would satisfy the XAUI requirement, even if the 800 mV near end requirement were not met. In most applications, however, the signal attenuation normally encountered as the drive signal propagates through the connectors 8a, 8c, cable 8b, and test channel 10, diminishes the far end peak-to-peak voltage to be well below the required 200 mV, if the near end requirement is not met in the first place. The attenuation at that point would have all but closed the 'eye' at the far end MP2.

As mentioned, it is no answer to simply raise the supply voltage to a high enough level to ensure ample peak voltage margin in the drive signal at the XAUI near end and far end points. Nor is it sufficient answer to employ de-emphasis techniques for signal to interference improvement of the drive signal. The strain on other system requirements and unwanted disturbance of the signal's low frequency content preclude as much in many high speed applications.

In broad concept, the subject system and method provide for automatically boosting in amplitude a selective portion of a drive signal generated by a driver unit implemented on a source chip so that it may be transmitted to a receiver unit on a destination chip located across an interconnection interface with its signal integrity reliably preserved. More specifically, a boosting unit is operably coupled to the driver unit and/or an output node on which the drive signal is provided. The boosting unit selectively boosts in amplitude only that portion of the drive signal expected to encounter excessive attenuation as the signal is transmitted through various intervening media on its way to the receiver unit. The boosting unit accordingly generates a boost signal which serves to boost the drive signal only during a selected portion of its drive period (the time the drive signal is in its active state).

This boosted portion of the drive signal may be selectively set to occur over any portion of the drive period, depending on the particular requirements of the intended application. For many high speed applications, this portion is preferably disposed in time at or near a leading edge of the drive signal, where it transitions to an active state. This constitutes in the frequency domain effectively boosting the higher frequency constituents of the drive signal without disturbing the signal's other lower frequency constituents.

Figure 3:
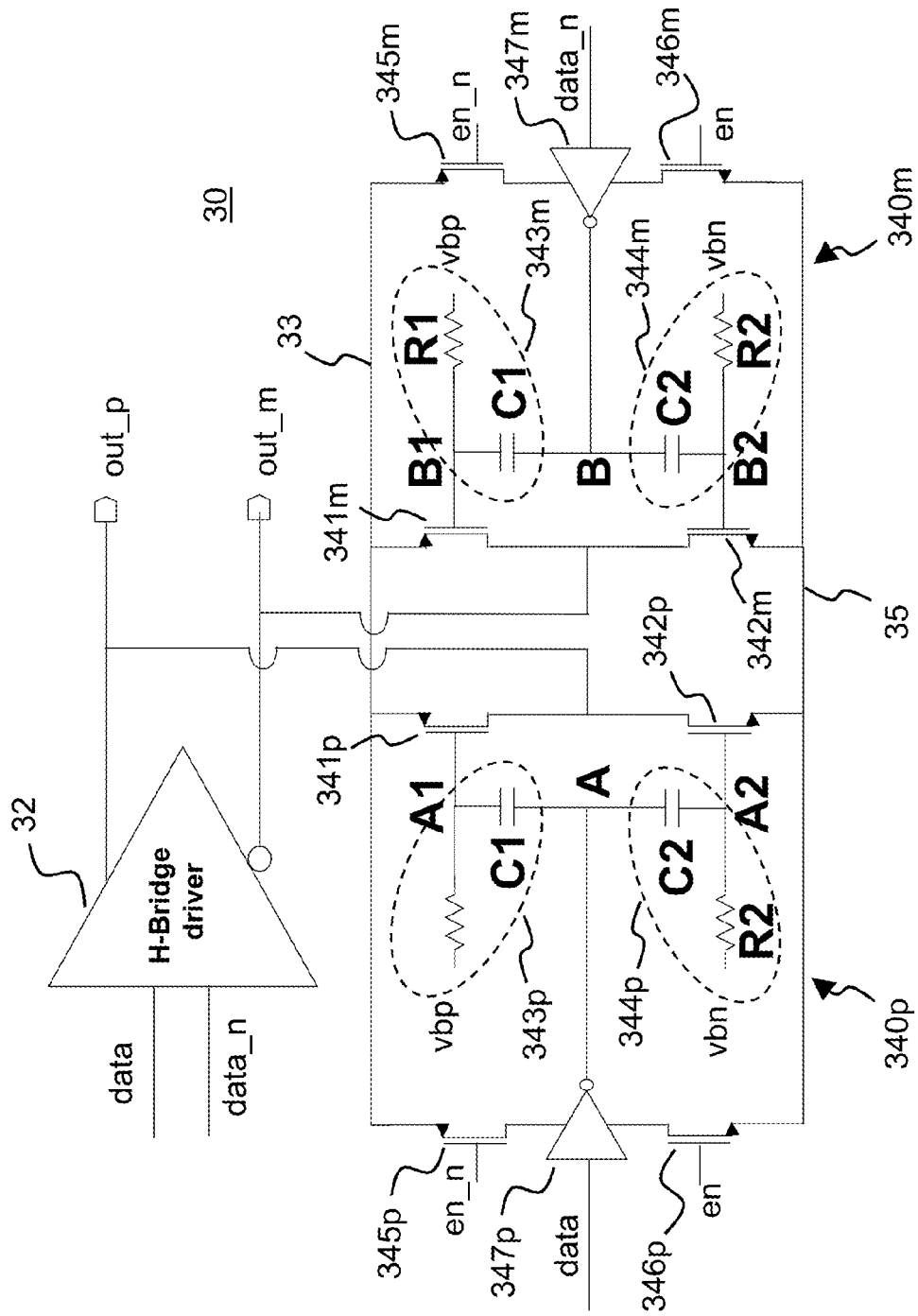
FIG. 3 is a schematic diagram illustrating a boosted driver system formed in accordance with one exemplary embodiment of the present invention.

Turning now to FIG. 3, there is shown a highly simplified schematic diagram illustrating certain main portions of a system 30 formed in accordance with one exemplary embodiment of the present invention. With reference to the high level representation of the interconnected equipment units of FIG. 1, system 30 is preferably implemented on an IC chip 2 for generation of a suitably boosted drive signal. In accordance with certain aspects of the disclosed embodiment, this boosted drive signal is transmitted through the chip's package 4, the circuit board 6 on which the chip resides, and on through the near side SMA connector 8a to the near end measurement point MP1. Despite the attenuation it undergoes by the time it arrives at that near end point MP1, the drive signal retains the minimum voltage amplitude margin required (for the given application) over a particular drive period following transition. In accordance with certain other aspects of the disclosed embodiment, the boosted drive signal maintains the voltage amplitude margin required also at the far end measurement point MP2, upon further transmission (and successive attenuation) through the cable 8b, far end SMA connector 8c, and given test channel 10.

In the illustrated example, the amplitude margin requirements at the near and far end measurement points MP1, MP2 are preferably peak voltages defining the minimum eye openings of respective eye diagrams there, such as required by the XAUI standard. In the example shown, the drive signal is preferably generated in differential signal form, in response to a differential input data signal. The XAUI eye opening requirements at each of the near and far end measurements points MP1, MP2 are therefore measured as peak-to-peak voltages from the eye diagrams of the drive signal's complementary signal components.

System 30 includes a driver unit 32 which receives complementary input data signal components data and data_n to generate and apply corresponding drive signal components at respective plus and minus output nodes out_p and out_m. Driver unit 32 may include any suitable driver circuitry known in the art, including an H-bridge driver circuit suitably configured for the particular requirements of the given application.

System 30 further includes at least one boosting unit 34 preferably coupled as shown to the differential output nodes out_p and out_m for operational interaction with the driver unit's drive signal output. Each boosting unit 34 in this example includes complementary sub-units 340p, 340m for generating respective boost signals for the complementary drive signals generated by driver unit 32. In alternate embodiments employing single-ended signaling, each boosting unit 34 may include a single sub-unit to serve a single-ended drive signal.

Preferably, the boosting sub-units 340p, 340m are substantially identical in circuit configuration, except for the fact that they serve to boost different ones of the complementary drive signals applied at the output nodes out_p and out_m, driven as they are by complementary input data signals data, data_n. Referring to the boosting sub-unit 340p coupled to the plus output node out_p, the sub-unit includes complementary switches 341p, 342p connected in pull-up and pull-down configuration. That is, switches 341p, 342p establish alternatively switched conduction paths between a high supply rail 33 and the plus output node out_p on the one hand, and between a low supply rail 35 and that output node on the other. In the illustrated embodiment, the high and low supply rails 33, 35 are set to predetermined reference levels avdd and agnd suitably offset from one another in voltage. Switch 341p is configured to effectively form a p-channel metal-oxide-semiconductor field effect transistor (MOSFET), with its source terminal connected to the high supply rail and its drain terminal coupled to the plus output node out_p. Conversely, switch 342p is configured to effectively form a comparable n-channel MOSFET, with its source terminal connected to the low supply rail and its drain terminal coupled to the plus output node out_p.

The switch configurations shown, including the type of switching devices (MOSFET) employed in the illustrated embodiment, are but one example of the various suitable configurations that may be employed. One skilled in the art will recognize that the complementary switches may be configured to effectively implement various other types of switching devices, so long as suitable modifications are made in the surrounding circuitry to accommodate the same. One skilled in the art will also recognize more generally that each of the boosting sub-units 340p, 340m may be formed with other suitable circuit topologies, employing other types and devices/components, to impart boosting in selectively timed manner.

Boosting sub-unit 340p further includes an inverting buffer 347p which receives a plus data component of the differential input data signal. The output of inverting buffer 347p is operably coupled to node A, to which a control circuit for the complementary switches 341p, 342p is also coupled. The control circuit in the illustrated embodiment includes high pass filter sections 343p, 344p respectively connected to the control terminals of the complementary switches 341p, 342p. In this case, each high pass filter section 343p, 344p connects to the gate terminal of its corresponding MOSFET switching device 341p, 342p.

The high pass filter sections 343p, 344p are formed to respectively include resistive and capacitive elements R1 and C1, R2 and C2 whose effective values define the sections' characteristics RC time constants. Although represented by a singular element for brevity and clarity, each of the resistive and capacitive elements R1, R2, C1, C2 may be realized in any suitable manner known in the art. For example, they may each be realized by one or more discrete or integrated components which collectively define the effective resistance values R1, R2 and effective capacitance values C1, C2.

The capacitive element C1 in high pass filter section 343p is connected between node A and the gate terminal of switching device 341p, or node A1. Conversely, the capacitive element C2 in high pass filter section 344p is connected between node A and the gate terminal of switching device 342p, or node A2.

The resistive element R1 in high pass filter section 343p is connected between node A1 and a positive biasing voltage source level vbp, while the resistive element R2 in high pass filter section 344p is connected between node A2 and a negative biasing voltage source level vbn. As described in following paragraphs, each of the positive and negative biasing voltage source levels vbp, vbn is preferably set by suitable measures so that a steady state voltage level applied at the gate terminal (node A1, A2) of its corresponding switch device 341p, 342p is slightly less than the magnitude required for switching of that device to a conductive state. In other words, the biasing voltage levels vbp, vbn are set to maintain a slight predetermined difference between the steady state voltage levels applied at nodes A1, A2 and the characteristic gate-source threshold voltages of the complementary MOSFET devices 341p, 342p.

Boosting sub-unit 340p preferably includes a plurality of enabling switches 345p, 346p whose conduction paths connect respective power terminals of the inverting buffer 347p to the supply rails 33, 35. The control terminals of these enabling switches are tied to complementary enabling signals en_n, en. Boosting sub-unit 340p is consequently energized for passage of the actuating input data signal component only when its complementary enabling signals en_n, en are accordingly set. The other boosting sub-unit 340m is likewise energized according to the same enabling signals en_n, en to impart complementary boost to the differential drive signal component delivered on the minus output node out_m.

As mentioned, the other complementary boosting sub-unit 340m mirrors the boosting sub-unit 340p in circuit structure. Corresponding circuit features in the two sub-units 340p, 340m are indicated by matching reference numbers differentiated only by respective p and m designations. For example, complementary switching devices 341m, 342m of boosting sub-unit 340m are defined effectively by p- and n-channel MOSFET devices electrically equivalent to MOSFET devices 341p, 342p of boosting sub-unit 340p. Moreover, high pass filter sections 343m, 344m of boosting sub-unit 340m are electrically equivalent to the high pass filter sections 343p, 344p. They each share substantially the same RC time constant with those high pass filter sections 343p, 344p.

During operation, when the input differential data signal transitions to a high or other active state, its differential signal components data and data_n individually transition with mutually opposed polarities. The driver unit 32 generates (in a manner determined according to the requirements of the given application) differential drive signal components which are delivered onto output nodes out_p and out_m. If the complementary enabling signals en, en_n are set to activate the boosting unit 34, the input differential signal components data and data_n are concurrently passed into boosting sub-units 340p, 340m to actuate boosting of the drive signal components.

Figure 4:
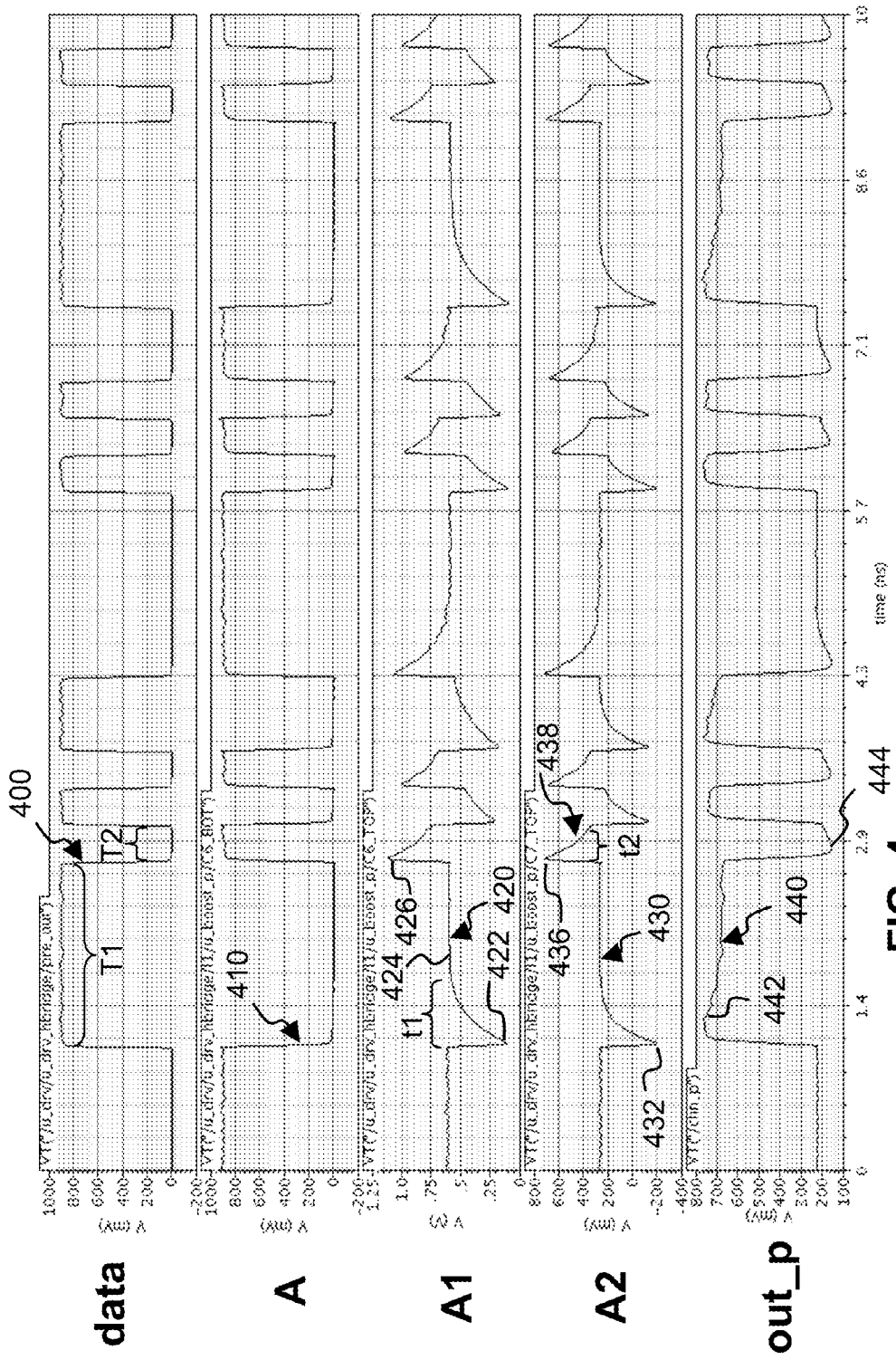
FIG. 4 is a time-aligned set of illustrative diagrams showing waveforms for signals at certain plus signal nodes of the system embodiment illustrated in FIG. 3.

Reference is made to the waveform diagrams of FIG. 4 to describe the operation of the plus side boosting sub-unit 340p. As shown by waveform 410, the plus input data signal component 400 is inverted and passed by the inverting buffer 347p onto node A. The inverted data input signal remains at the low voltage state during the given drive period T1 over which the data input signal remains high. The immediate downward transition of the inverted data signal 410 at node A causes the voltage at node A1 (tied to the gate terminal of the p-channel device 341p) to drop accordingly, since the voltage across capacitive element C1 cannot change instantaneously. This is indicated by point 422 of waveform 420.

Since the gate-source voltage of p-channel MOSFET device 341p drops below its threshold voltage, the device turns on, causing the high supply rail voltage 33 to be applied to positively boost the plus drive signal component on output node out_p for a brief time duration following a positive transition. This is indicated by region 442 of the plus drive signal waveform 440. The boosting continues for a boost time period $t_1$ during which the capacitive element C1 charges to raise the voltage at node A1 gradually according to the R1×C1 time constant of high pass filter section 343p.

When capacitive element C1 fully charges after the time period $t_1$ elapses (or the data signal re-transitions, whichever occurs first), the voltage at A1 returns substantially to its steady state value or other value dictated by the given data signal. This is indicated by the point 424 of waveform 420. At that point, the p-channel MOSFET device 341*p* turns off, which in turn cuts off the plus drive signal's positive boost. If the drive period T1 is greater than the positive boost period $t_1$ (as in the example illustrated in FIG. 4), the drive signal component on output node out_p remains unboosted (at least not boosted by the given boosting unit 34) for the balance of the given drive period T1. In certain embodiments, one or more other co-enabled boosting units having different effective time constant(s) may perpetuate boosting through a further portion of the remaining drive period T1.

Upon a positive transition of the data input signal, the immediate downward transition of the inverted data signal at node A also causes the voltage at node A2 to drop accordingly, since the voltage across capacitive element C2 of the high pass filter section 344*p* also cannot change instantaneously. This is indicated by point 432 of waveform 430. This further reduction of voltage applied at the gate terminal of n-channel MOSFET device 342*p* is ineffectual to its switching. The reduced gate-source voltage keeps that device turned off. Subsequent charging of the capacitive element C2 only returns the voltage at node A2 to the steady state off voltage which continues to keep the n-channel device 342*p* off.

When the input signal component data transitions to a low state, its inverted signal at node A transitions to a high voltage state and remains there for a period T2 over which the data input signal 400 remains low. The immediate upward transition of the inverted data signal 410 at node A causes the voltage at both nodes A1, A2 to increase accordingly, since the voltage across capacitive elements C1, C2 cannot change instantaneously. This is indicated by point 426 and 436 of the waveforms 420, 430. The resultant increase in the gate-source voltage of p-channel MOSFET device 341*p* (tied to node A1) is ineffectual to that device, as it remains off. The resultant increase in the gate-source voltage of n-channel MOSFET device 342*p* (at node A2), however, causes this device to turn on, whereby the low supply rail voltage 35 is applied to negatively boost the plus drive signal component on output node out_p for a brief time duration following a negative transition. This negative boost is indicated by region 444 of the plus drive signal waveform 440.

The boosting continues for a boost time period $t_2$ during which the capacitive element C2 charges to cause a gradual lowering of the voltage at node A2 according to the R2×C2 time constant of high pass filter section 344*p*. When capacitive element C2 fully charges after the time period $t_2$ elapses (or the data signal re-transitions, whichever occurs first), the voltage at A2 returns substantially to its steady state value or other value dictated by the given data signal component. This is indicated by the point 438 of waveform 430. At that point, the n-channel MOSFET device 342*p* turns off (unless the data signal transition again before then), which in turn cuts off the plus drive signal's negative boost. The drive signal component on output node out_p remains unboosted (at least not boosted by the given boosting unit 34) for the remainder of the currently active drive period T2. In certain embodiments, one or more other co-enabled boosting units having different effective time constant(s) may extend the boosting through a further portion of the remaining drive period T2.

The positive and negative boost periods $t_1$, $t_2$ defined by boosting unit 34 may be extended or shortened in duration by configuring the respective RC time constant of its high pass filter sections. Also, by utilizing a plurality of selectively enabled boosting units (such as 64, 65, 66 shown in FIG. 6A collectively represented by views 6A-1, 6A-2, and 6A-2) coupled to the drive signal output node, the voltage boost such boosting units collectively provide may be adjustably 'tuned' by selectively enabling different boosting unit combinations. As illustrated in FIGS. 6A-7 described in following paragraphs, moreover, by variously configuring the different boosting units with different RC time constants, the profile of total boost collectively applied to the drive signal may be adjusted as needed for the intended application.

Figure 5:
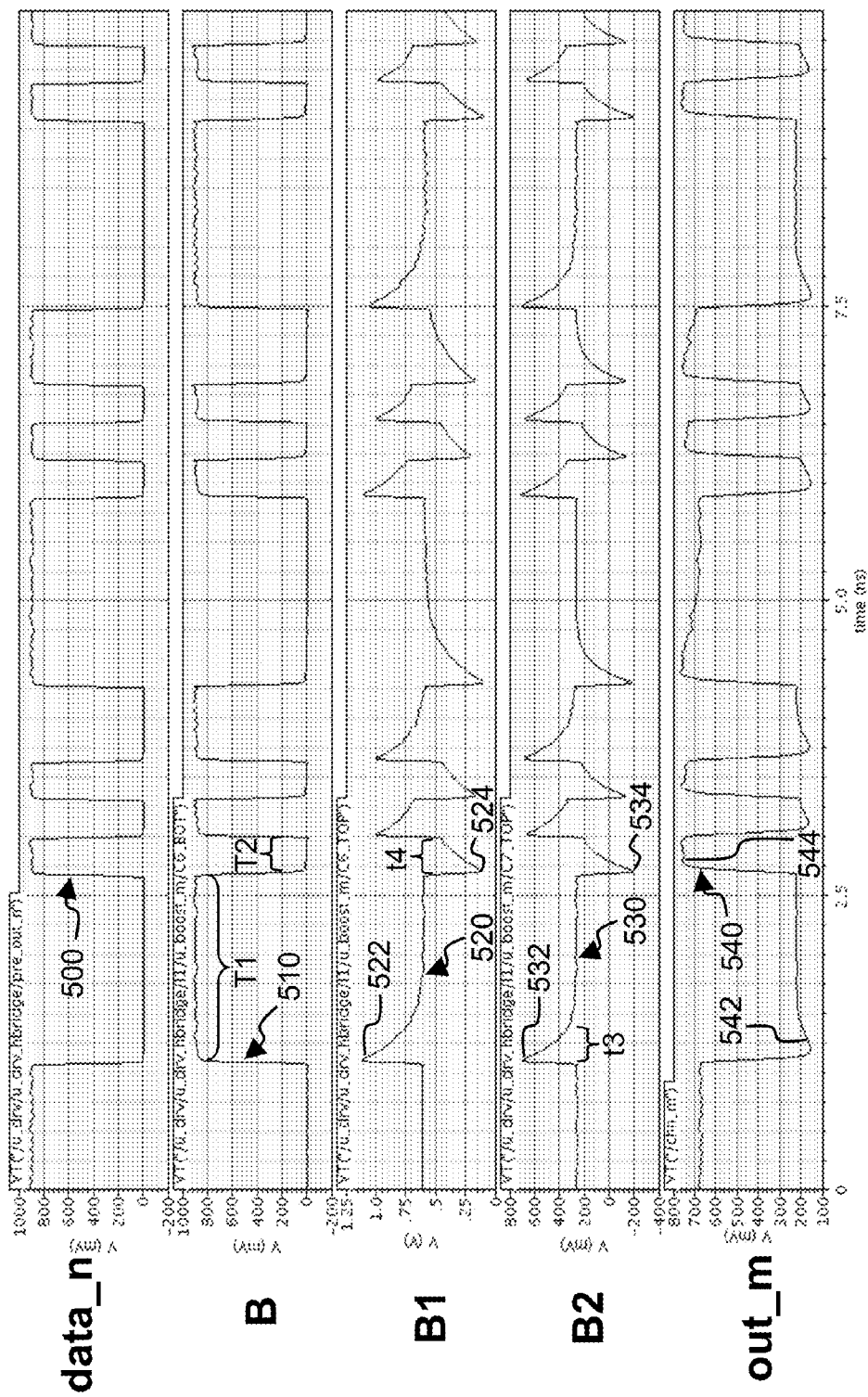
FIG. 5 is a time-aligned set of illustrative diagrams showing waveforms for signals at certain minus signal nodes of the system embodiment illustrated in FIG. 3.

Operation of the minus side boosting sub-unit 340*m* occurs in much the same manner, as the plus side boosting sub-unit 340*p*. The timing diagrams of FIG. 5 illustrate the sub-unit's actuation in response to the minus input data_n signal component shown by waveform 500. The minus input data_n signal component 500 is inverted and passed by the inverting buffer 347*m* onto node B. The inverted data_n input signal 510 remains at a high voltage state during the given drive period T1 over which the data_n input signal 500 remains high. The immediate upward transition of the inverted data_n signal 510 at node B causes the voltage at node B1 (tied to the gate terminal of the p-channel device 341*m*) to rise accordingly, since the voltage across capacitive element C1 cannot change instantaneously. This is indicated by point 522 of waveform 520.

The gate-source voltage of p-channel MOSFET device 341*m*, which had been above its threshold voltage, therefore remains above the threshold voltage. The device 341*m* stays turned off, preventing the high supply rail voltage 33 from being applied to the minus output node out_m.

The immediate upward transition of the inverted data_n signal 510 at node B also causes the voltage at node B2 (tied to the gate terminal of the n-channel device 342*m*) to rise accordingly, since the voltage across capacitive element C2 cannot change instantaneously. This is indicated by point 532 of waveform 530, where the n-channel device 342*m* turns on, causing the low supply rail voltage 35 to be applied to negatively boost the minus drive signal component on output node out_m for a brief time duration following a negative transition. This is indicated by region 542 of the minus drive signal waveform 540. The negative boosting continues for a boost time period $t_3$ during which the capacitive element C2 charges to reduce the voltage at node B2 gradually according to the R2×C2 time constant of high pass filter section 344*m*.

When capacitive element C2 fully charges after the time period $t_3$ elapses (or the data_n signal re-transitions, whichever occurs first), the voltage at B2 returns substantially to its steady state other value dictated by the given data signal component. This is indicated by the point 534 of waveform 530. At that point, the n-channel MOSFET device 342*m* turns off, which in turn cuts off the minus drive signal's negative boost contributed by boosting sub-unit 340*m*. The drive signal component on output node out_m remains unboosted (at least not boosted by the given boosting unit 34) for the balance of the given drive period T1. In certain embodiments, one or more other co-enabled boosting units having different effective time constant(s) may perpetuate boosting through a further portion of the remaining drive period T1.

Upon a positive transition of the data_n input signal 500, the immediate downward transition of the inverted data_n signal 510 at node B causes the voltage at node B2 to drop accordingly, since the voltage across capacitive element C2 of the high pass filter section 344*m* cannot change instantaneously. This is indicated by point 534 of waveform 530. This further reduction (from the steady state off level) of the voltage at the gate terminal of the n-channel MOSFET device 342*m* is ineffectual to its switching. The reduced gate-source voltage keeps that n-channel device turned off. Subsequent charging of the capacitive element C2 only returns the voltage at node A2 to the steady state off voltage level which continues to keep the n-channel device 342m off.

The situation is different for the p-channel switching device 341m, upon the downward transition of inverted data_n signal 510 at node B. The voltage voltage at node B1 drops accordingly, again since the voltage across capacitive element C1 of the high pass filter section 343m cannot change instantaneously. This is indicated by point 524 of waveform 520. The resultant drop in the gate-source voltage of p-channel MOSFET device 341m (tied to node B1) causes this device to turn on, whereby the high supply rail voltage 35 is applied to positively boost the minus drive signal component on output node out_m for a brief time duration following a positive transition. This positive boost is indicated by region 544 of the minus drive signal waveform 540. The minus drive signal component 540 on output node out_m remains at its high voltage state for the period T2 over which the data_n input signal 500 remains high, and a selective portion of that signal component 540 is boosted, depending on the R1×C1 time constant of high pass filter section 342m.

The positive boosting continues for a boost time period $t_4$ during which the capacitive element C1 charges to cause a gradual increase of the voltage at node B1 according to the R2×C2 time constant of high pass filter section 344p. When capacitive element C1 fully charges after the time period $t_4$ elapses (or the data_n signal re-transitions, whichever occurs first), the voltage at B1 returns substantially to its steady state or other value dictated by the given data signal component. At that point, the p-channel MOSFET device 342m turns off, which in turn cuts off the plus drive signal's positive boost. If the drive period T2 is greater than the positive boost period $t_4$, the drive signal component on output node out_m remains unboosted (at least not boosted by the given boosting unit 34) for the remainder of the currently active drive period T2. As mentioned before, one or more other co-enabled boosting units having different effective time constant(s) may in certain embodiments extend the boosting through a further remaining portion of the drive period T2, if any.

Both positive and negative boosting stages are thereby provided by the boosting sub-unit 340p for the plus component of the differential drive signal. Both positive and negative boosting stages are similarly provided by the boosting sub-unit 340m for the minus component of the differential drive signal. The positive and negative boosting stages are provided by the sub-units 340p, 340m in predetermined self-timed manner, preferably according to the characteristic RC time constants respectively defined by their positive and negative boosting sections. Furthermore, where a plurality of boosting units 34 are employed, the units may be selectively activated in different combinations to adjust the profile of total boost applied to each of the positive and negative boosts applied to the given drive signal, be it a differential or single-ended drive signal.

Figure 6B:
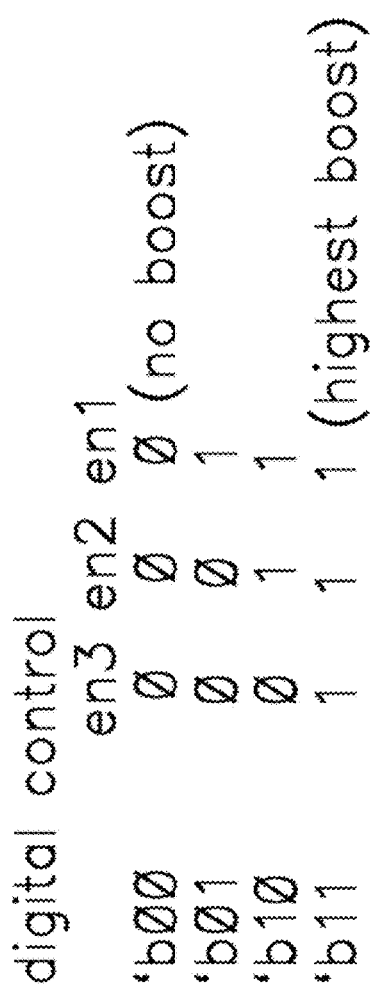
FIG. 6B is an illustrative diagram illustrating a table of digital values describing a plurality of programmable boosting states for the implementation illustrated in FIG. 6A.
Figure 6C:
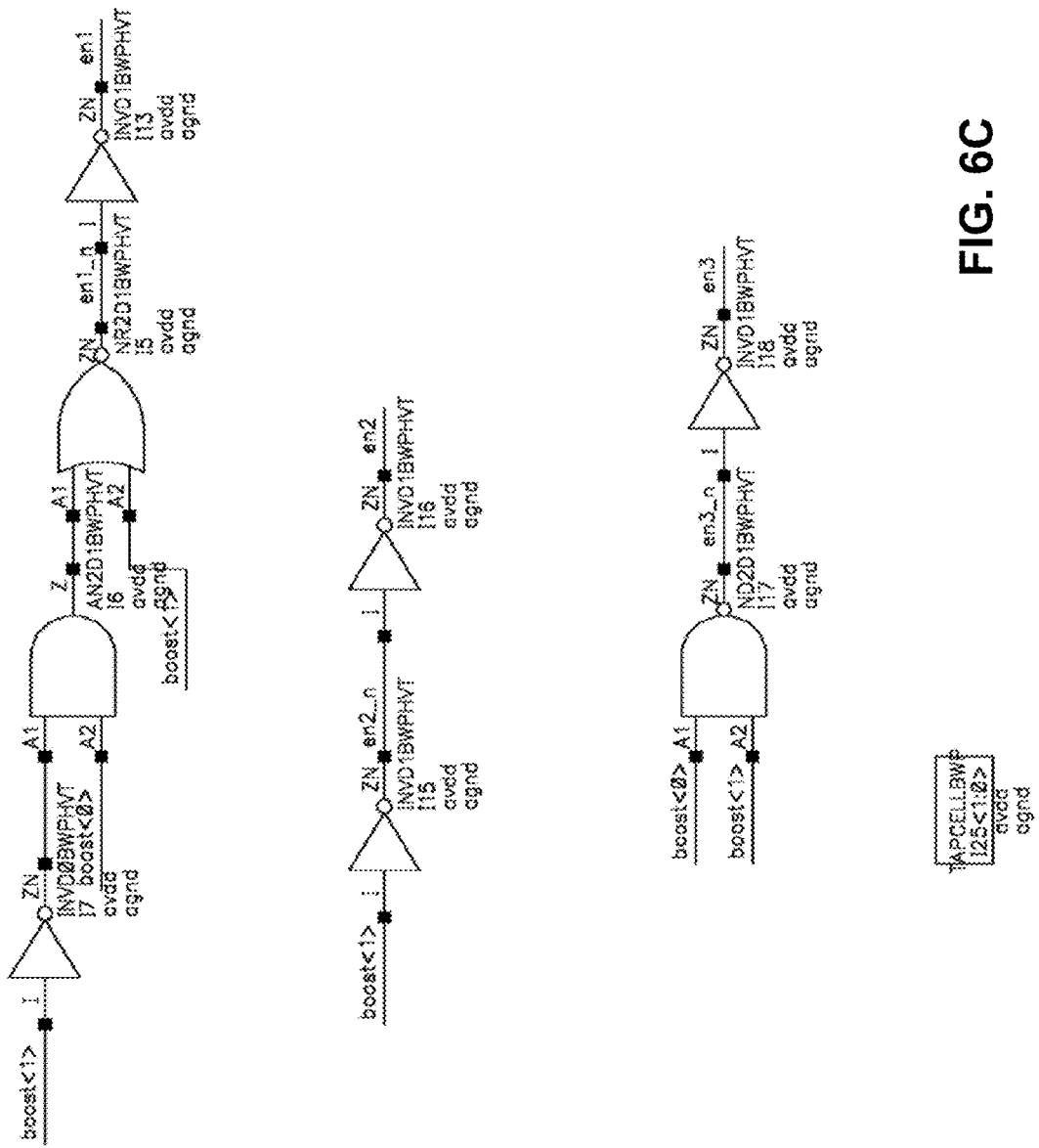
FIG. 6C is a schematic diagram illustrating the generation of certain enabling signals for the implementation illustrated in FIG. 6A-6B.
Figure 7:
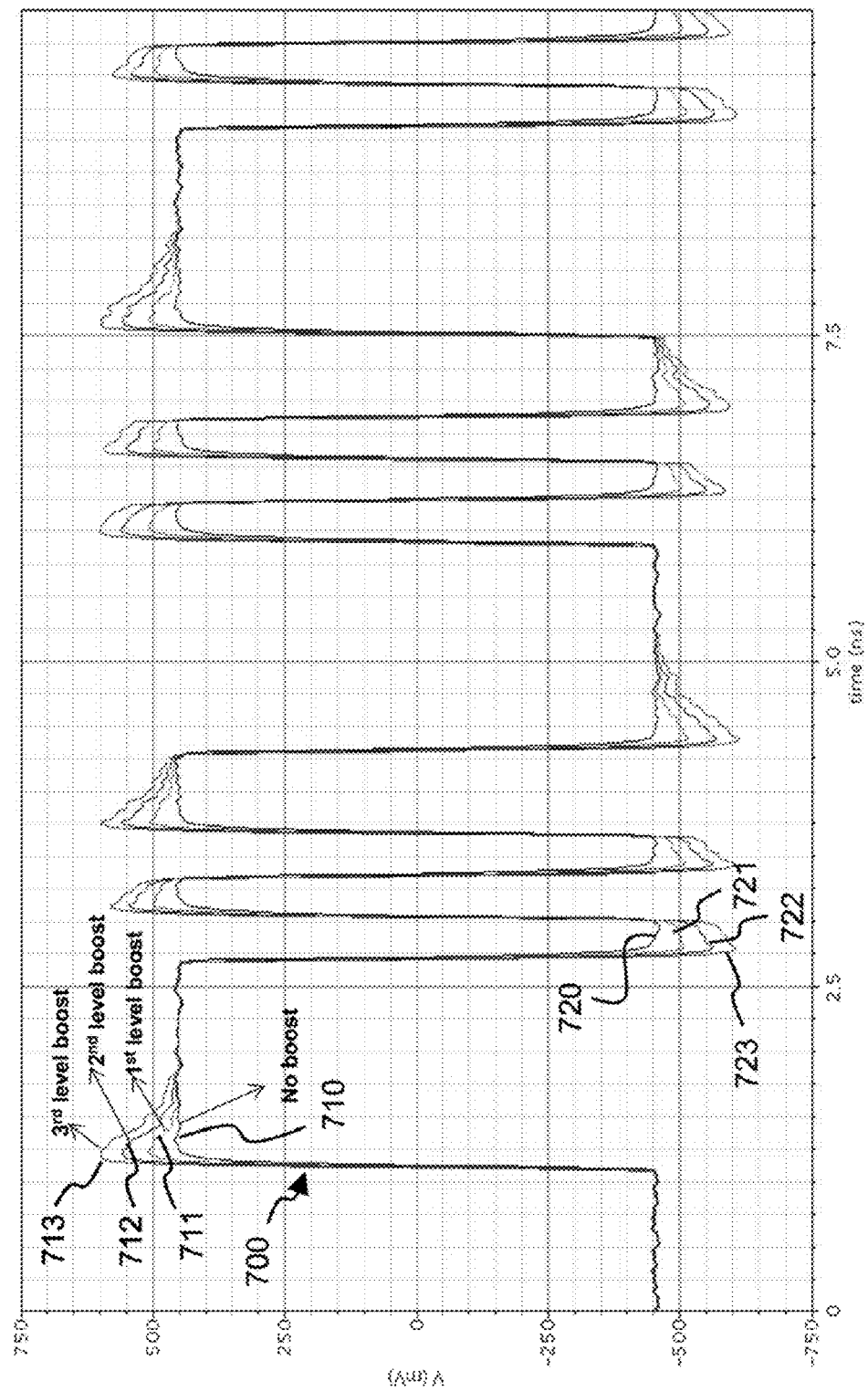
FIG. 7 is a diagram illustrating waveforms for a boosted drive signal generated by the embodiment of FIGS. 6A-6C, illustrating the effects of different boost level setting.

FIGS. 6A, 6B, 6C schematically illustrate in somewhat greater detail one exemplary implementation of certain portions of the embodiment shown in FIG. 3. The implementation includes in this example a boosting subsystem 60 comprising a plurality of programmably enabled boosting units 64-66 for selectively boosting the drive signal generated by a driver unit 32 (not shown). In the case of a differential drive signal, as in the given example, two sets of the three boosting units 64-66 shown are employed to boost the two complementary signal components of the differential drive signal. Each of the boosting units 64-66, therefore, actually corresponds to one of the sub-units 340p or 340m represented in FIG. 3. In any event, only one set of boosting units 64-66 is shown the interests of brevity, the boosting units 64-66 all serving to boost the same one of the complementary signal components. Preferably, the other set of boosting units not shown, which serve to boost the other complementary drive signal component, are configured to match the shown units 64-66.

One skilled in the art will recognized that while three sets of boosting units 64-66 are employed in this exemplary embodiment, any suitable number of boosting units may be employed depending on the particular requirements of the intended application. Different numbers of boosting units may be used in alternate embodiments, with each boosting unit (including its counterpart for serving the complementary drive signal component, where differential signaling is used as in the disclosed embodiment) providing a selectively enabled stage for contribution to an overall composite level of boost.

Referring to FIG. 6A, the boosting units 64-66 are preferably formed substantially with like circuit structure, except that they are characterized by different sets of RC time constants for the high pass filter sections 643/644, 653/654, 663/664. In alternate embodiments, some or all of the units 64-66 may be formed with the same RC time constant sets for these high pass filter sections. Much as shown in FIG. 3, each unit 64-66 includes a switching stage 640, 650, 660 of complementary switching devices (each implementing p-channel and n-channel device pair 341p, 342p to boost a plus drive signal component, for example), with high pass filter sections 643/644, 653/654, 663/664 coupled thereto for controlling the unit's positive and negative boost stages.

In the embodiment shown, each of the boosting units 64-66 is formed with the same set of effective capacitance values C1, C2 in the filter sections of its positive and negative boost stages, but with different sets of resistance values. For example, the first boosting unit 64 includes effective resistances R1, R2 in its positive and negative boost filter sections 643, 644. The second boosting unit 65 includes proportionally higher effective resistances 1.5(R1), 1.5(R2) in its positive and negative boost filter sections 653, 654. The third boosting unit 66 includes effective resistances which are proportionally higher still, at 2(R1), 2(R2) in its positive and negative boost filter sections 663, 664. The units 64-66 may in alternate embodiments employ other combinations of R,C values to suit the specific needs of the intended application, as the present invention is not limited to any particular choice of values.

The different RC time constants of the boosting units 64-66 mean that while boosting units when enabled will impose both positive and negative boost on a drive signal component, they will do so for different lengths of time within a particular drive period of that drive signal component. Enabling different ones or different combinations of the boosting units 64-66 will then yield different boosting profiles on the drive signal component. In the embodiment shown, such enabling is programmably effected, preferably, by selectively activating the circuitry of each boosting unit 64-66 responsive to separate enabling signals en1, en2, en3. FIG. 6B illustrates the four boosting levels b00, b01, b10, b11 which may be digitally defined by selectively setting different combinations of the enabling signals en1, en2, en3. FIG. 6C illustrates examples of logically gated measures for generating each of these enabling signals.

At boost level b00, the boosting function is turned off, as none of the boosting units 64-66 is enabled. At boost level b01, the first boosting unit 64 is alone enabled, while at boost level b10, both the first and second boosting units 64, 65 are concurrently enabled. At boost level b11, all three of the boosting units 64, 65, 66 are concurrently enabled. In this manner, the boosting stages actuated by the boosting units 64, 65, 66 may be cumulated as needed to build up sufficient boost for the higher frequency constituents of the given drive signal. That is, a cumulative boost may be built up at the leading edge of a drive signal transition and made to last for a brief duration thereafter.

This is illustrated in FIG. 7, where a selectively boosted differential drive signal waveform 700 generated by employing the boosting subsystem 60 of FIG. 6A in simulation is shown. The drive signal is shown as measured at the near end measurement point MP1 (see FIG. 1) in the given example, after combination of its complementary components to remove the common mode voltage therefrom. As shown, the region 710 near the rising edge of the unboosted drive signal 700 describes a profile that is no greater in magnitude than the rest of the signal during the ensuing drive period T1. With the boosting units set to impart the first level of boost b01, the drive signal is boosted in magnitude at the leading edge region to define a first level boosted profile 711. When the boosting units are set to impart the second level of boost b10, the drive signal is boosted to define a profile 712, which goes higher in magnitude and lasts over a longer time duration than the first level profile 711. When the boosting units are set to impart the third level of boost b11, the drive signal is boosted to define a profile 713, which goes even higher in magnitude and lasts over a longer time duration than the second level profile 712. A similar, progressively heightened boost response is seen at the falling edge of the drive signal, where the profiles 720, 721, 722, 723 result from setting the boosting units to impart the boost levels b00-b11.

The boosted profile at and around the leading edge of a drive signal transition provides sufficient margin to pre-compensate for the high frequency attenuation effects seen in many high speed applications. The boosting may be 'tuned' by appropriately enabling the boosting units 64-66 to yield a boost profile that provides sufficient amplitude margin under the given operating conditions. The eye opening requirements specified by XAUI or other applicable standards for a drive signal transmitted from a driver chip to a receiver chip disposed on the other side of an interconnection interface, therefore, may be met at different measurement points along the signal's path of transmission.

Figure 8A:
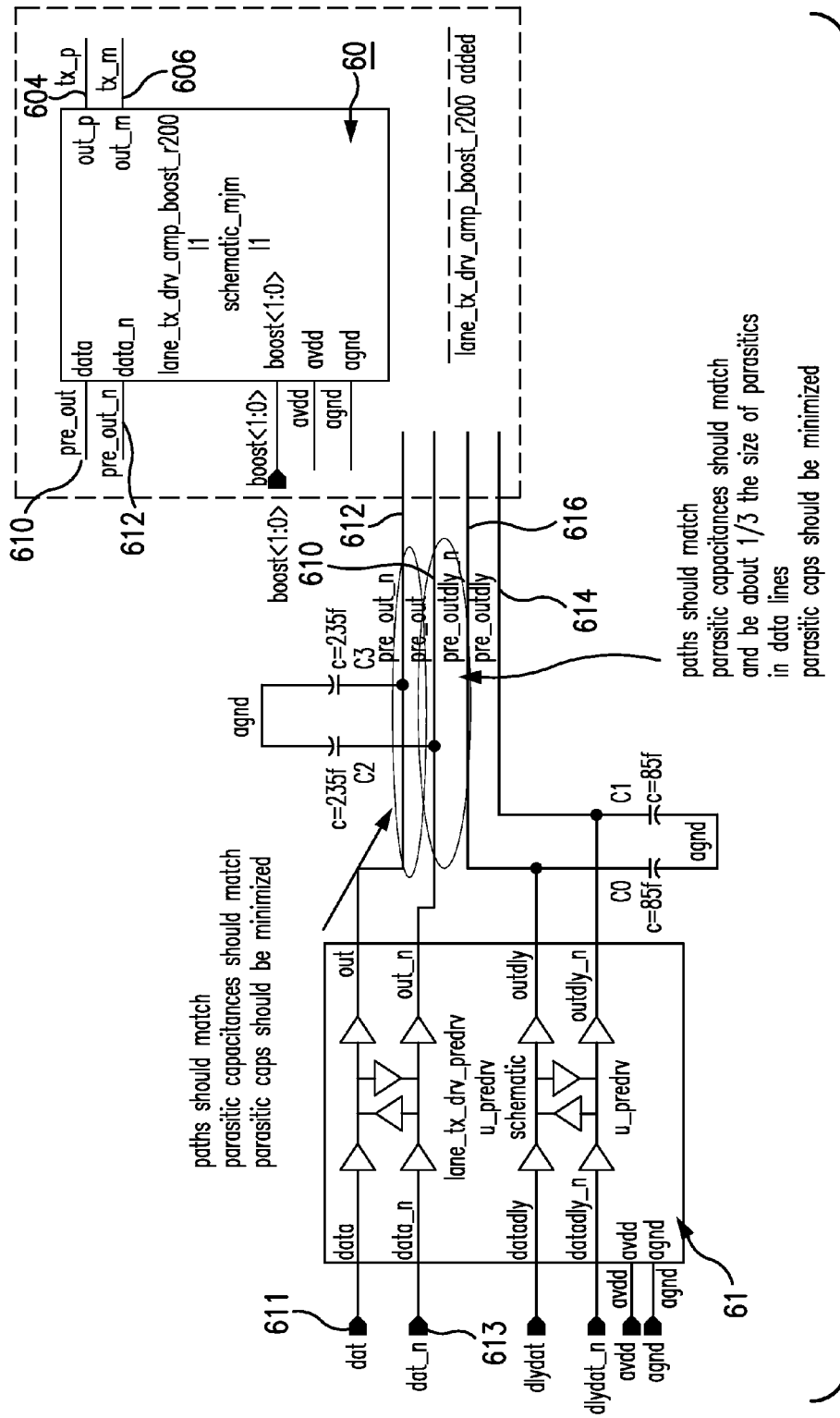
FIG. 8, collectively represented by views 8A and 8B, is a schematic diagram illustrating an exemplary implementation of certain driver unit portions of the embodiment shown in FIG. 3.
Figure 8B:
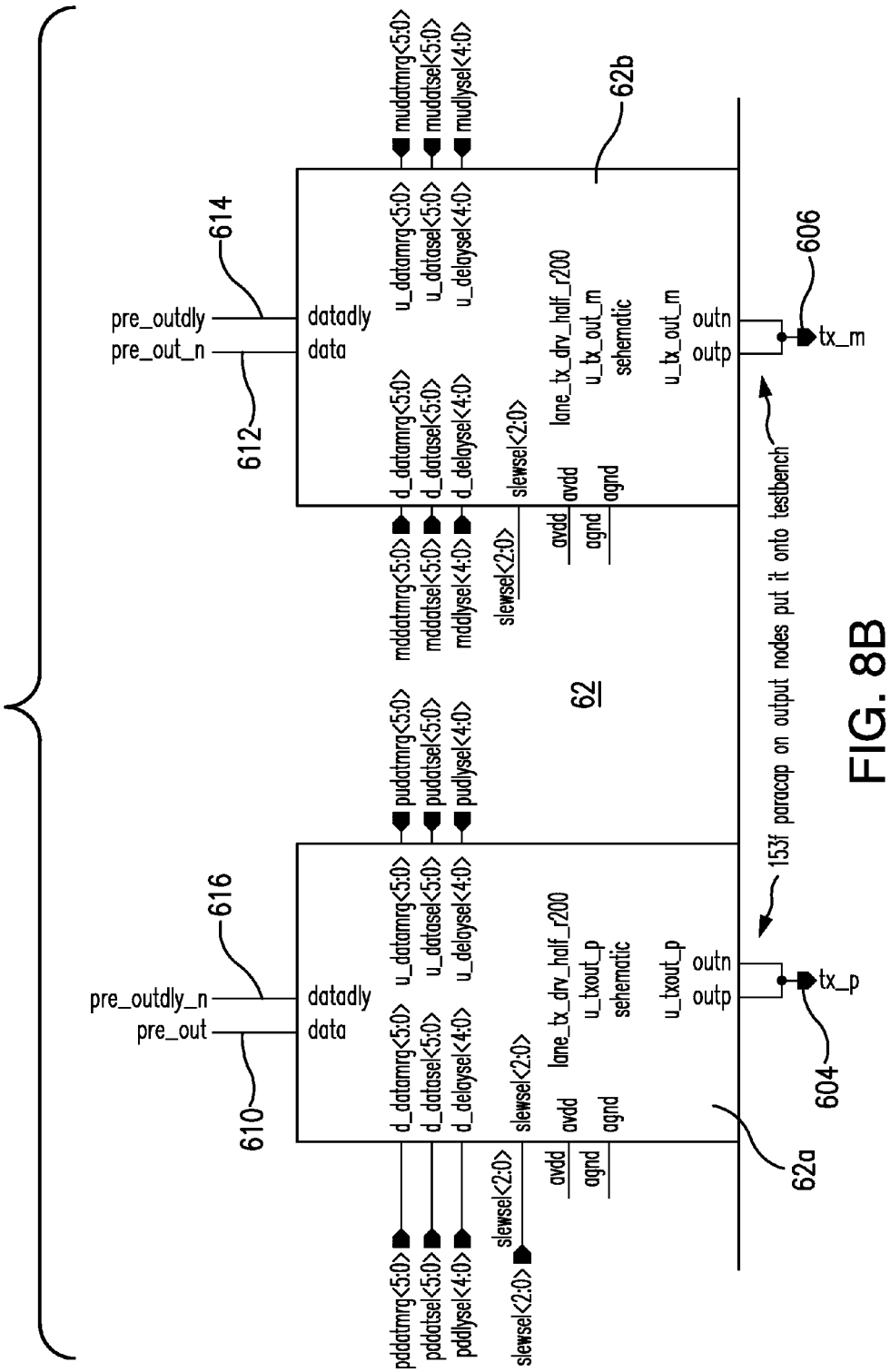
Figure 9A:
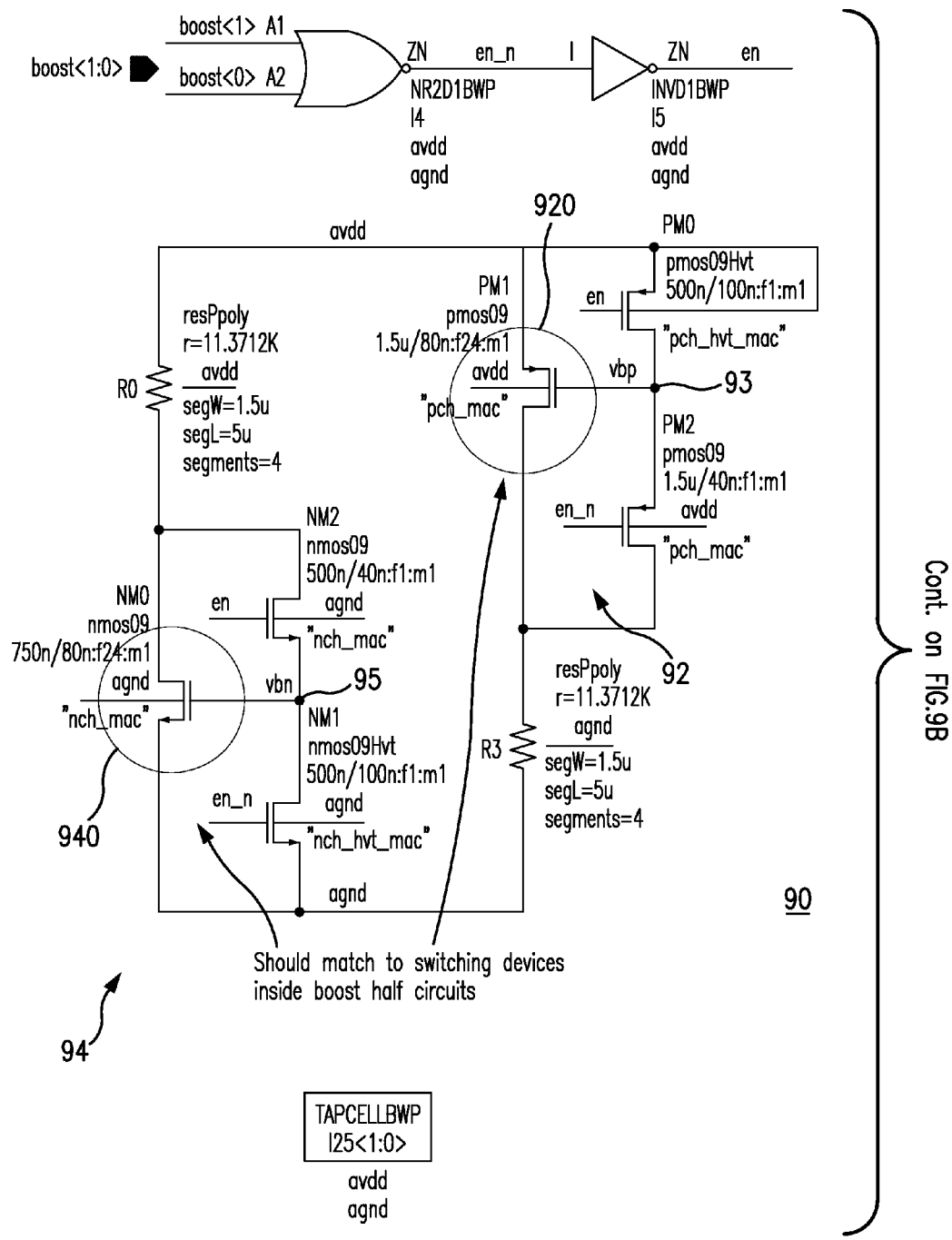
FIG. 9, collectively represented by views 9A and 9B, is a schematic diagram illustrating an exemplary implementation of certain voltage bias setting portions of the embodiment shown in FIG. 3.
Figure 9B:
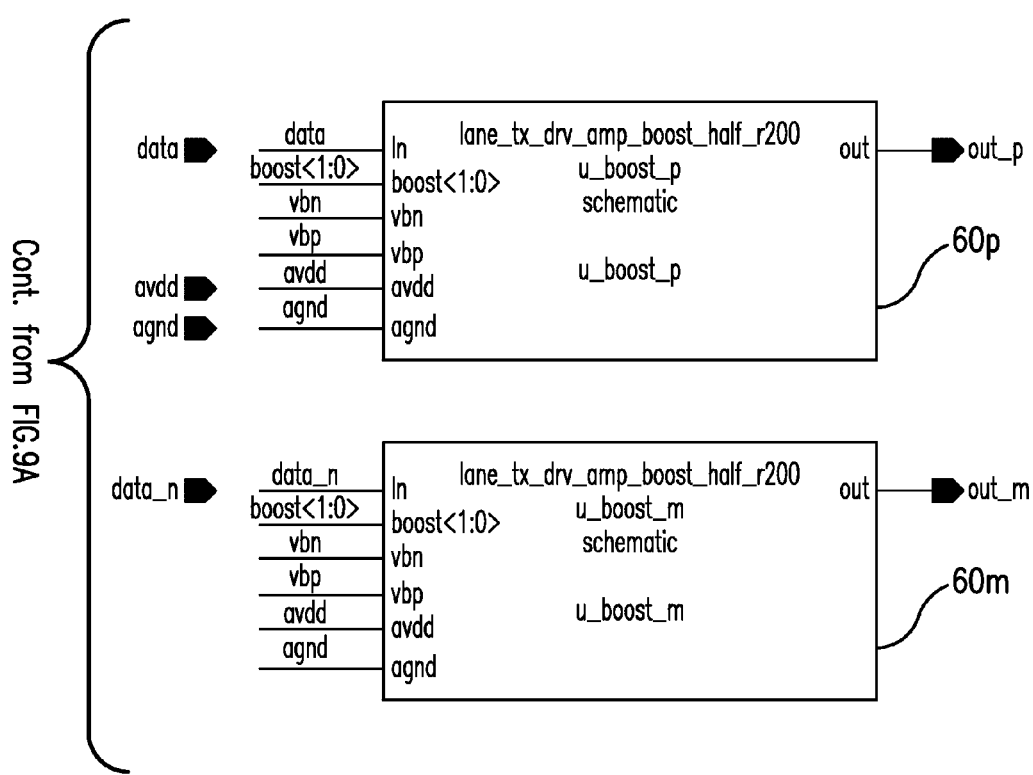

Turning to FIGS. 8-9, additional implementation details of a system employing the boosting subsystem 60 of FIG. 6A-6C are illustrated. FIG. 8 (collectively represented by views 8A and 8B) schematically illustrates among other things one example of a driver unit which in this embodiment includes a pre-driver circuit 61 and a H-bridge driver 62 formed collectively by half driver circuits 62a, 62b that generate respectively the plus and minus components of a differential drive signal. Preferably, the pre-driver circuit 61 serves to condition the incoming data signal by, for instance, providing duty cycle or other corrections, and imbuing sufficient drive strength to the signal to drive the considerable load of the H-bridge driver circuit 62. The pre-driver circuit 61 accordingly receives the input data and data_n signal components at input terminals 611, 613 and responsively generates the differential pre-drive signal components pre_out and pre_out_n on nodes 610, 612. The pre-driver circuit 61 also generates delayed versions of these pre-drive signals pre_outdly and pre_outdly_n on nodes 614, 616. The pre-drive signal components pre_out and pre_out_n are passed as inputs to the boosting unit 60 as well as to the respective half driver circuits 62a, 62b as shown.

Each of the H-bridge half driver circuits 62a, 62b then operates in suitable known manner to generate a drive signal component corresponding to its received pre-drive signal component pre_out, pre_out_n. The generated drive signal components are provided by the circuits 62a, 62b respectively on the plus and minus output nodes 604, 606—to which the boosting unit 60 applies boost. Each of the H-bridge half driver circuits 62a, 62b in this embodiment also uses the delayed pre-drive signal version pre_outdly_n, pre_outdly it receives to implement suitable de-emphasis measures.

FIG. 9 (collectively represented by views 9A and 9B) schematically illustrates one example of a circuit which may be employed to set the biasing voltage source levels vbp and vbn, which serve to set the steady state voltages applied at the complementary p- and n-channel switching devices (such as the devices 341p, 342p and 345m, 346m illustrated in FIG. 3) in each of the plus and minus sections 60p, 60m of the boosting subsystem 60. As shown, circuit 90 preferably includes positive and negative sections 92, 94 which respectively set the vbp and vbn bias voltage levels at nodes 93, 95. Preferably, the p-channel MOSFET device 920 and n-channel MOSFET device 940 incorporated in the circuit sections 92, 94 are selected to match the complementary switching devices employed in the boosting subsystem 60. Like FIG. 8, FIG. 9 merely illustrates but one example of numerous ways in which the disclosed system portions may be implemented to suit the particular requirements of the intended application.

Figure 10:
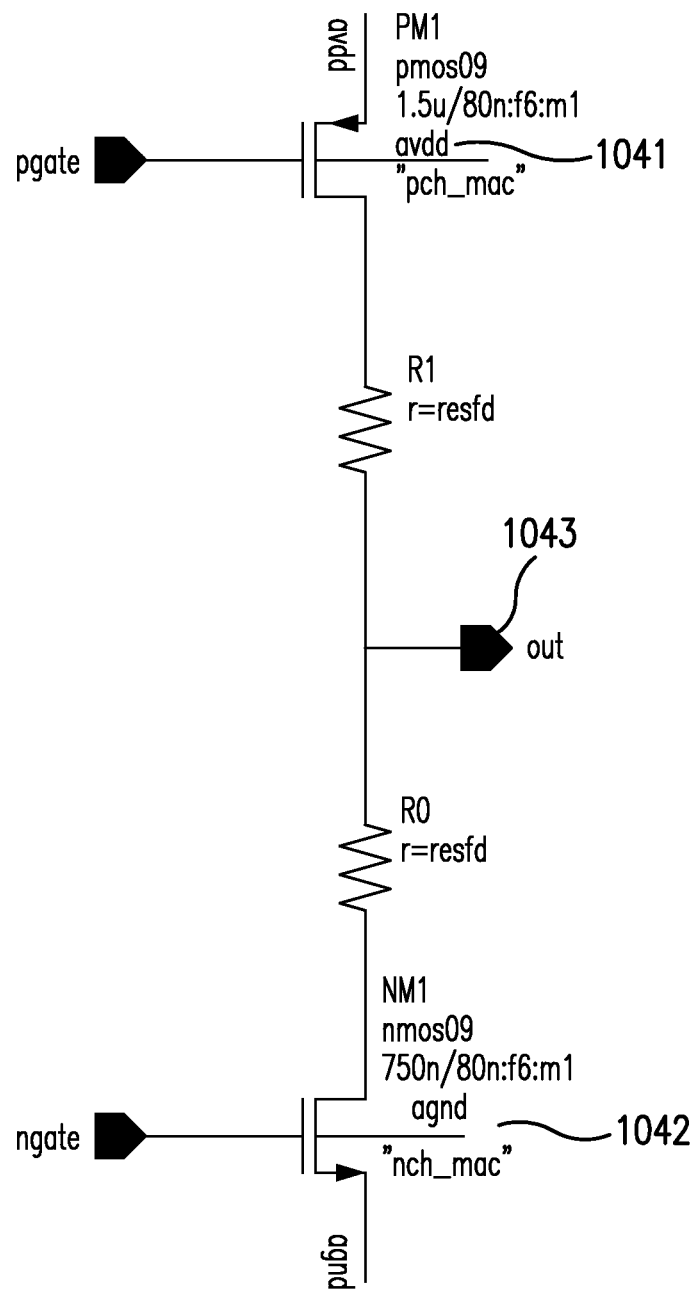
FIG. 10 is a schematic diagram illustrating a variation in implementation to incorporate electrostatic discharge (ESD) protection in certain portions of a boosting unit in the embodiment shown in FIG. 3.

Referring to FIG. 10, there is schematically shown an alternate embodiment of the complementary switching section of each boosting section 340p, 340m illustrated as FIG. 3. In this embodiment, electrostatic discharge (ESD) protection measures are incorporated by interposing parameterized resistance elements R1 and R0 respectively between the drain terminals of the devices 1041, 1042 and the drive signal output node 1043. Such resistances interposed in the positive and negative boosting stages tend to diminish the degree of boost, the ESD resistance values generally being inversely correlated to boosting performance. Still, the benefits afforded by such protection may overcome this design tradeoff in certain instances. Typical effects of such boosting unit resistances are demonstrated in the illustrative test bench simulation results described in following paragraphs. The boosting unit resistance values R1, R0—when employed—may be set to any suitable value depending on the requirements of the intended application, but they are preferably set in optimal combination with other operational parameters like the selected level of boost, the degree of digital de-emphasis applied, and the like.

Figure 11:
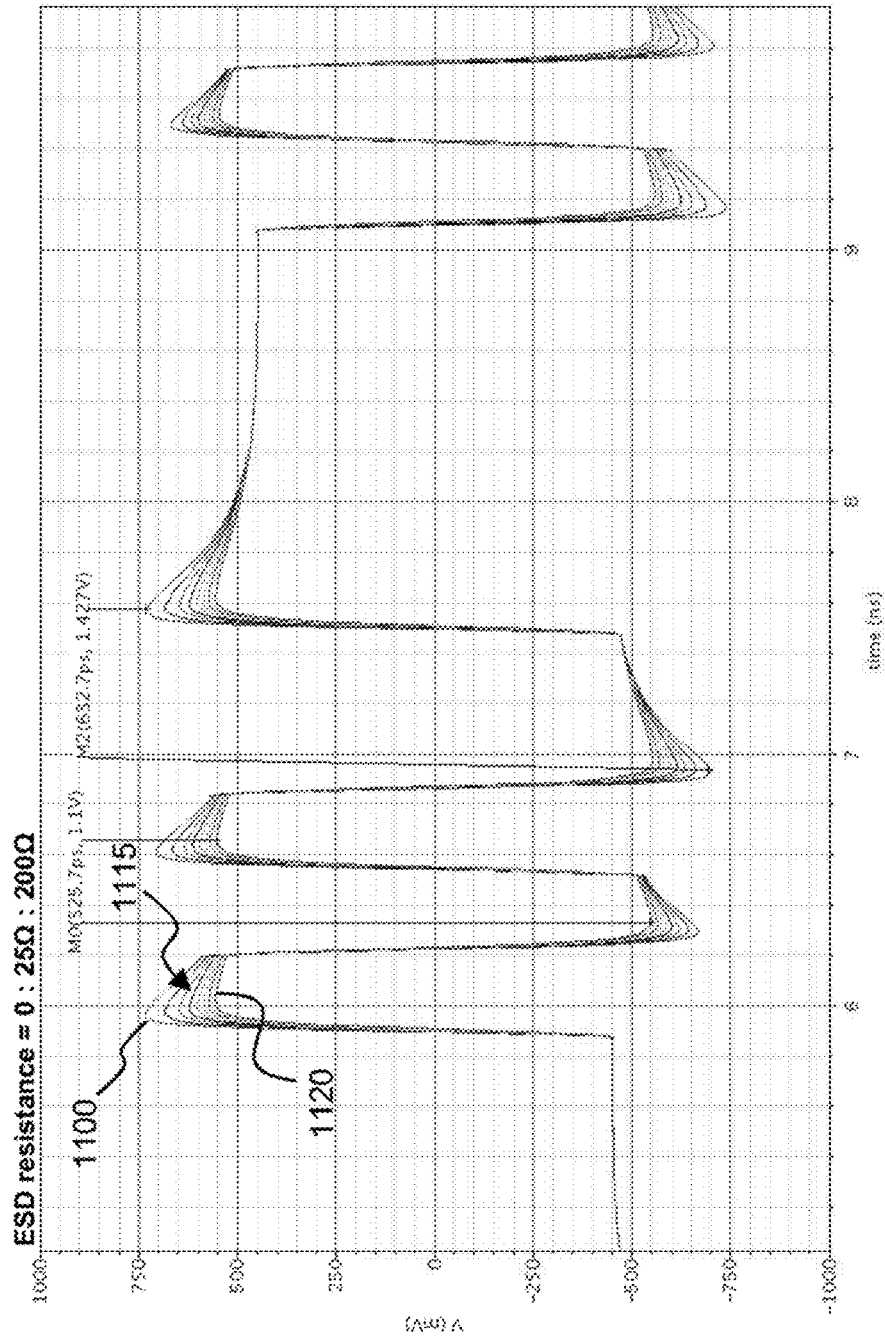
FIG. 11 is a diagram illustrating waveforms for a boosted drive signal generated by the embodiment of FIGS. 6A-6C and 10, illustrating the effects of different boosting unit ESD protection levels.

FIG. 11 is a timing diagram of simulated drive signal waveforms (similar to those illustrated in FIG. 7) selectively boosted in the manner described in the preceding paragraphs, under a sample set of operating conditions. The multiple waveforms shown represent the boosted drive signal generated by simulation at a near end measurement point MP1 for simulation sweeps taken with different values of the parameterized resistances R1, R0 shown in FIG. 10, but otherwise under identical operating conditions. As the waveforms are generated by the cooperative effect of boosting sections in multiple boosting unit stages, the simulation sweeps reflect system operation with effective resistances of the enabled boosting stages incrementally set from 0.1Ω to 200Ω. Waveform 1100 illustrates the case where virtually no boosting unit ESD protection is employed, or where virtually no parameterized resistance is incorporated in the boosting units' complementary switching sections (total effective resistance=0.01Ω). The intervening waveforms 1115 down to the final waveform 1120 successively represent the cases where the effective boosting unit resistance value is incrementally set from a value just above 0.1Ω to a value of 200Ω. As shown, the effect of increasing the boosting units' ESD resistance values in the first instance is to diminish the boost imparted to the drive signal by the boosting units. Care must be taken, therefore, when incorporating such ESD protection measures into a boosted drive system disclosed herein.

Simulation Test Case Results

Figure 12A:
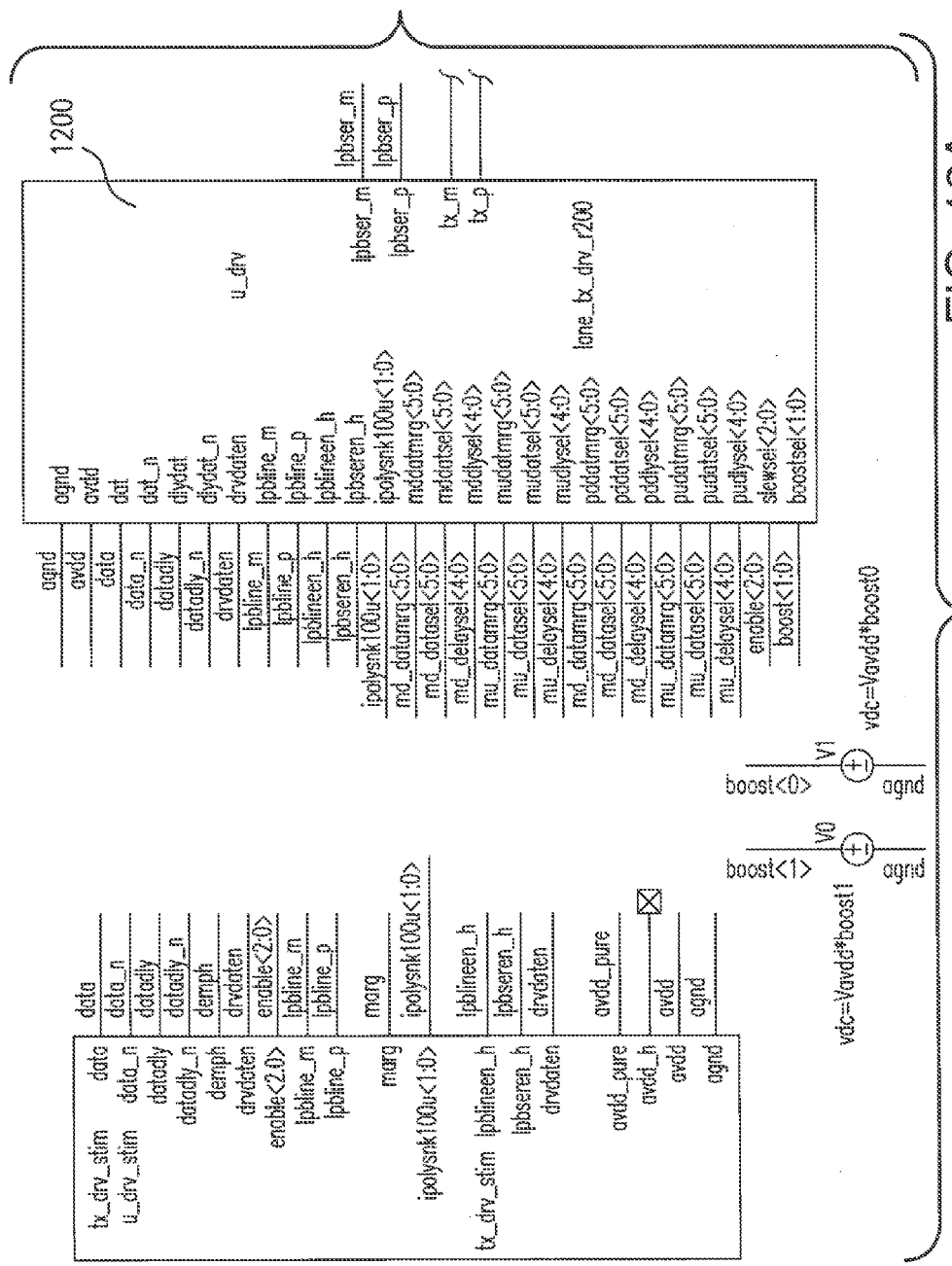
FIG. 12, collectively represented by views 12A, 12B, and 12C, is a schematic diagram illustrating an exemplary implementation of a simulation test bench incorporating a system formed in accordance with the embodiment shown in FIGS. 6A-10, with models for certain physical sources of drive signal attenuation up to a near end measurement point of FIG. 1.
Figure 12B:
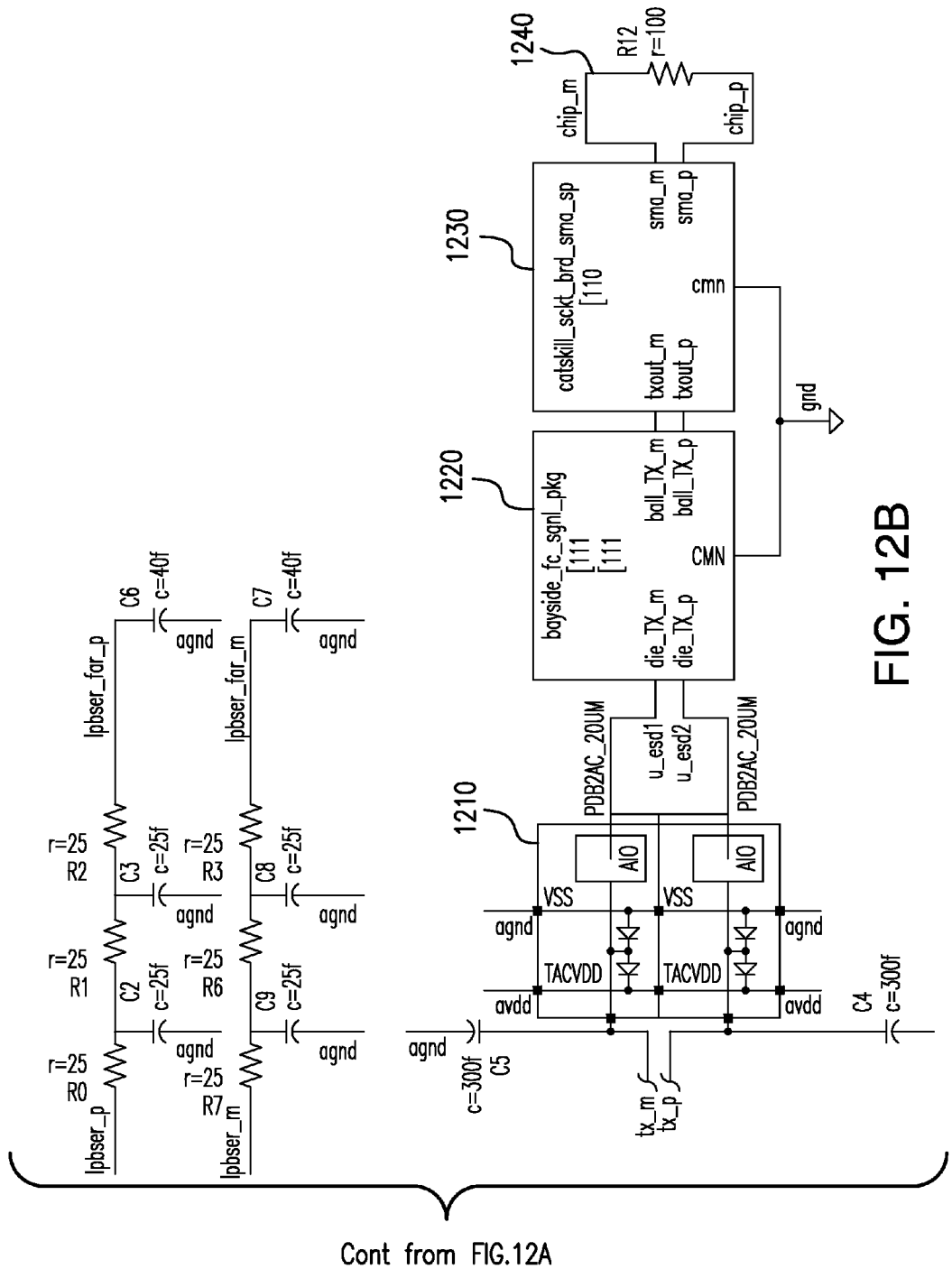
Figure 12C:
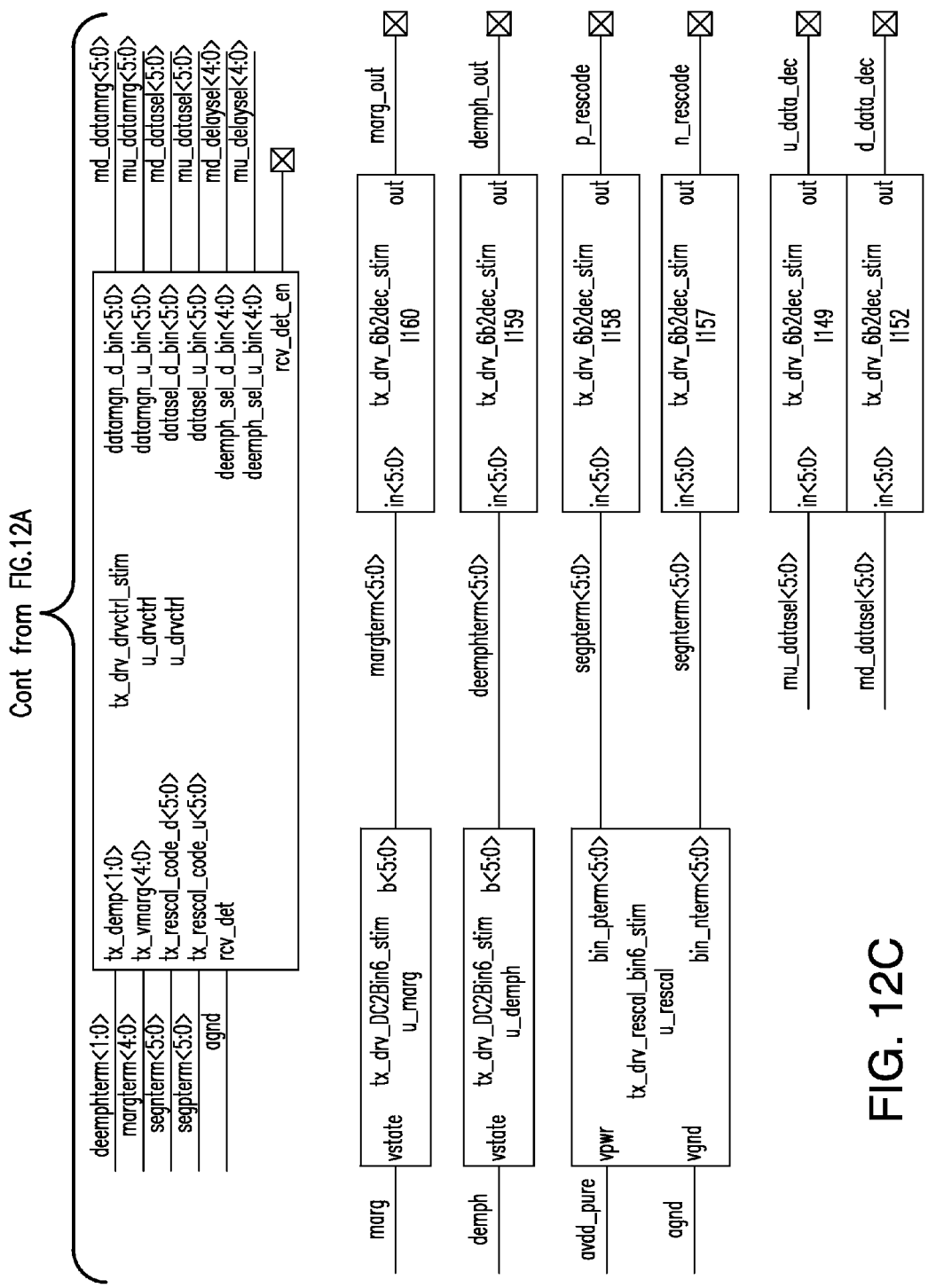

Various simulation runs made on the system embodiment reflected in FIGS. 6-10 not only confirm the need and efficacy of the programmable drive signal boost imparted to a selected portion of a drive signal as disclosed herein, they also reveal requisite combinations of parametric setting for optimal configuration of the system. FIG. 12 (collectively represented by views 12A, 12B, and 12C) schematically illustrates a simulation test bench configuration that includes a system 1200 incorporating the embodiment of the present invention reflected in FIGS. 6-10. With reference to FIG. 1, system 1200 represents the chip level implementation 2 of a boost driver system as disclosed herein. Serially connected to system chip 1200 are ESD protection diodes 1210, followed by a circuit model for the chip's package 1220 and a separate circuit model 1230 for the short traces of the test board (on which the packaged chip would be mounted). The test arrangement is terminated at 1240 by a preselected resistance R12, which is set in the example shown at 100 Ω.

Each of the serially connected models may be of any suitable type known in the art appropriate for the requirements of the intended application. These models 1210, 1220, 1230 are configured to model the attenuating and discontinuity effects encountered by a drive signal and generated at the chip level 2 in FIG. 1, as it transmits through the intervening structures 4, 6, 8a before reaching the near end measurement point MP1. The variables and parameters shown in the simulation test bench arrangement of FIG. 12 are illustratively defined in Table A.

TABLE A

| Variable | Comment |
| --- | --- |
| Vavdd_h | High voltage 1.8 V typ. 1.35 V min, 1.9 V max |
| amp | amplitude of the CML loopback input 300 m typ. 200 m min |
| demph | de-emphasis control 0 no de-emphasis 3 max de-emphasis |
| drvdaten | enable input for controllable inverters that ship data to H-Bridge |
| en0, en1, en2 | slew rate control enable (en0, en1, en2) (1, 0, 0) SGMII (0, 1, 0) XAUI, PCIe, (0, 0, 1) QSGMII, (1, 1, 1) 10G |
| lpblineen | enable input for cml2cmos input loopback buffer also controls the select input of lpbmux (circuit) |
| lpbseren | enable input for loopback output buffer |
| marg | margining input control 0 no margining (max amplitude) as marg increases (1, 2, 3 . . . ) amplitude value at the output decreases. |
| rcvdet | enable input for rcvdetect. if rcvdet = 1 driver goes into receiver detect mode |
| td | delay time for the delayed data 97p for 10G, 200p for QSGMII, 320p for XAUI, 400p for PCIe and SGMII |
| Ts_rcv | period of the loopback data |
| Ts | period of the transmitted data |
| tt | rise and fall time of the input data |
| Vavdd | voltage supply for the circuit 900 mV nominal, 810 mV min, 1.1 V max |
| vbgmult | bandgap variation for poly current current generation +/− 50 m (5%) |

Figure 13:
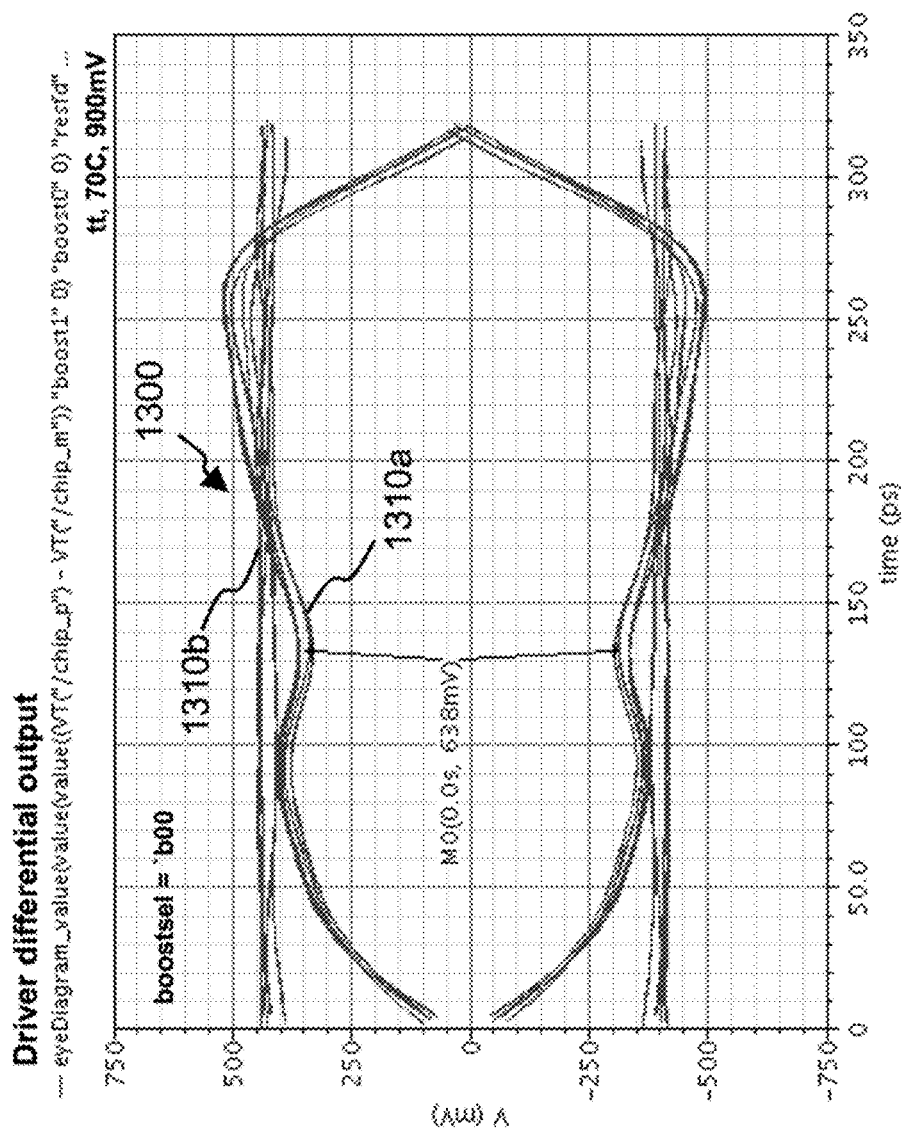
FIG. 13 is the schematic diagram illustrating an eye diagram obtained by simulation of the simulation test bench implementation of FIG. 12, for the drive signal transmitted without boost and with virtually no boosting unit ESD protection resistance across an interconnection interface, taken at a near end measurement point.

FIG. 13 illustrates as a baseline the eye diagram 1300 for the drive signal resulting at the near end measurement point MP1 when simulation is carried out on the test bench arrangement of FIG. 12, with the boost function turned off (boostsel='b00), and with virtually no ESD protection resistance incorporated in the boosting unit. Clearly, the attenuation sources encountered by the drive signal leads to diminished peak-to-peak amplitude for the higher frequency content 1310a of the data shown in the diagram, an effect not exhibited by the lower frequency content of the data 1310b. Despite a supply voltage of 900 mV in this example, the peak-to-peak voltage dips to a minimum within the eye of 638 mV. This is well below the 800 mV XAUI requirement for a differential drive signal at near end point MP1.

Simulation runs may then be carried out to obtain the optimum combination of boost level and boosting unit ESD protection for the given operating conditions. Sample results of such simulation runs are illustrated in FIGS. 14A-16C. As noted in preceding paragraphs, the eye opening (at the near end in FIGS. 14A-16C) tends to be increased by raising the level of boost collectively provided by the boosting units, and the boosting units' boosting performance is inversely correlated to the level of ESD protection resistances interposed in those boosting units. This is exhibited with general consistency in those portions of the eye diagrams representing the higher frequency content of the illustrated signals in FIGS. 14A-16C. This is not necessarily the case in those eye diagram portions representing the lower frequency components.

Figure 14A:
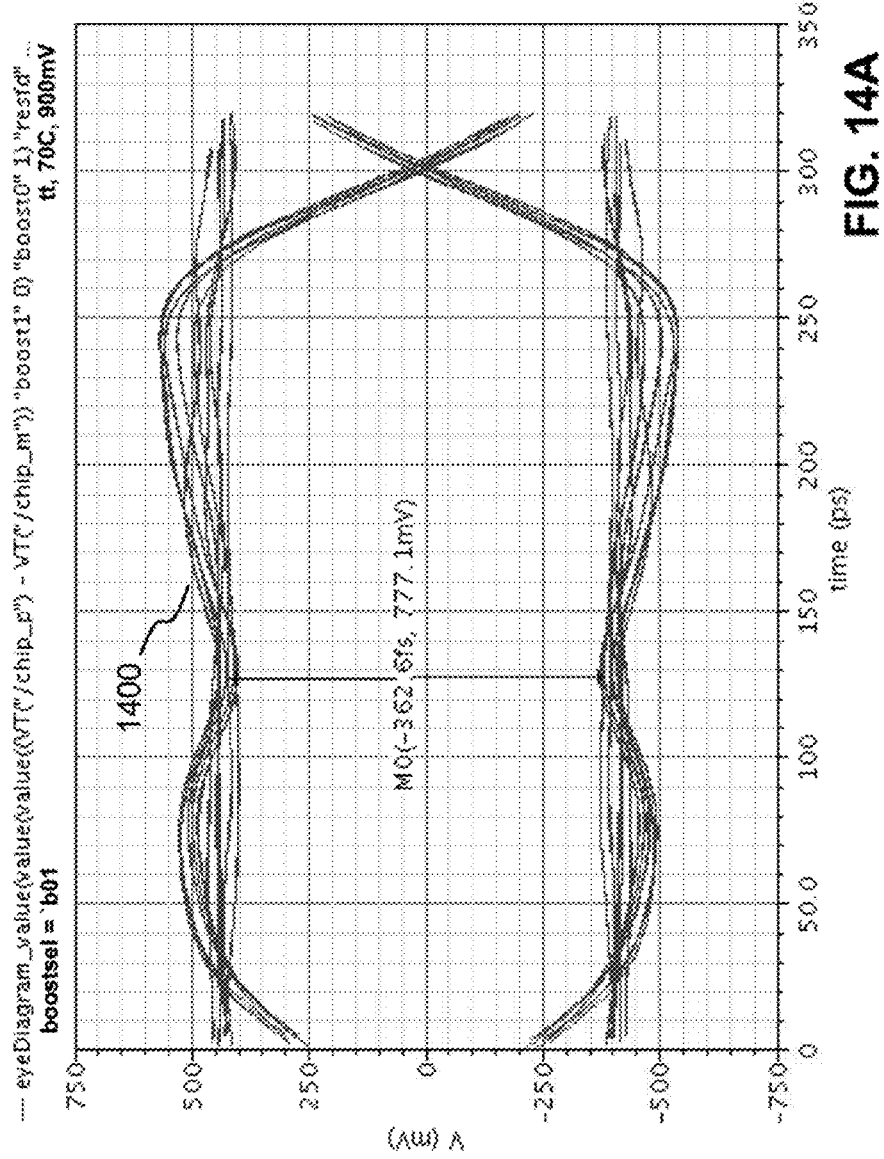
FIG. 14A is the schematic diagram illustrating an eye diagram obtained by simulation of the simulation test bench implementation of FIG. 12, for the drive signal transmitted with a first level of boost but virtually no boosting unit ESD protection resistance across an interconnection interface, taken at a near end measurement point.
Figure 14B:
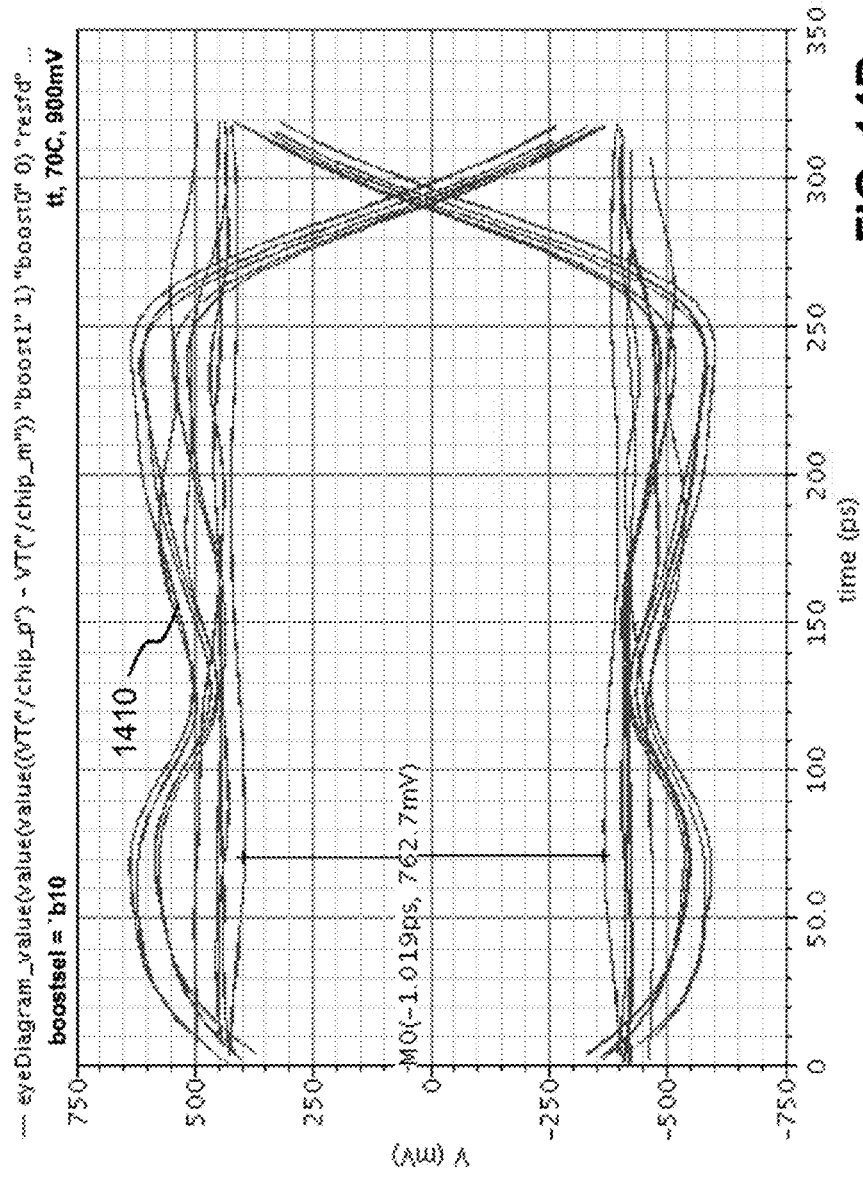
FIG. 14B is the schematic diagram illustrating an eye diagram obtained by simulation of the simulation test bench implementation of FIG. 12, for the drive signal transmitted with a second level of boost but virtually no boosting unit ESD protection resistance across an interconnection interface, taken at a near end measurement point.
Figure 14C:
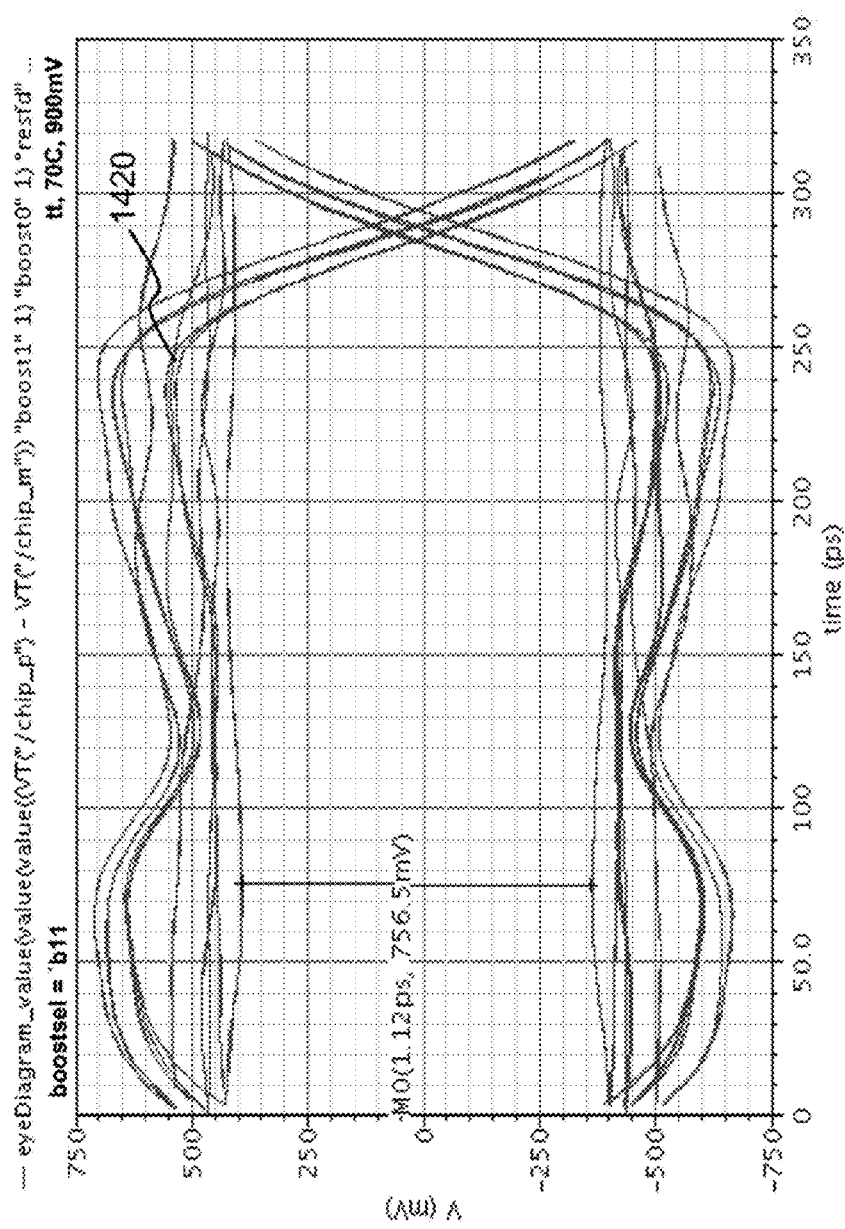
FIG. 14C is the schematic diagram illustrating an eye diagram obtained by simulation of the simulation test bench implementation of FIG. 12, for the drive signal transmitted with a third level of boost but virtually no boosting unit ESD protection resistance across an interconnection interface, taken at a near end measurement point.

For instance, FIGS. 14A-14C illustrate further eye diagrams of the drive signal resulting from the same simulation at the near point MP1, still with virtually no ESD protection resistance added in the boosting unit, but with the boosting function selectively set at the different boost settings—where one, two, or all of the three available boosting units 64-66 is/are enabled (boostsel='b01, boostsel='b10, and boostsel='b11). With the first level boost selected, the drive signal eye diagram 1400 is opened (from that shown in FIG. 13) to exhibit a greater peak-to-peak voltage minimum of 777.1 mV. Raising the boost one level actually degrades the peak-to-peak minimum seen in the resulting drive signal eye pattern 1410 to a voltage of 762.7 mV. Further raising the boost by another level produces the drive signal eye pattern 1420 which exhibits more degradation of the peak-to-peak minimum, to a voltage of 756.5 mV.

Figure 15A:
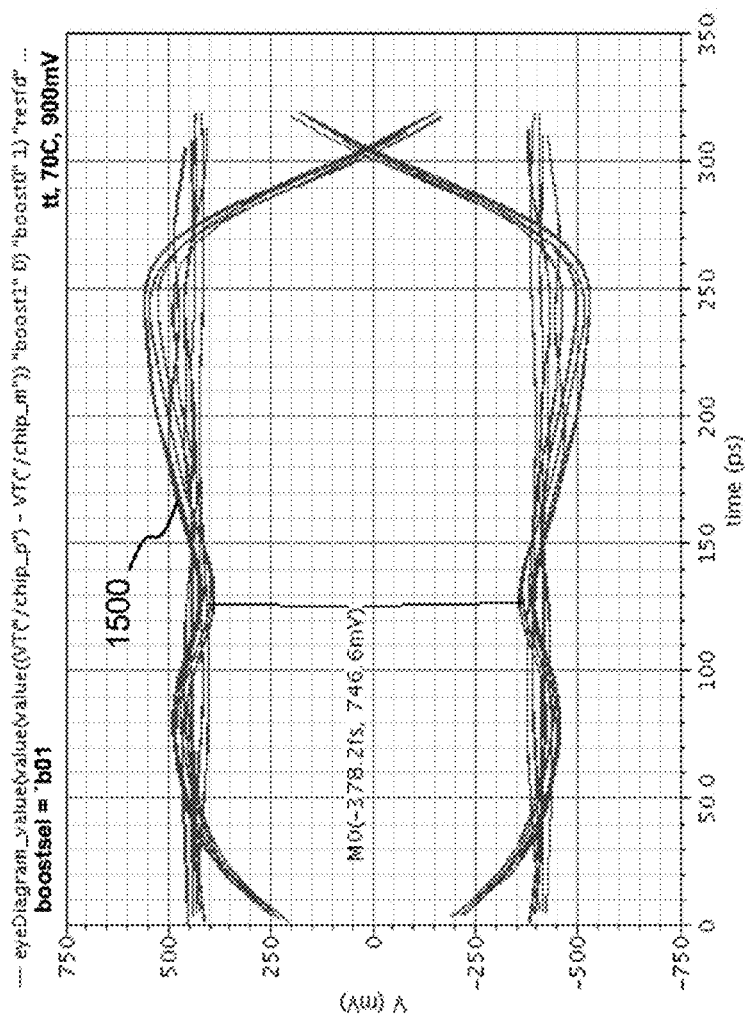
FIG. 15A is the schematic diagram illustrating an eye diagram obtained by simulation of the simulation test bench implementation of FIG. 12, for the drive signal transmitted with a first level of boost and a first predetermined boosting unit ESD protection resistance across an interconnection interface, taken at a near end measurement point.
Figure 15B:
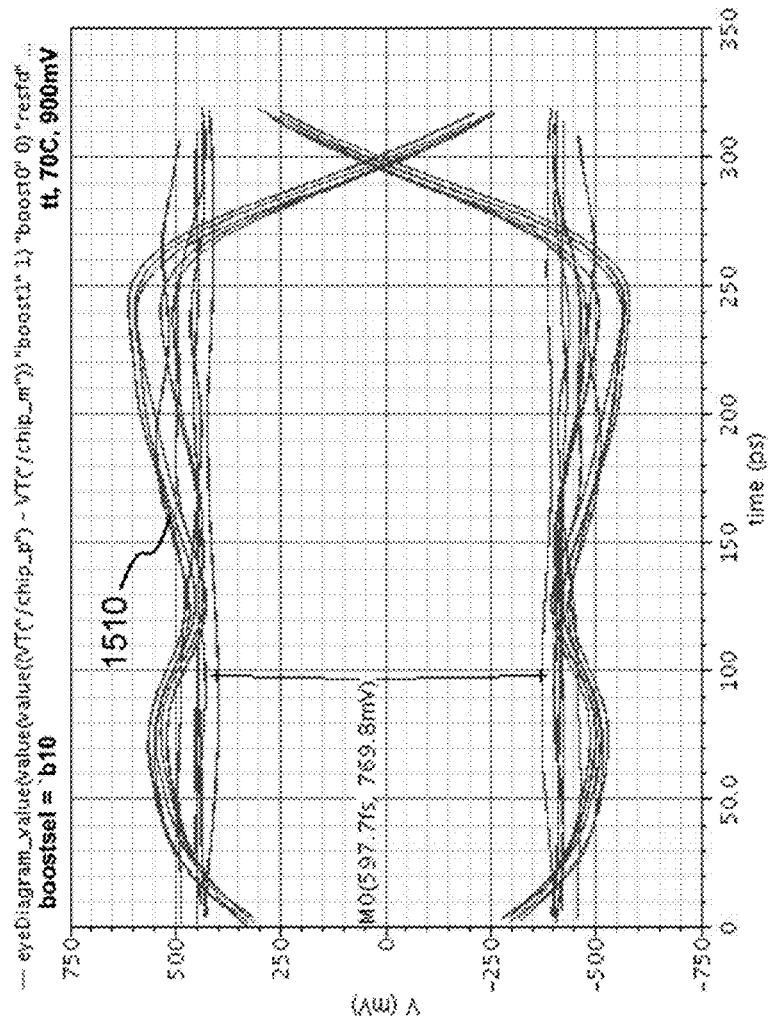
FIG. 15B is the schematic diagram illustrating an eye diagram obtained by simulation of the simulation test bench implementation of FIG. 12, for the drive signal transmitted with a second level of boost and a first predetermined boosting unit ESD protection resistance across an interconnection interface, taken at a near end measurement point.
Figure 15C:
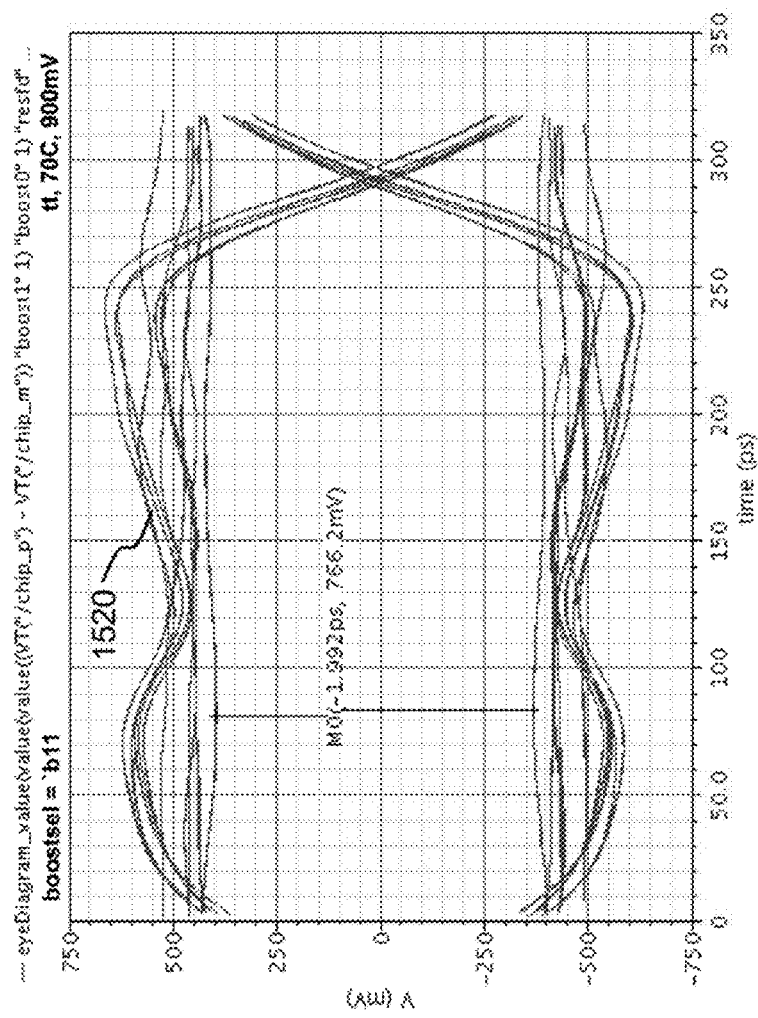
FIG. 15C is the schematic diagram illustrating an eye diagram obtained by simulation of the simulation test bench implementation of FIG. 12, for the drive signal transmitted with a third level of boost and a first predetermined boosting unit ESD protection resistance across an interconnection interface, taken at a near end measurement point.

FIGS. 15A-15C illustrate additional eye diagrams of the drive signal resulting from the same simulation at the near point MP1, with the boosting function again selectively set at the different boost level/states 'b01, 'b10, 'b11, but with 50Ω ESD protection resistance incorporated in the boosting units. With the first level boost selected, the drive signal eye pattern 1500 exhibits a peak-to-peak voltage minimum of 746.1 mV. Raising the boost one level in this case actually improves the peak-to-peak minimum seen in the resulting drive signal eye pattern 1510 to a voltage of 769.8 mV. Further raising the boost by another level produces the drive signal eye pattern 1520 which exhibits a slightly less peak-to-peak minimum voltage of 766.2 mV.

Figure 16A:
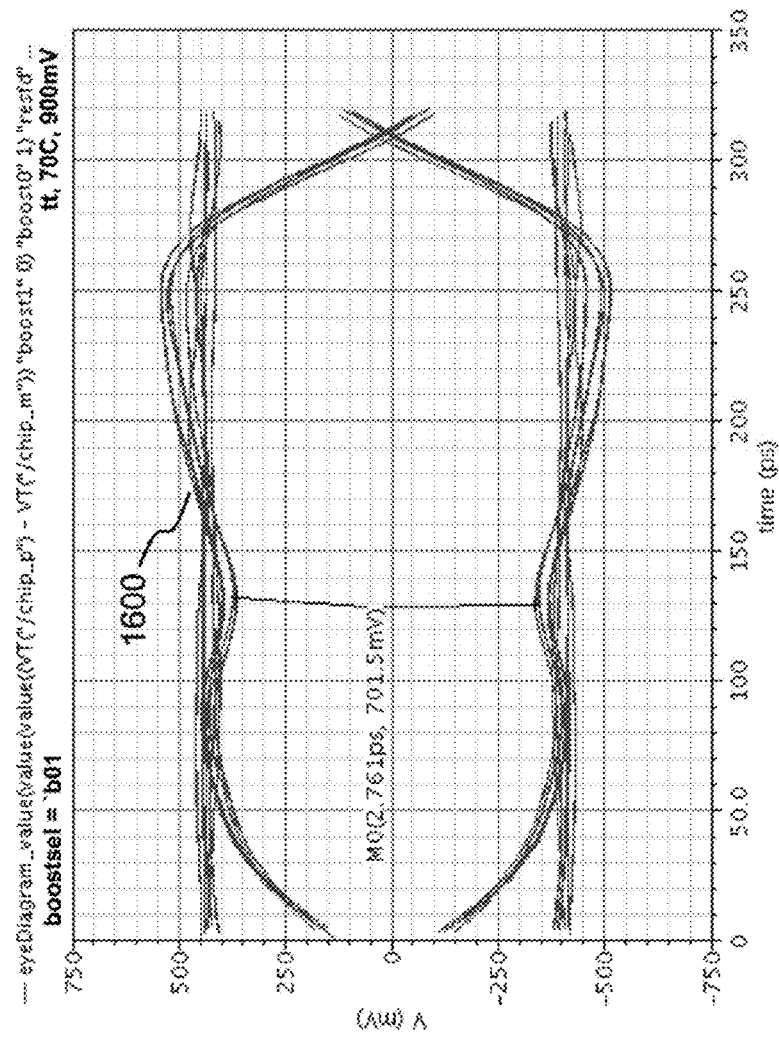
FIG. 16A is the schematic diagram illustrating an eye diagram obtained by simulation of the simulation test bench implementation of FIG. 12, for the drive signal transmitted with a first level of boost and a second predetermined boosting unit ESD protection resistance across an interconnection interface, taken at a near end measurement point.
Figure 16B:
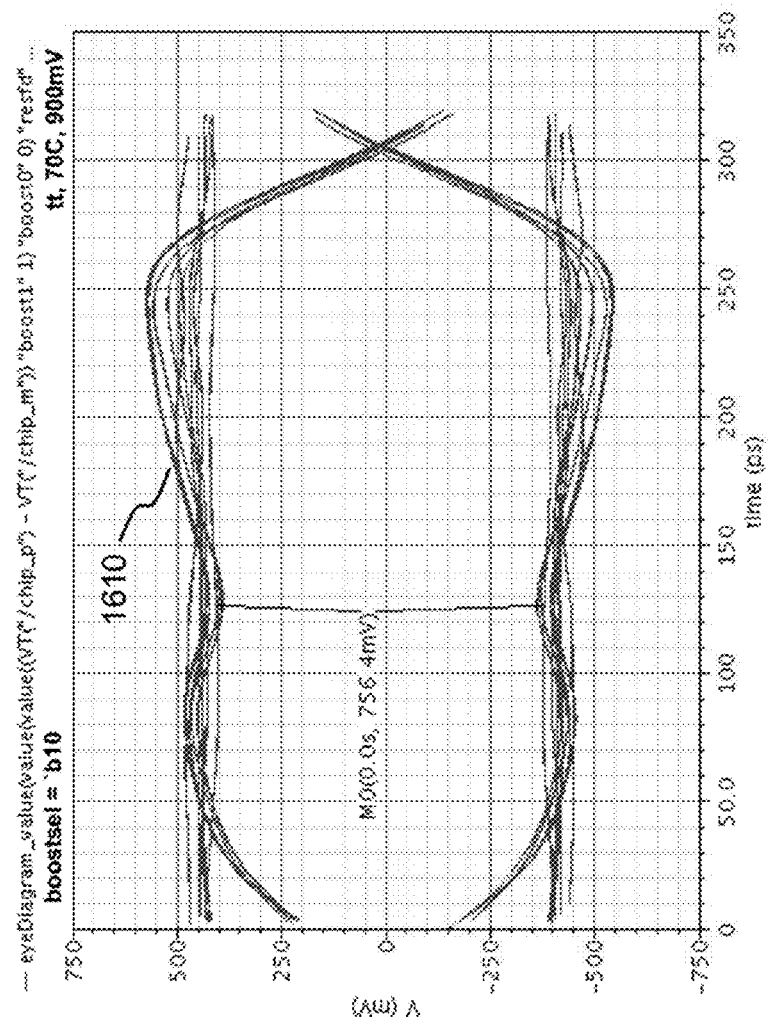
FIG. 16B is the schematic diagram illustrating an eye diagram obtained by simulation of the simulation test bench implementation of FIG. 12, for the drive signal transmitted with a second level of boost and a second predetermined boosting unit ESD protection resistance across an interconnection interface, taken at a near end measurement point.
Figure 16C:
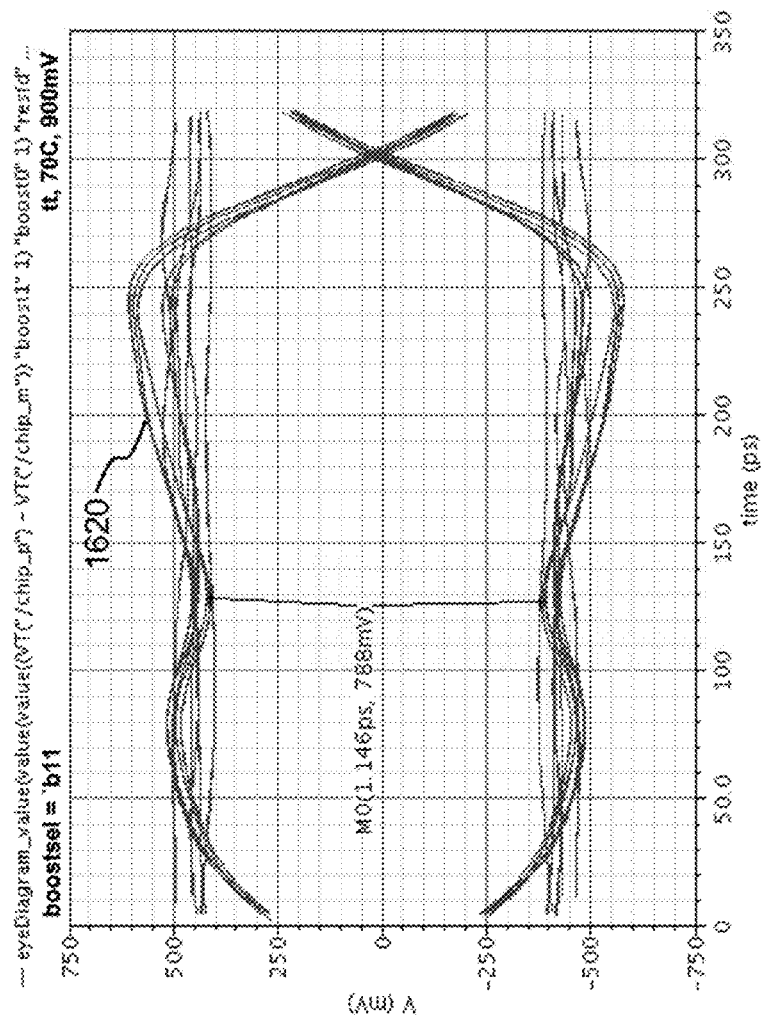
FIG. 16C is the schematic diagram illustrating an eye diagram obtained by simulation of the simulation test bench implementation of FIG. 12, for the drive signal transmitted with a third level of boost and a second predetermined boosting unit ESD protection resistance across an interconnection interface, taken at a near end measurement point.

FIGS. 16A-16C illustrate still more eye diagrams of the drive signal resulting from the same simulation at the near point MP1, with the boosting function again selectively set at the different boost level/states 'b01, 'b10, 'b11, but now with 200Ω ESD protection resistance incorporated in the boosting units. At the first level boost, the drive signal eye pattern 1600 exhibits a peak-to-peak voltage minimum of 701.1 mV. Raising the boost one level in this case actually improves the peak-to-peak minimum seen in the resulting drive signal eye pattern 1610 to a voltage of 756.4 mV. Further raising the boost by another level produces the drive signal eye pattern 1620 which exhibits a slightly less peak-to-peak minimum voltage of 788 mV.

Figure 17A:
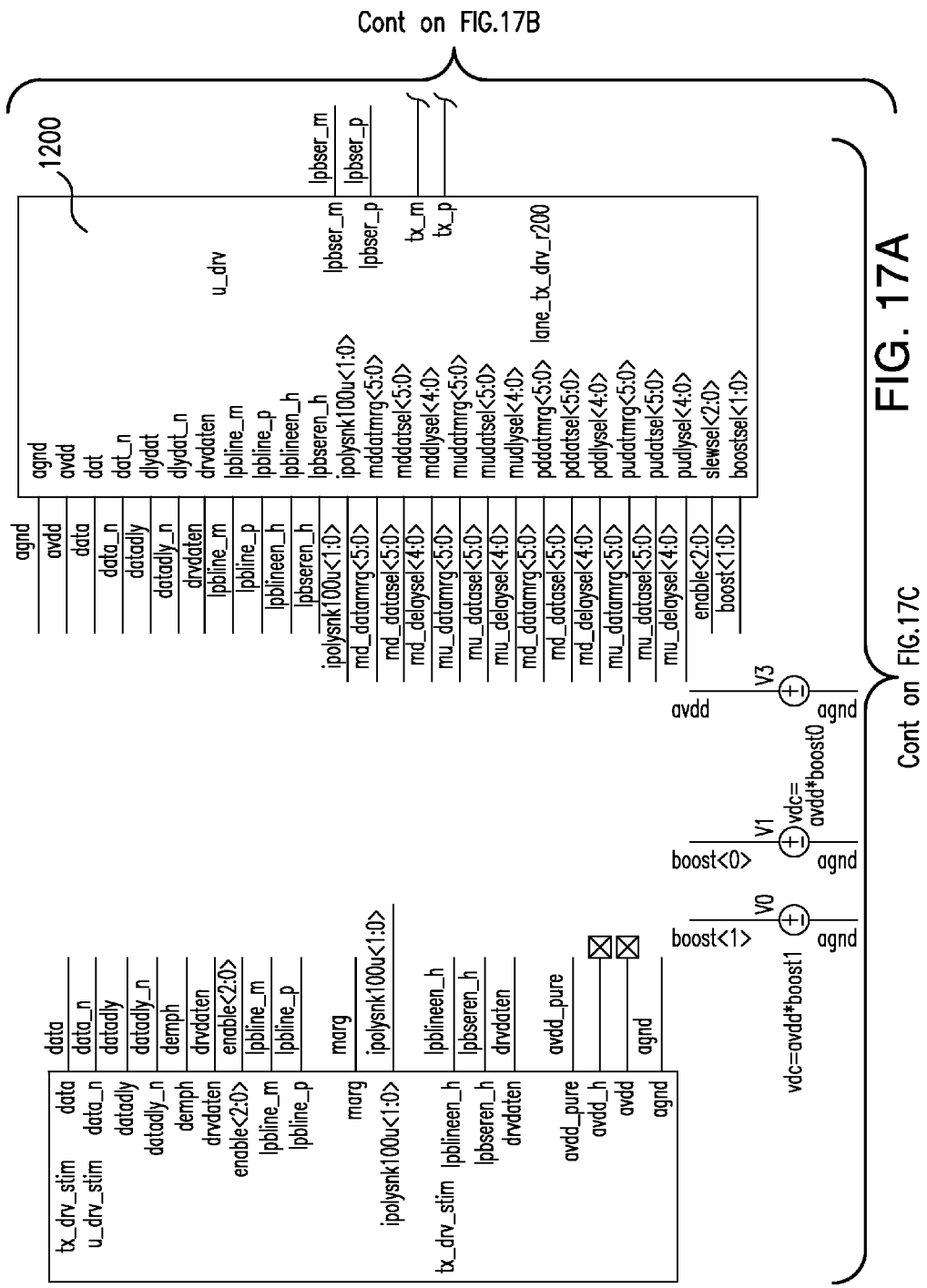
FIG. 17, collectively represented by views 17A, 17B, and 17C, is a schematic diagram illustrating an exemplary implementation of a simulation test bench incorporating a system formed in accordance with the embodiment shown in FIGS. 6A-10, with models for certain physical sources of drive signal attenuation up to a far end measurement point of FIG. 1.
Figure 17B:
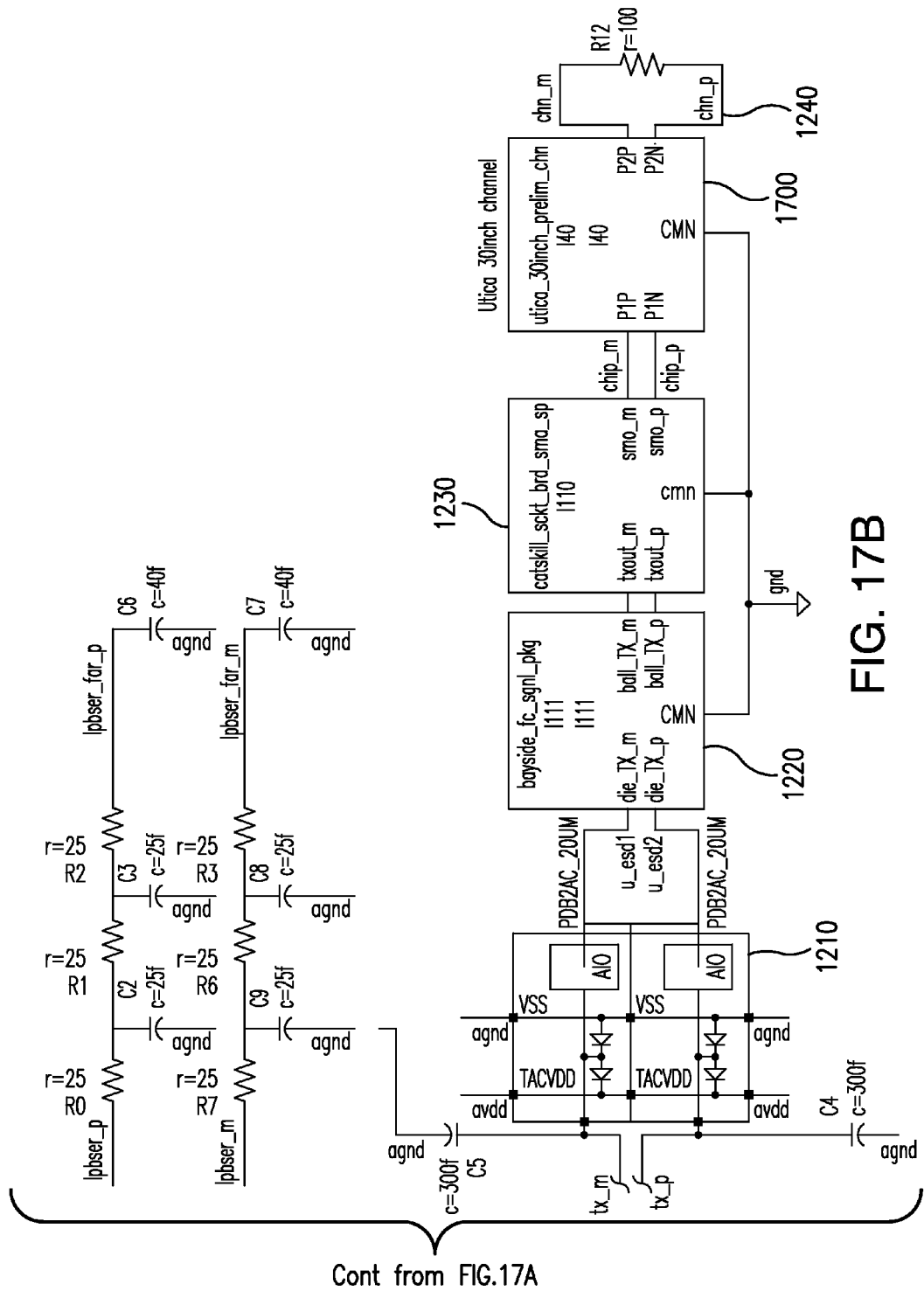
Figure 17C:
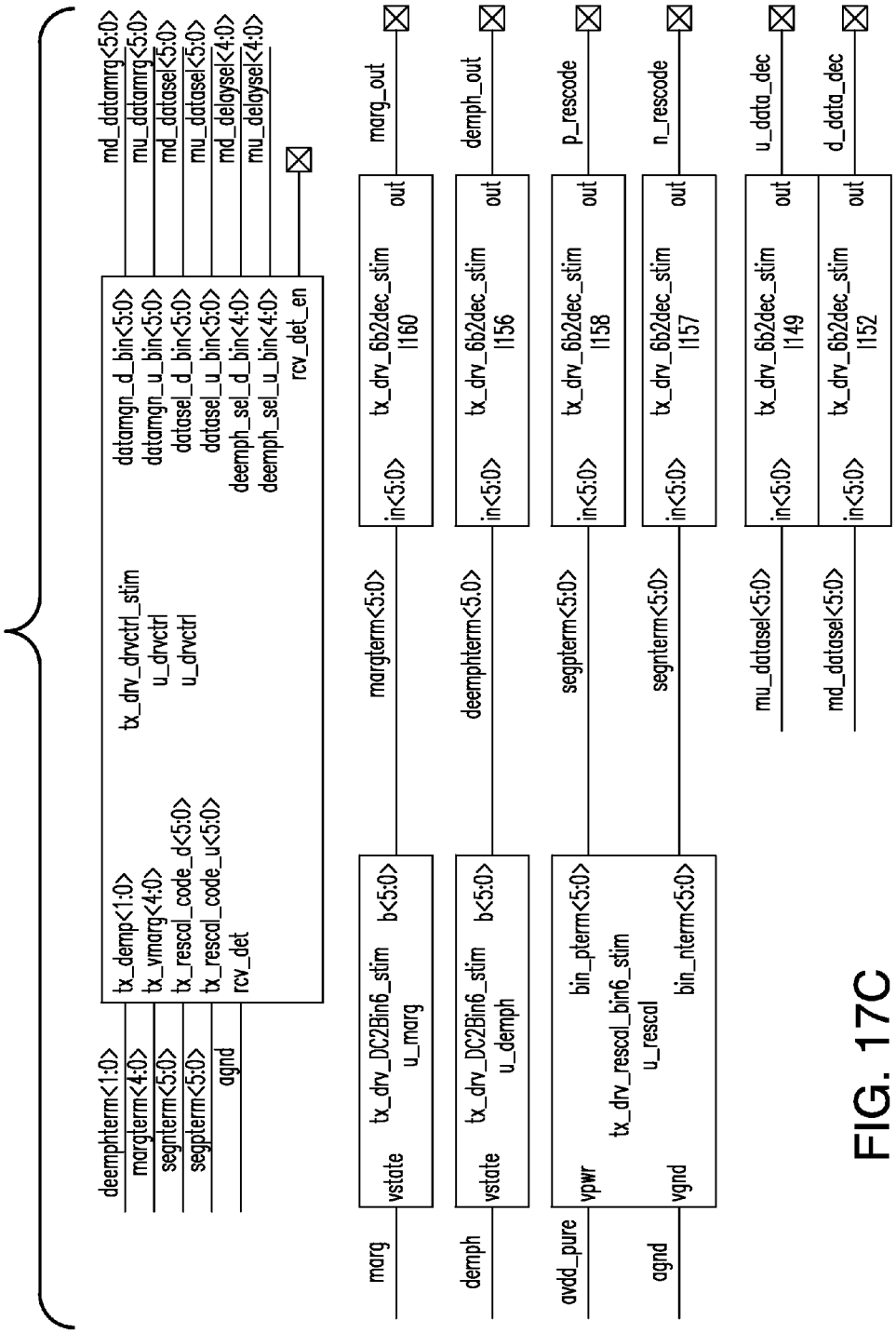

FIG. 17 (collectively represented by views 17A, 17B, and 17C) schematically illustrates an alternate simulation test bench configuration much like that of FIG. 12, but for testing the boosted drive signal as it would appear at the far end measurement point MP2 of FIG. 1. As in the first configuration, a system circuit 1200 incorporating the embodiment reflected in FIGS. 6-10 is coupled to the ESD protection diode 1210, followed by the chip package model 1220 and model 1230 for its host test board. The test arrangement is terminated as before at 1240 by the preselected resistance R12, which is again set at 100Ω Added to the models in this test bench setup is an additional model 1700 for the test channel 10 (of FIG. 1), which is the most significant source of attenuation between the near and far ends. The signals and parameters shown in this alternate simulation test bench arrangement are illustratively defined also in Table A.

Figure 18A:
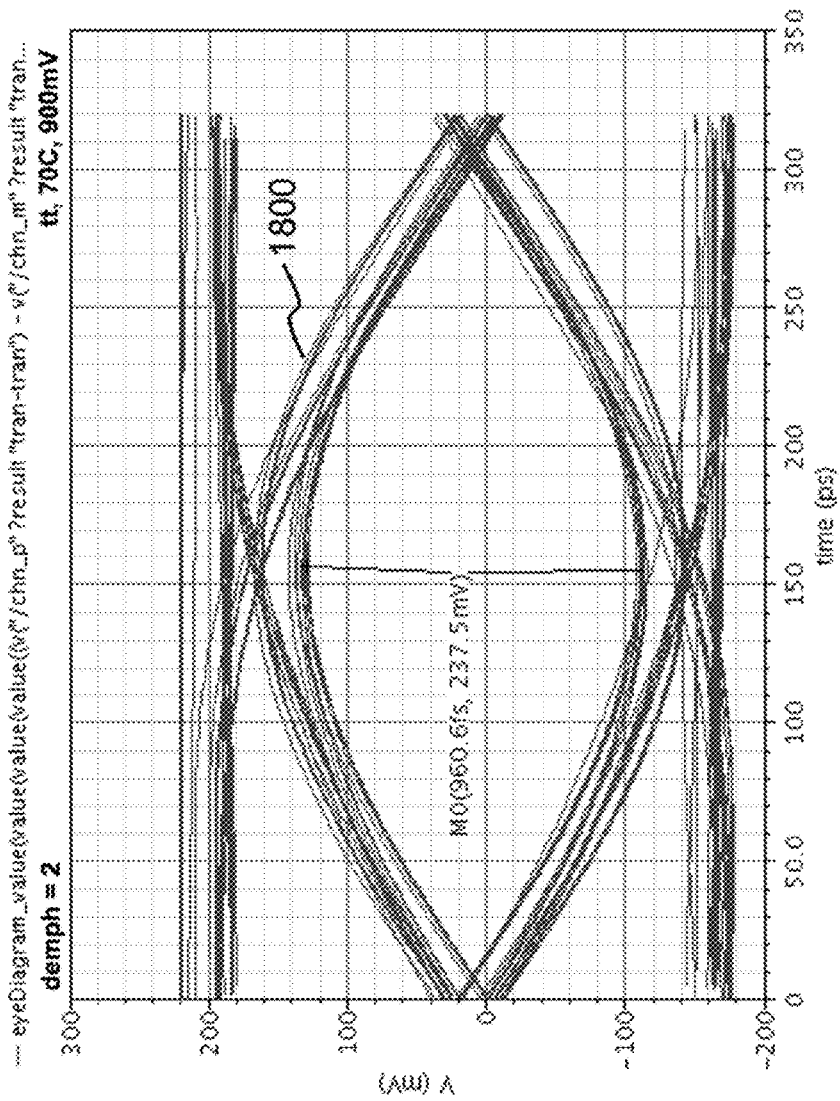
FIG. 18A is the schematic diagram illustrating an eye diagram obtained by simulation of the simulation test bench implementation of FIG. 17, for the drive signal transmitted without boost and with virtually no boosting unit ESD protection resistance across an interconnection interface, taken at a far end measurement point subject to a first predetermined level of de-emphasis.

FIG. 18 illustrates as baseline references eye diagrams 1800, 1810 for the drive signal resulting at the far end (receiver end) measurement point MP2 when simulation is carried out on the test bench arrangement of FIG. 17, with the boost function turned off (boostsel='b00), and with virtually no ESD protection resistance incorporated in the boosting unit. These cases factor in the effects of digital de-emphasis, which is often applied in various applications to help equalize frequency response and reduce ISI effects. For a de-emphasis set at a certain level 2, the resulting eye pattern 1800 exhibits a peak-to-peak amplitude of 237.5 mV. With the de-emphasis stepped up to a certain level 3, the resulting eye pattern 1810 exhibits a higher peak-to-peak amplitude of 244.3 mV. While they exceed the 200 mV XAUI requirement for a differential drive signal at the far end measurement point MP2, the peak-to-peak values may not afford sufficient margin to ensure continued compliance with this XAUI requirement during actual operation over process, voltage, and temperature (PVT) corners.

Figure 19A:
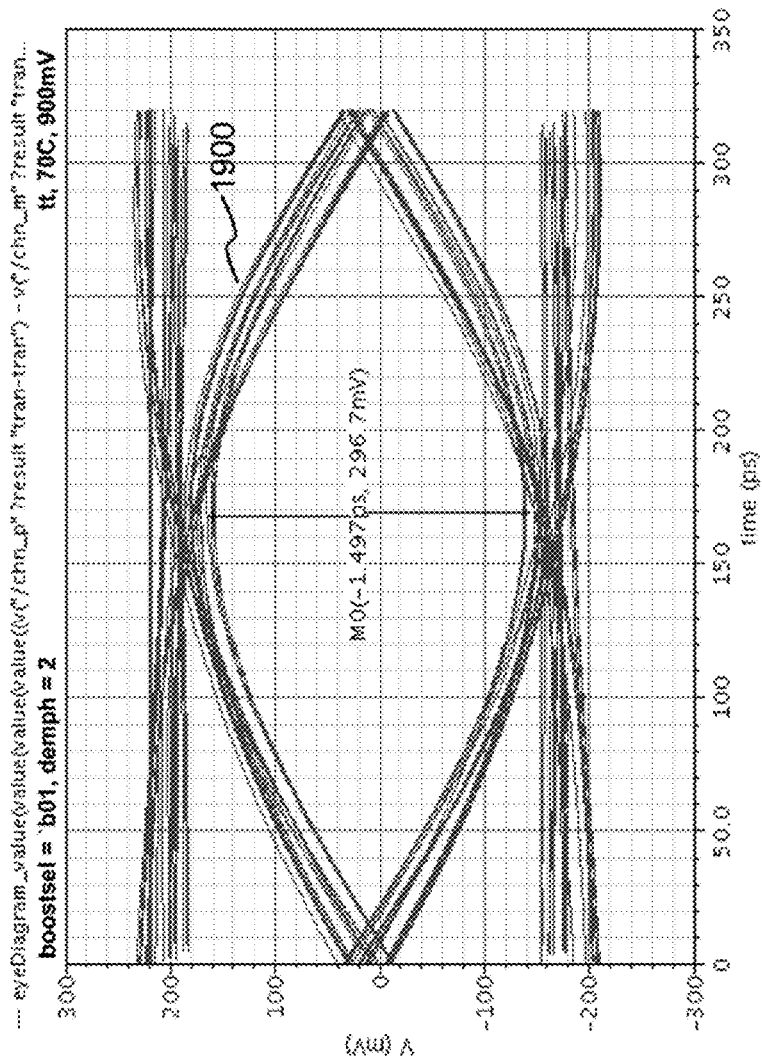
FIG. 19A is the schematic diagram illustrating an eye diagram obtained by simulation of the simulation test bench implementation of FIG. 17, for the drive signal transmitted with a first level of boost but virtually no boosting unit ESD protection resistance across an interconnection interface, taken at a far end measurement point subject to a first predetermined level of de-emphasis.
Figure 19B:
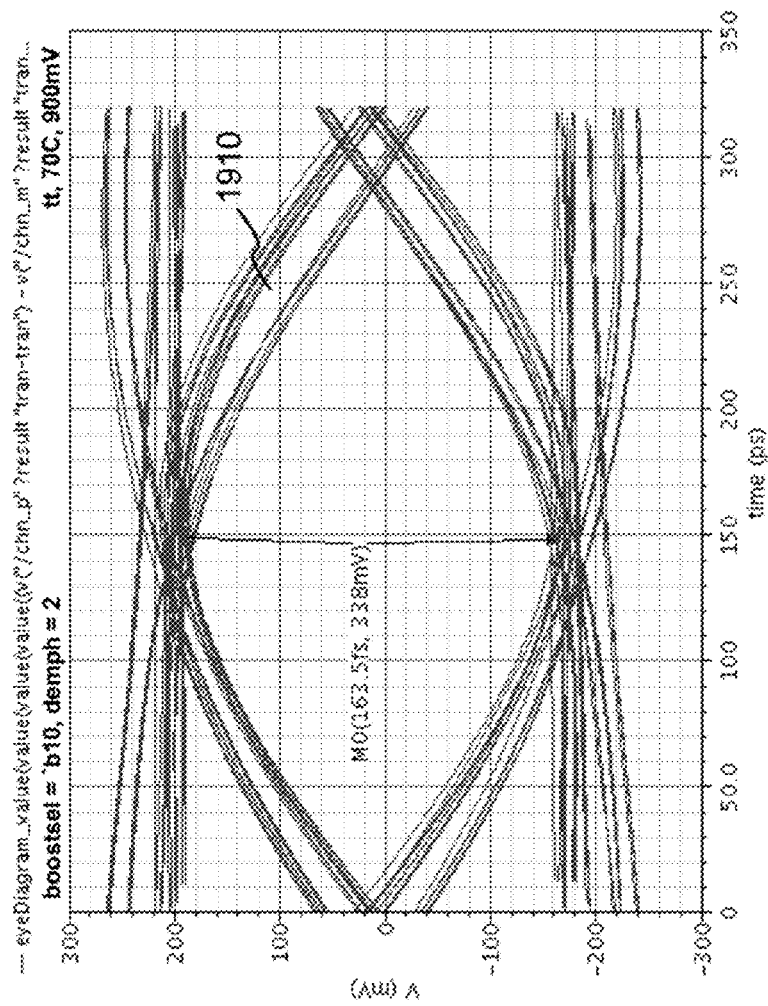
FIG. 19B is the schematic diagram illustrating an eye diagram obtained by simulation of the simulation test bench implementation of FIG. 17, for the drive signal transmitted with a second level of boost but virtually no boosting unit ESD protection resistance across an interconnection interface, taken at a far end measurement point subject to a first predetermined level of de-emphasis.
Figure 19C:
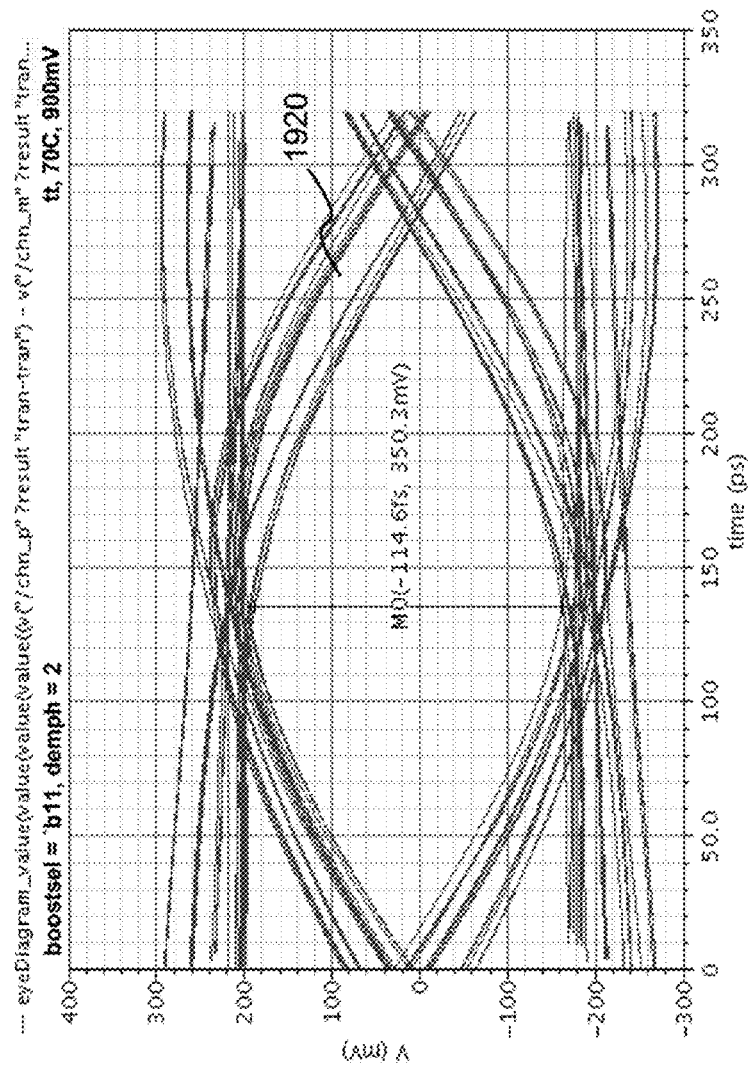
FIG. 19C is the schematic diagram illustrating an eye diagram obtained by simulation of the simulation test bench implementation of FIG. 17, for the drive signal transmitted with a third level of boost but virtually no boosting unit ESD protection resistance across an interconnection interface, taken at a far end measurement point subject to a first predetermined level of de-emphasis.

Further simulation runs may be carried out to obtain the optimum combination of boost level and ESD protection, as well as digital de-emphasis level, for the given operating conditions. FIG. 19 illustrates the eye diagrams of the drive signal resulting from the same simulation at the far end point MP2, still with virtually no ESD protection resistance added in the boosting unit, but with the boosting function selectively set at the different boost settings (boostsel='b01, boostsel='b10, and boostsel='b11) for a second level of digital de-emphasis. With the first level boost selected, the drive signal eye pattern 1900 exhibits a greater peak-to-peak voltage of 296.7 mV. Raising the boost one level raises the peak-to-peak in the resulting drive signal eye pattern 1910 to a voltage of 338 mV. Further raising the boost by another level produces the drive signal eye pattern 1920 which exhibits an even greater peak-to-peak voltage of 350.3 mV.

Figure 20A:
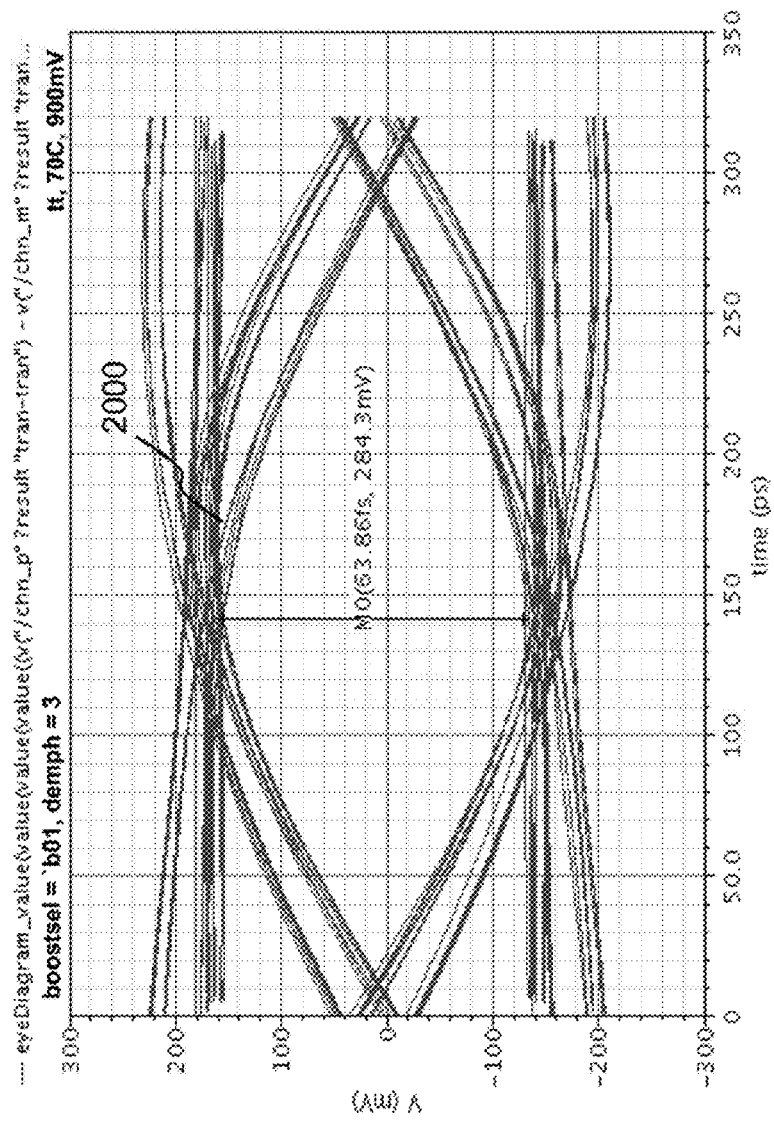
FIG. 20A is the schematic diagram illustrating an eye diagram obtained by simulation of the simulation test bench implementation of FIG. 17, for the drive signal transmitted with a first level of boost but virtually no boosting unit ESD protection resistance across an interconnection interface, taken at a far end measurement point subject to a second predetermined level of de-emphasis.
Figure 20B:
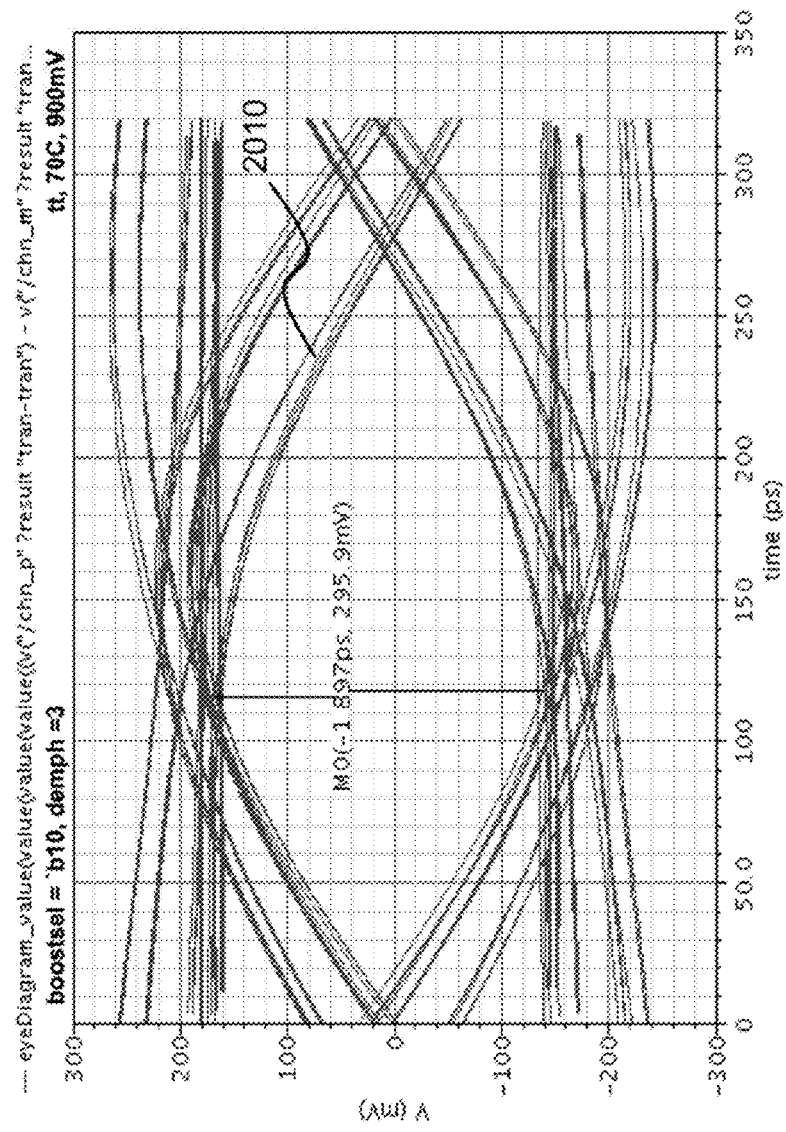
FIG. 20B is the schematic diagram illustrating an eye diagram obtained by simulation of the simulation test bench implementation of FIG. 17, for the drive signal transmitted with a second level of boost but virtually no boosting unit ESD protection resistance across an interconnection interface, taken at a far end measurement point subject to a second predetermined level of de-emphasis.
Figure 20C:
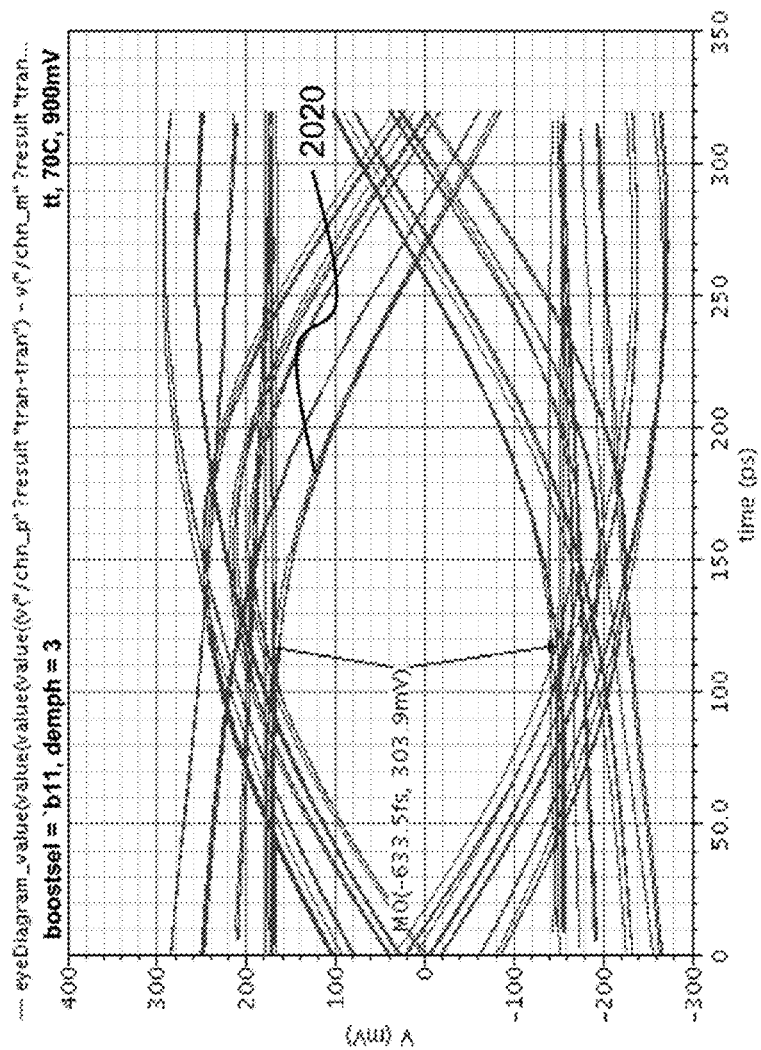
FIG. 20C is the schematic diagram illustrating an eye diagram obtained by simulation of the simulation test bench implementation of FIG. 17, for the drive signal transmitted with a third level of boost but virtually no boosting unit ESD protection resistance across an interconnection interface, taken at a far end measurement point subject to a second predetermined level of de-emphasis.

FIG. 20 illustrates further eye diagrams of the drive signal resulting from the same simulation at the far end point MP2, still with virtually no boosting unit ESD protection resistance, but with the boosting function selectively set at the different boost settings for a third level of digital de-emphasis. With the first level boost selected, the drive signal eye pattern 2000 exhibits a peak-to-peak voltage of 284.3 mV. Raising the boost one level raises the peak-to-peak amplitude in the resulting drive signal eye pattern 2010 to a voltage of 295.9 mV. Further raising the boost by another level produces the drive signal eye pattern 2020 which exhibits a peak-to-peak voltage of 303.9 mV.

Figure 21A:
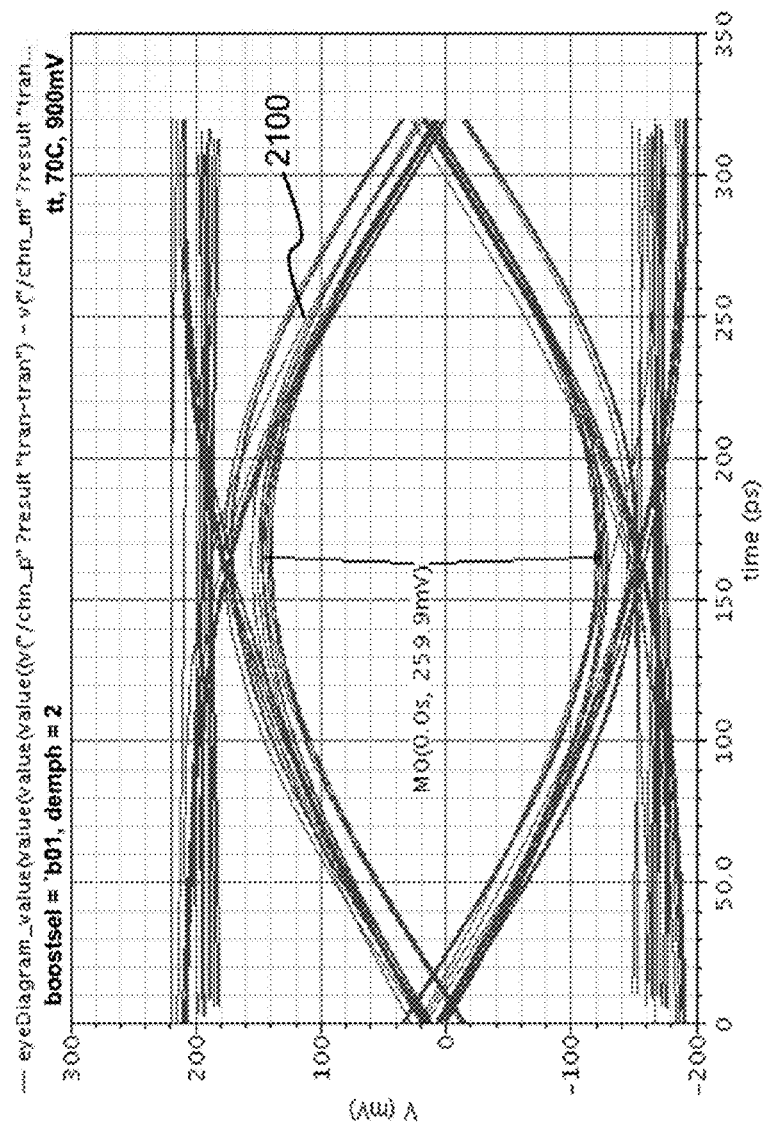
FIG. 21A is the schematic diagram illustrating an eye diagram obtained by simulation of the simulation test bench implementation of FIG. 17, for the drive signal transmitted with a first level of boost and a second predetermined boosting unit ESD protection resistance across an interconnection interface, taken at a far end measurement point subject to a first predetermined level of de-emphasis.
Figure 21B:
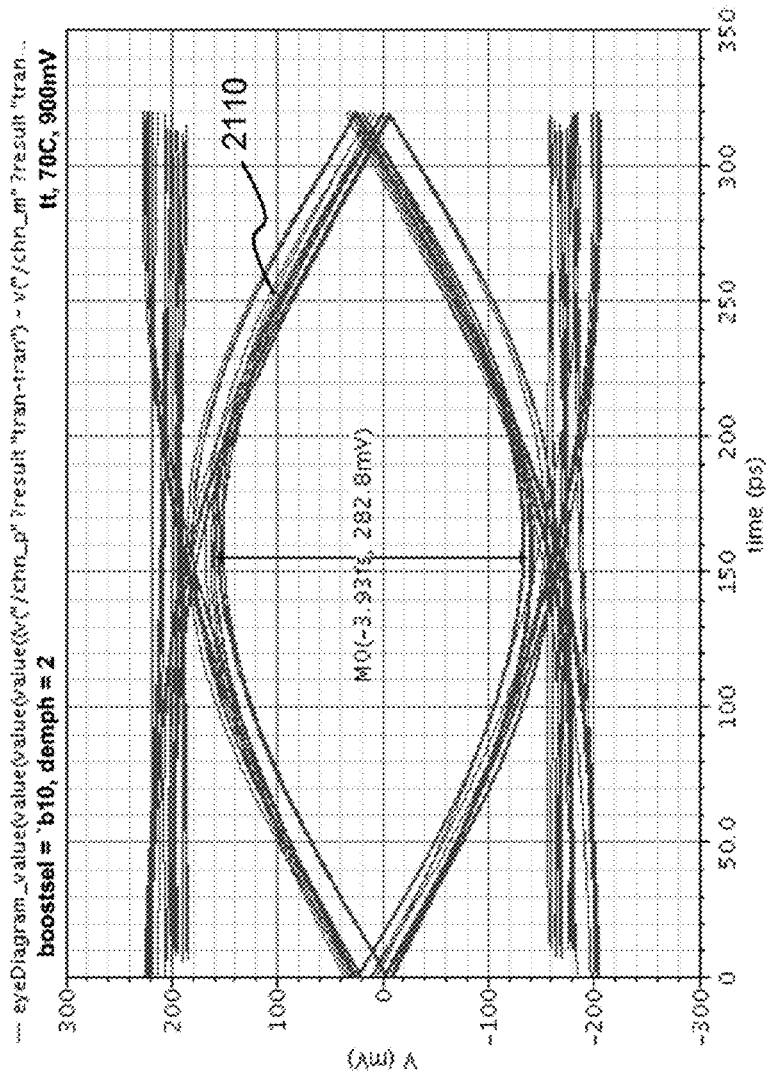
FIG. 21B is the schematic diagram illustrating an eye diagram obtained by simulation of the simulation test bench implementation of FIG. 17, for the drive signal transmitted with a second level of boost and a second predetermined boosting unit ESD protection resistance across an interconnection interface, taken at a far end measurement point subject to a first predetermined level of de-emphasis.
Figure 21C:
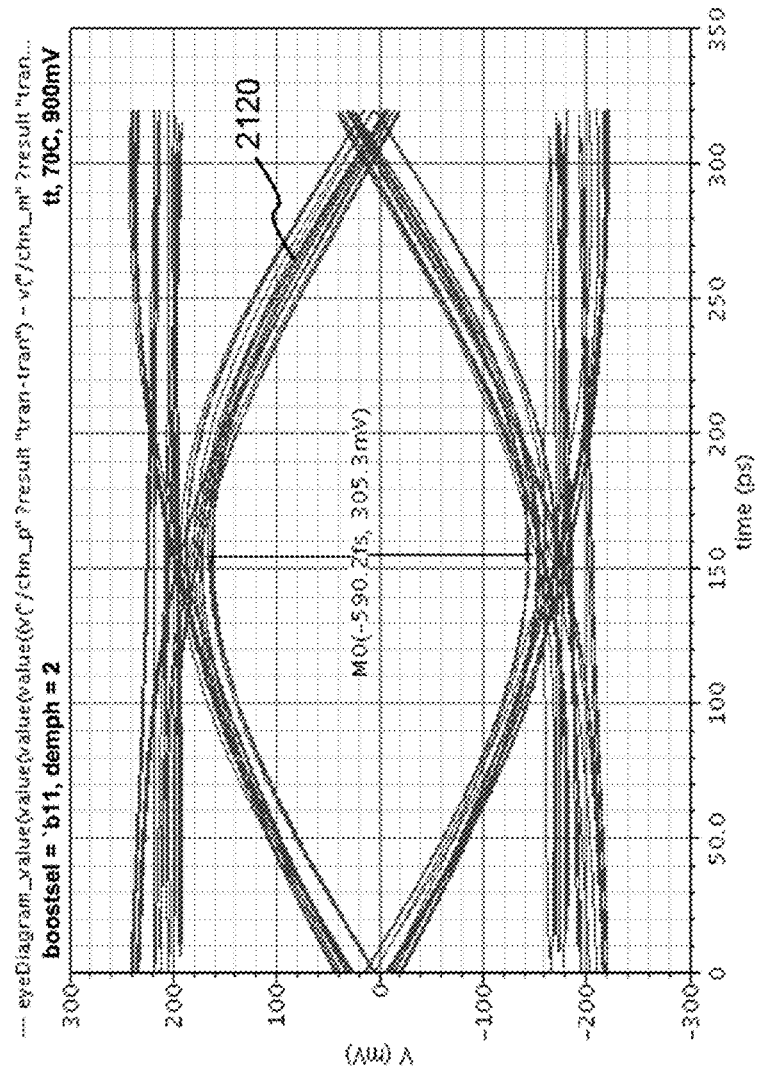
FIG. 21C is the schematic diagram illustrating an eye diagram obtained by simulation of the simulation test bench implementation of FIG. 17, for the drive signal transmitted with a third level of boost and a second predetermined boosting unit ESD protection resistance across an interconnection interface, taken at a far end measurement point subject to a first predetermined level of de-emphasis.

FIG. 21 illustrates additional eye diagrams of the drive signal resulting from the same simulation at the far end point MP2, with the boosting function again selectively set at the different boost level/states 'b01, 'b10, 'b11 and digital de-emphasis set at its second level, but with 200Ω ESD protection resistance incorporated in the boosting units. With the first level boost selected, the drive signal eye pattern 2100 exhibits a peak-to-peak voltage of 259.9 mV. Raising the boost one level in this case improves the peak-to-peak amplitude seen in the resulting drive signal eye pattern 2110 to a voltage of 282.8 mV. Further raising the boost by another level produces the drive signal eye pattern 2120 which exhibits a higher peak-to-peak voltage of 305.3 mV.

Figure 22A:
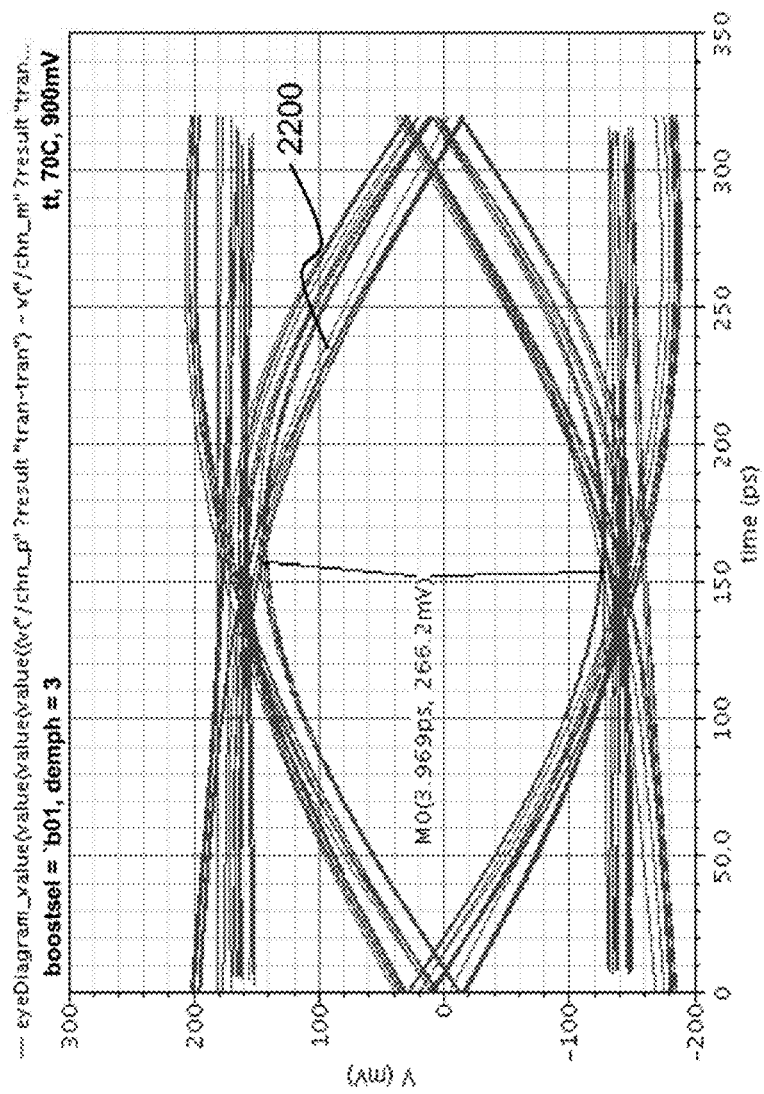
FIG. 22A is the schematic diagram illustrating an eye diagram obtained by simulation of the simulation test bench implementation of FIG. 17, for the drive signal transmitted with a first level of boost and a second predetermined boosting unit ESD protection resistance across an interconnection interface, taken at a far end measurement point subject to a second predetermined level of de-emphasis.
Figure 22B:
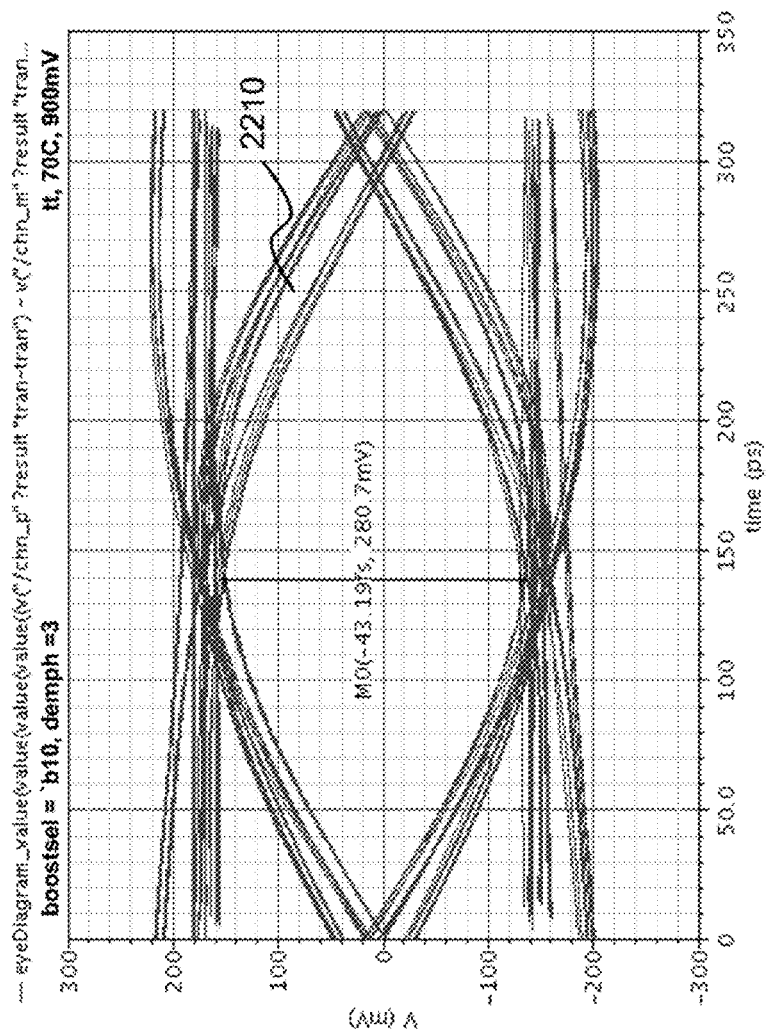
FIG. 22B is the schematic diagram illustrating an eye diagram obtained by simulation of the simulation test bench implementation of FIG. 17, for the drive signal transmitted with a second level of boost and a second predetermined boosting unit ESD protection resistance across an interconnection interface, taken at a far end measurement point subject to a second predetermined level of de-emphasis.
Figure 22C:
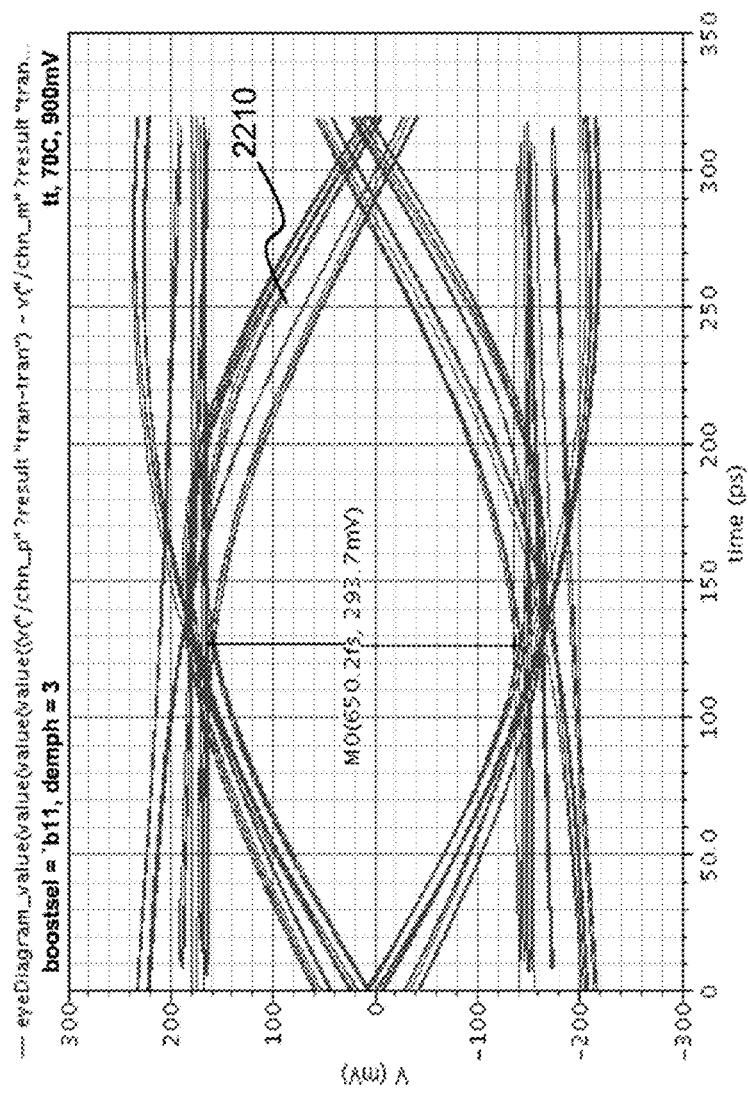
FIG. 22C is the schematic diagram illustrating an eye diagram obtained by simulation of the simulation test bench implementation of FIG. 17, for the drive signal transmitted with a third level of boost and a second predetermined boosting unit ESD protection resistance across an interconnection interface, taken at a far end measurement point subject to a second predetermined level of de-emphasis.

FIG. 22 illustrates still further eye diagrams of the drive signal resulting from the same simulation at the far end point MP2, with the boosting function selectively set at the different boost level/states 'b01, 'b10, 'b11 and with 200Ω ESD protection resistance incorporated in the boosting units, but with the digital de-emphasis set at its third level. With the first level boost selected, the drive signal eye pattern 2200 exhibits a peak-to-peak voltage of 266.2 mV. Raising the boost one level in this case improves the peak-to-peak amplitude seen in the resulting drive signal eye pattern 2210 to a voltage of 280.7 mV. Further raising the boost by another level produces the drive signal eye pattern 2220 which exhibits a higher peak-to-peak voltage of 293.7 mV.

FIG. 23 illustrates a table of parametric combinations which may be obtained in this manner, for example, to aid in the optimal selection of boosting unit ESD resistance, de-emphasis level, and boost level. A designer may consult such table indicating the far end eye openings obtained by alternative combinations to conveniently weigh the necessary design tradeoffs and select the most suitable settings.

Figure 24A:
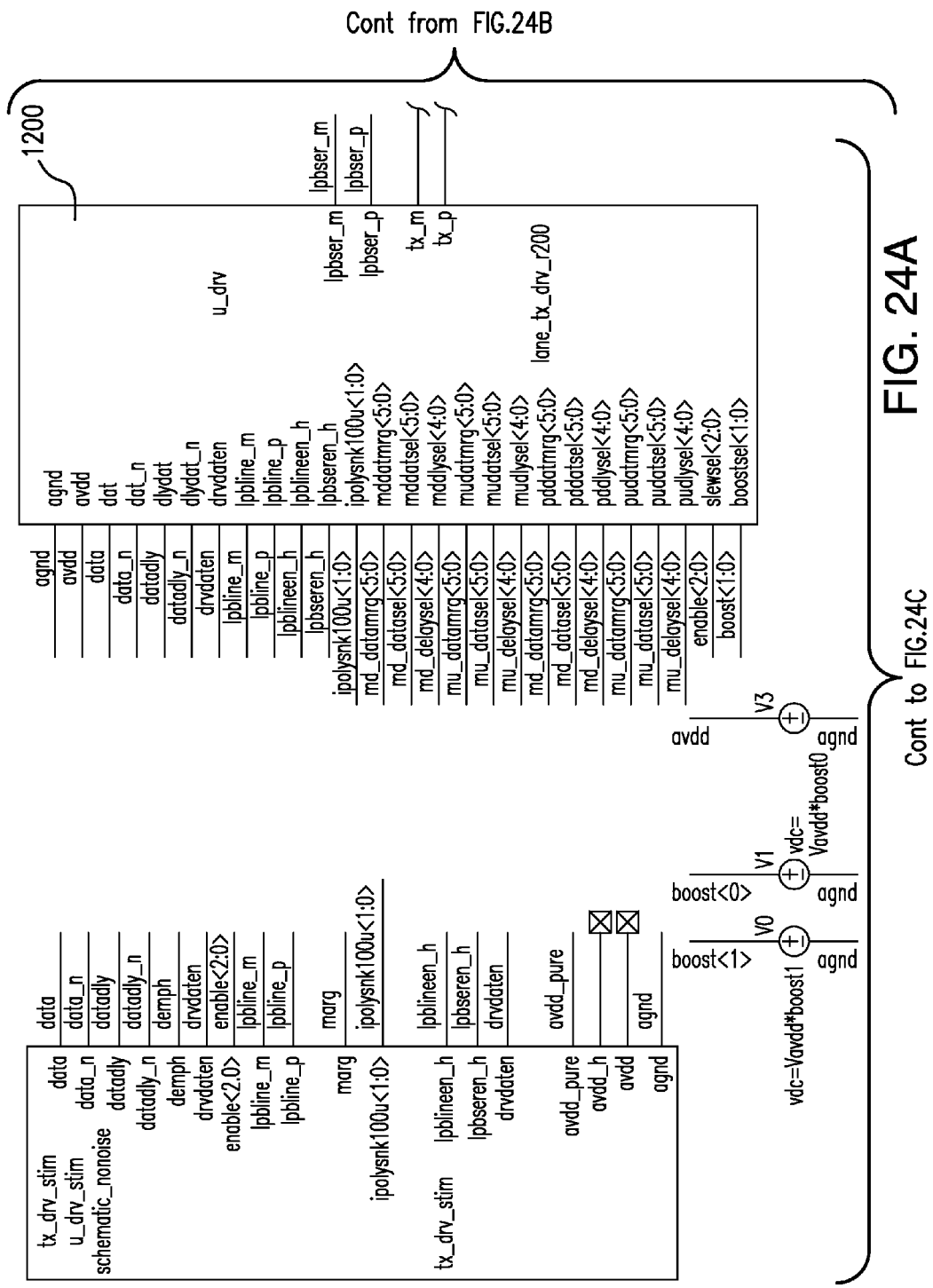
FIG. 24, collectively represented by views 24A, 24B, and 24C, is a schematic diagram illustrating an exemplary implementation of a test bench incorporating a boost drive system formed in accordance with the embodiment shown in FIGS. 6A-10, with models for measuring differential drive signal return loss; and, FIG. 25 is a diagram illustrating curves representing the differential signal return loss obtained by simulation of the test bench implementation of FIG. 24, for the drive signal transmitted with different levels of boost and boosting unit ESD protection resistance across an interconnection interface.
Figure 24B:
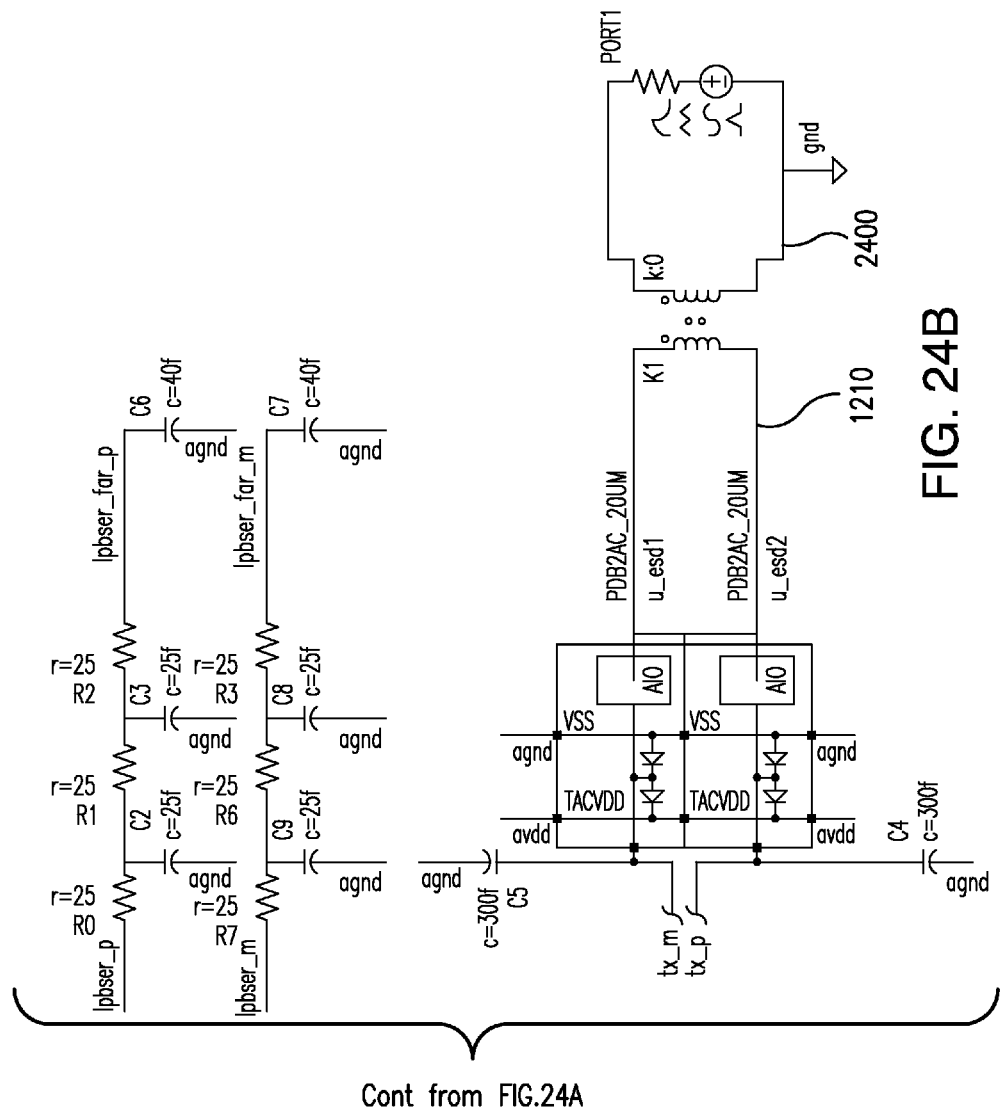
Figure 24C:
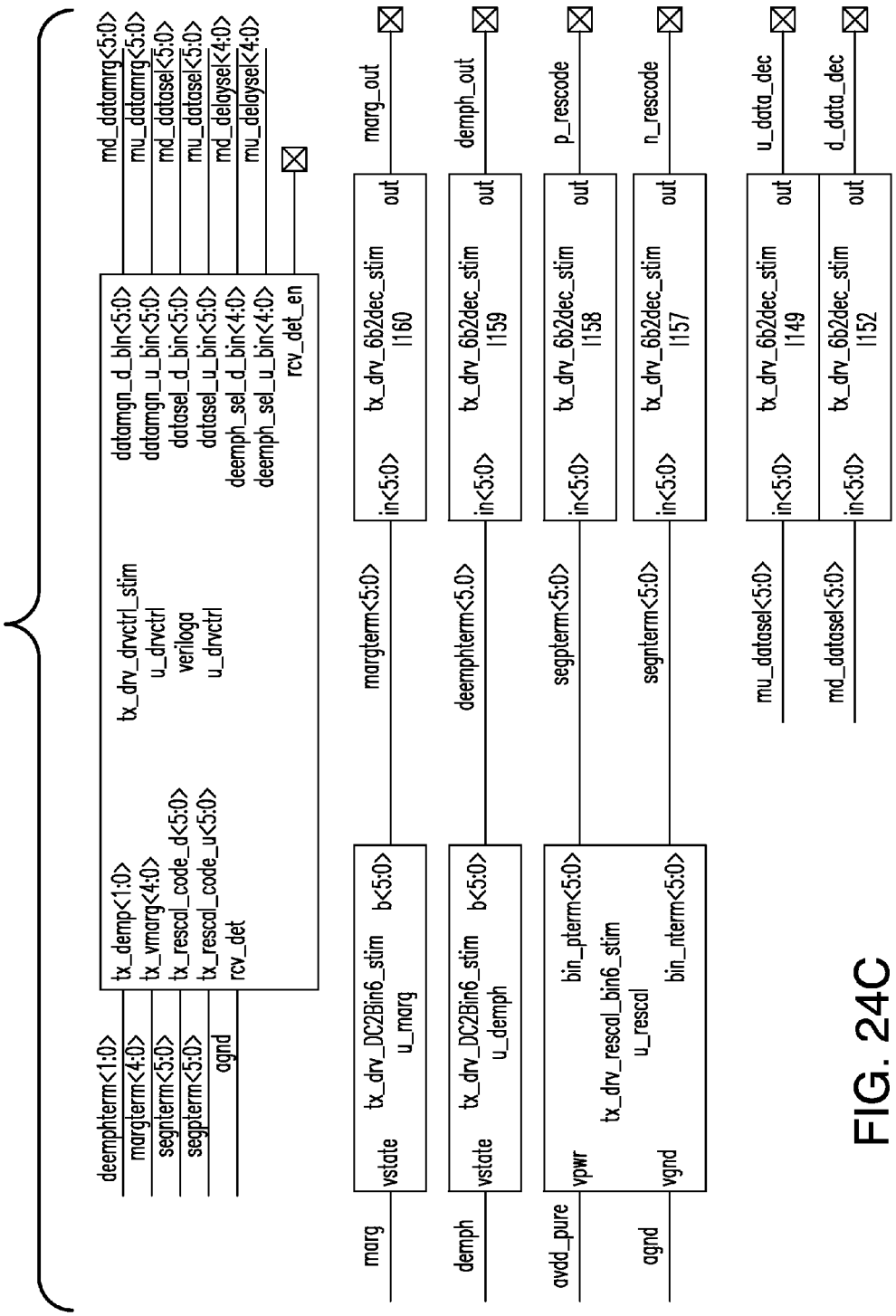

FIG. 24 (collectively represented by views 24A, 24B, and 24C) schematically illustrates another simulation test bench configuration much like that of FIG. 12, but for testing the effects upon driver differential return loss of the boosting carried out as disclosed herein. That is, the test bench configuration serves to evaluate the extent to which the drive signal boosting serves to degrade output impedance. As in the first test bench configuration, the system circuit 1200 incorporating the embodiment reflected in FIGS. 6-10 is coupled to the ESD protection diodes 1210, which in turn is coupled to a model 2400 for the given differential termination.

Figure 25:
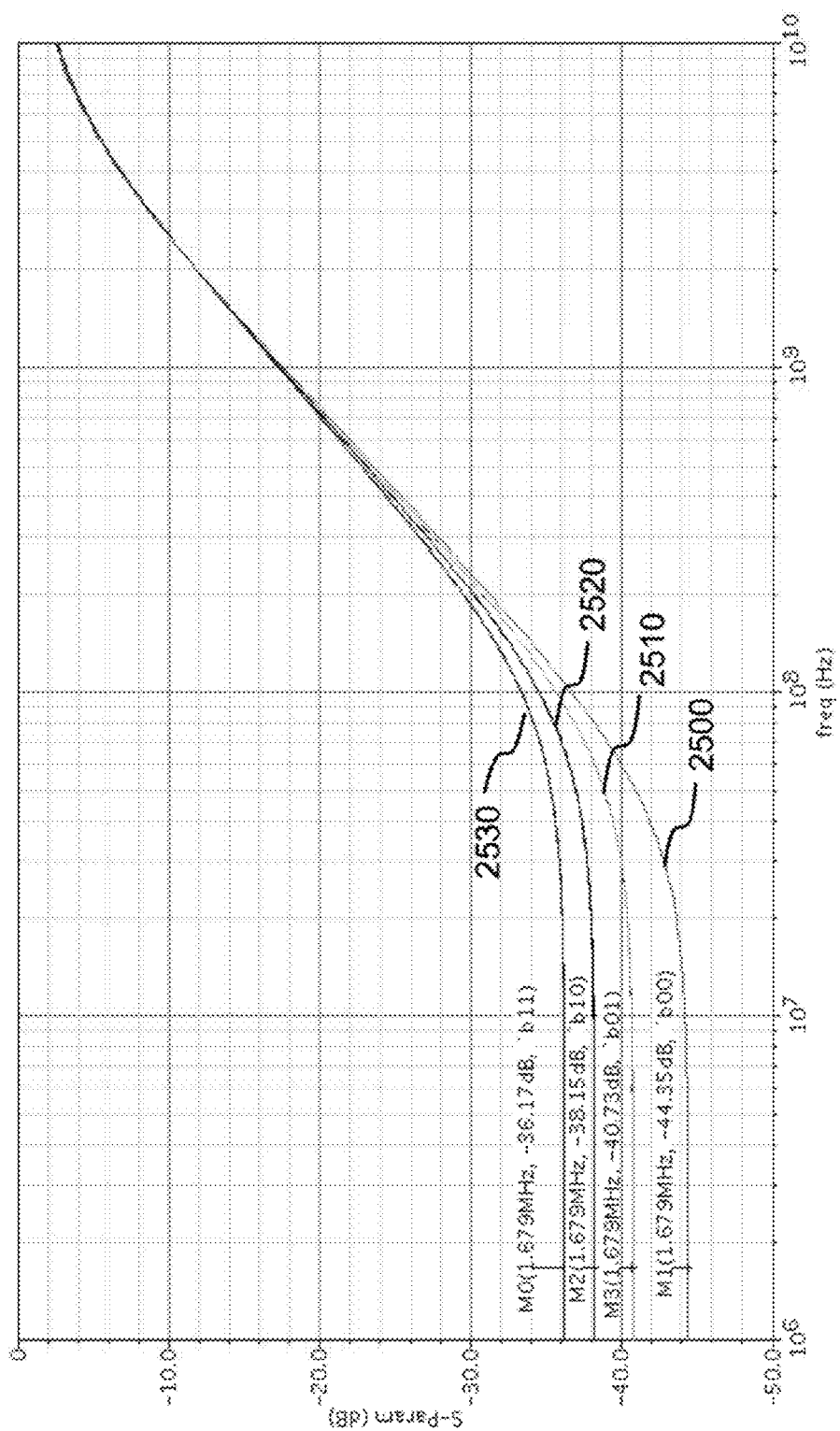

The results of simulation runs using the simulation test bench setup of FIG. 24 are illustratively shown in FIG. 25. The driver differential return loss is expressed in terms of S-parameter value measured in decibels (dB) over a range of signal frequencies shown on a logarithmic scale. The figure illustrates the return loss of the drive signal resulting from the same simulation run, first with the boost function disabled (curve 2500), then with the boost function progressively set at the different boost settings (boostsel='b01, boostsel='b10, and boostsel='b11). The return loss curves obtained for these different boost settings are represented by the curves 2510, 2520, 2530. Running the same simulation for each of the disabled and enabled settings of the boosting function, first with virtually no boosting unit ESD resistance protection added, then with boosting unit ESD protection resistances of 200 and 800 successively added, has no observable effect on the curves 2500-2530.

As each of the curves 2500-2530 indicates, the boosting exhibits no noticeable effect on return loss at higher signal frequencies. At the lower signal frequencies, however, the baseline curve 2500 exhibits a return loss measure of −44.35 dB at a selected low signal frequency, under the test's operating conditions. With the boost function activated at its first level 'b01, the return loss is observed at the selected signal frequency to slightly shifted to a measure of −40.73 dB, as indicated by curve 2510. At the next two boost settings 'b10, 'b11, the return loss measures progressively shift to −38.15 dB and −36.17 dB at the same signal frequency (as indicated by curves 2520 and 2530).

Considering that a measure of −44.35 dB relates to an amplitude ratio of 0.006 while measures of 40.73 dB, −38.15 dB, and −36.17 dB relate to amplitude ratios of 0.009, 0.012, and 0.016, a shift of approximately 1% is observed. Such would be of negligible impact in most applications. Hence, the drive signal boosting imparted as disclosed herein would have negligible effect on the return loss otherwise encountered without the boosting.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A system for boosting a selective portion of a drive signal for chip-to-chip transmission across an interconnection interface comprising:
   a driver unit generating a drive signal responsive to an input data signal, the drive signal being provided to at least one output node for transmission through the interconnection interface, the drive signal defining a peak amplitude during a drive period; and,
   a plurality of boosting units coupled to said driver unit for selectively boosting a portion of the drive signal, said boosting units being selectively enabled to cooperatively boost said selected portion of the drive signal, each said boosting unit actuating responsive to the input data signal to selectively apply a boost signal in a self-timed manner to the drive signal, each said boosting unit thereby augmenting the drive signal in amplitude over a selected portion of said drive period thereof;
   wherein said boosting units maintain said peak amplitude of the drive signal at or above a predetermined level throughout said drive period.

2. The system as recited in claim 1, wherein the drive signal and boost signal each define time variable voltages.

3. The system as recited in claim 2, wherein said boosting unit is commonly disposed on chip with said driver unit.

4. The system as recited in claim 1, wherein each said boosting unit includes:
   a complementary pair of switches coupled respectively to high and low supply rail references; and,
   a control circuit coupled to actuate responsive to the input data signal one of said complementary switches exclusive of the other during said selected portion of the drive period, said complementary switches alternatively establishing conductive paths between respective ones of said high and low power rails to said output node for alternatively imparting either positive stage or negative stage boosting to the drive signal.

5. The system as recited in claim 4, wherein said complementary switches include respective field effect transistors of complementary channel type.

6. The system as recited in claim 5, wherein said control circuit includes first and second filter sections each configured with a characteristic time constant and coupled to one of said complementary switches, each of said first and second filter sections passing a preselected range of spectral components of the input data signal therethrough for controlling a conduction channel of one of said complementary switches.

7. The system as recited in claim 6, wherein each said filter section is coupled to a gate terminal of one said complementary switch and defines a high pass filter including resistive (R) and capacitive (C) elements defining a preselected RC time constant, said boosting unit being self-timed according to said preselected RC time constant.

8. The system as recited in claim 7, wherein each of said complementary switches is disposed during a non-conductive off state with a steady state voltage level applied at said gate terminal thereof, said steady state voltage level being maintained in magnitude below a characteristic gate-source threshold voltage of said complementary switch by a predetermined difference.

9. The system as recited in claim 4, wherein each said boosting unit includes a buffering gate coupled to said control circuit for receiving the input data signal, said buffering gate of each said boosting unit being selectively energized responsive to at least one of a plurality of enabling signals corresponding thereto.

10. The system as recited in claim 4, further comprising a boosting unit resistance element having a predetermined resistance connected between said boosting unit and said output node for electrostatic discharge protection.

11. The system as recited in claim 4, wherein the drive signal is a differential signal having a pair of complementary components provided on a complementary pair of said output nodes for differential transmission through the interconnection interface, said peak amplitude being defined peak-to-peak between said complementary components; and, wherein said boosting unit selectively applies a first boost signal in a self-timed manner to a first complementary component of the drive signal and a second boost signal in a self-timed manner to a second complementary component of the drive signal, said boosting unit thereby augmenting said first and second complementary components in amplitude over a selected portion of said drive period.

12. The system as recited in claim 11, wherein said predetermined level reference for said peak amplitude maintained throughout said drive period is defined according to the 10-Gigabit Attachment Unit Interface (XAUI) standard.

13. A system for boosting a selective portion of a drive signal for transmission to a receiving circuit across an attachment interface comprising:
   a driver unit generating a differential drive signal responsive to an input data signal, the drive signal having a pair of complementary components provided to a pair of complementary output nodes for differential transmission through the attachment interface, said complementary components collectively defining a peak-to-peak amplitude voltage during a drive period; and,
   a plurality of boosting units coupled to said pair of complementary output nodes for selectively boosting a portion of the drive signal in voltage, said boosting units being selectively enabled to cooperatively boost said selected portion of the drive signal, each said boosting unit actuating responsive to the input data signal to selectively apply a first boost signal in a self-timed manner to a first of said complementary components of the drive signal, each said boosting unit thereby augmenting said first complementary component in amplitude over a selected portion of said drive period;
   wherein said boosting units maintains said peak-to-peak amplitude voltage between said complementary components at or above a predetermined level throughout said drive period.

14. The system as recited in 13, wherein each said boosting unit actuates responsive to the input data signal to selectively apply a second boost signal in a self-timed manner to a second of said complementary components of the drive signal, said boosting unit thereby augmenting said second complementary component in amplitude over a selected portion of said drive period.

15. The system as recited in claim 14, wherein each said boosting unit includes first and second boosting sub-units for respectively boosting said first and second complementary components of said drive signal, each of said first and second boosting sub-units including:
   a complementary pair of switches coupled respectively to high and low power rails; and,
   a control circuit coupled to actuate responsive to the input data signal one of said complementary switches exclusive of the other during said selected portion of the drive period, said complementary switches alternatively establishing conductive paths between respective ones of said high and low power rails to a corresponding one of said output nodes during said selected portion of the drive period for alternatively imparting either positive stage or negative stage boosting to the drive signal.

16. The system as recited in claim 15, wherein said complementary switches include respective field effect transistors of complementary channel type.

17. The system as recited in claim 16, wherein each of said complementary switches is disposed during a non-conductive off state with a steady state voltage level applied at said gate terminal thereof, said steady state voltage level being maintained in magnitude below a characteristic gate-source threshold voltage of said complementary switch by a predetermined difference.

18. The system as recited in claim 17, wherein said control circuit includes first and second a high pass filter sections each coupled to one of said complementary switches, each of said first and second high pass filter sections passing a preselected range of spectral components of the input data signal therethrough for controlling a conduction channel of one said complementary switch, each of said first and second high pass filter sections including resistive (R) and capacitive (C) elements defining a preselected RC time constant, said boosting unit being self-timed according to said preselected RC time constant.

19. The system as recited in claim 18, wherein each of said first and second boosting sub-units includes a buffering gate coupled to said control circuit for receiving a component of the input data signal, said buffering gate being selectively energized responsive to at least one of a plurality of enabling signals corresponding thereto.

20. The system as recited in claim 19, further comprising a boosting unit resistance element having a predetermined resistance connected between each of said first and second boosting sub-units and a corresponding one of said output nodes for electrostatic discharge protection.

21. The system as recited in claim 20, wherein said predetermined level reference for said peak-to-peak amplitude voltage maintained throughout said drive period is defined according to the 10-Gigabit Attachment Unit Interface (XAUI) standard.

22. A method for boosting a selective portion of a drive signal for chip-to-chip transmission across an interconnection interface comprising:
   generating a drive signal responsive to an input data signal, the drive signal defining a peak amplitude during a drive period;
   applying the drive signal to at least one output node for transmission through the interconnection interface;
   establishing a plurality of boosting units coupled to said output node;
   selectively enabling said boosting units to cooperatively generate respective boost signals responsive to the input data signal to selectively boost a portion of the drive signal, each of the boost signals being applied in a self-timed manner to the drive signal, to thereby augment the drive signal in amplitude over a selected portion of said drive period thereof; and,
   actuating said boosting units to maintain said peak amplitude of the drive signal at or above a predetermined level throughout said drive period.

23. The method as recited in claim 22, further comprising for each said boosting unit:
   establishing a complementary pair of switches coupled respectively to high and low supply rails; and,
   controlling actuation responsive to the input data signal one of said complementary switches exclusive of the other during said selected portion of the drive period to alternatively establish a conductive path between one of said high or low power rails and said output node during said selected portion of the drive period for imparting either positive stage or negative stage boosting to the drive signal.

24. The method as recited in claim 23, wherein:
   respective field effect transistors of complementary channel type are actuated in said complementary switches;
   forming a control circuit to include first and second filter sections to each pass a preselected range of spectral components of the input data signal therethrough for controlling a conduction channel of one said complementary switch; and,
   configuring each of said first and second filter sections with a characteristic time constant for setting a boost time period.

25. The method as recited in claim 24, wherein each said filter section is coupled to a gate terminal of one said complementary switch and configured for high pass filtering, each said filter section including resistive (R) and capacitive (C) elements to define a preselected RC time constant less in value than said drive period of the drive signal, said boosting unit being self-timed according to said preselected RC time constant.

26. The method as recited in claim 25, wherein a steady state voltage level is applied at said gate terminal of each said complementary switch during a non-conductive off state thereof, said steady state voltage level being maintained in magnitude below a characteristic gate-source threshold voltage of said complementary switch by a predetermined difference.

27. The method as recited in claim 23, wherein said boosting units are selectively energized responsive to at least one of a plurality of individually controlled enabling signals corresponding thereto.

28. The method as recited in claim 23, wherein the drive signal is a differential signal having a pair of complementary components provided on a complementary pair of said output nodes for differential transmission through the interconnection interface, said peak amplitude being defined peak-to-peak between said complementary components; and, wherein said boosting unit is actuated to selectively apply a first boost signal in a self-timed manner to a first complementary component of the drive signal and a second boost signal in a self-timed manner to a second complementary component of the drive signal, said boosting unit thereby augmenting said first and second complementary components in amplitude over a selected portion of said drive period.

29. The method as recited in claim 23, wherein said predetermined level reference for said peak amplitude maintained throughout said drive period is defined according to the 10-Gigabit Attachment Unit Interface (XAUI) standard.

* * * * *

UNITED STATES PATENT AND TRADEMARK OFFICE
CERTIFICATE OF CORRECTION

| | | |
|---|---|---|
| PATENT NO. | : 9,148,130 B1 | |
| APPLICATION NO. | : 13/468415 | |
| DATED | : September 29, 2015 | |
| INVENTOR(S) | : Eric Naviasky et al. | |

It is certified that error appears in the above-identified patent and that said Letters Patent is hereby corrected as shown below:

On the title page, Item (54), and in the specification, column 1, delete the incorrect title "SYSTEM AND METHOD FOR BOOSTING A SELECTIVE PORTION OF A DRIVE SIGNAL FOR CHIP-TO-CHIP TRANSMISSION" and replace with --SYSTEM AND METHOD FOR BOOSTING SELECTIVE PORTION OF DRIVE SIGNAL FOR CHIP-TO-CHIP TRANSMISSION ACROSS INTERCONNECTION INTERFACE--

IN THE CLAIMS

In claim 13, on column 22, line 60, delete "said boosting units maintains" and replace with --said boosting units maintain--

In claim 18, on column 23, line 32, delete "first and second a high pass filter sections" and replace with --first and second high pass filter sections--

Signed and Sealed this
Eighth Day of March, 2016

Michelle K. Lee
*Director of the United States Patent and Trademark Office*